(12) United States Patent
Uchida

(10) Patent No.: US 12,514,121 B2
(45) Date of Patent: Dec. 30, 2025

(54) THERMOELECTRIC CONVERSION MODULE AND METHOD OF PRODUCING THERMOELECTRIC CONVERSION MODULE

(71) Applicant: ZEON CORPORATION, Tokyo (JP)

(72) Inventor: Hideki Uchida, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 110 days.

(21) Appl. No.: 18/247,072

(22) PCT Filed: Sep. 15, 2021

(86) PCT No.: PCT/JP2021/034006
§ 371 (c)(1),
(2) Date: Mar. 29, 2023

(87) PCT Pub. No.: WO2022/070929
PCT Pub. Date: Apr. 7, 2022

(65) Prior Publication Data
US 2023/0371379 A1    Nov. 16, 2023

(30) Foreign Application Priority Data
Sep. 30, 2020  (JP) .................... 2020-166552

(51) Int. Cl.
*H10N 10/17*  (2023.01)
(52) U.S. Cl.
CPC .................... *H10N 10/17* (2023.02)
(58) Field of Classification Search
None
See application file for complete search history.

(56) References Cited

U.S. PATENT DOCUMENTS

| | | | | |
|---|---|---|---|---|
| 3,554,815 A | * | 1/1971 | Osborn | H10N 10/817 136/203 |
| 2001/0000577 A1 | * | 5/2001 | Parise | G01J 5/28 136/201 |

(Continued)

FOREIGN PATENT DOCUMENTS

| JP | H03-66182 A | * | 3/1991 |
|---|---|---|---|
| JP | 2015144212 A | | 8/2015 |

(Continued)

OTHER PUBLICATIONS

"Thermal conductivity and resistivity" [retrieved from https://en.wikipedia.org/wiki/Thermal_conductivity_and_resistivity on Sep. 12, 2024] (Year: 2024).*

(Continued)

*Primary Examiner* — Ryan S Cannon
(74) *Attorney, Agent, or Firm* — KENJA IP LAW PC

(57) ABSTRACT

A thermoelectric conversion module includes an electrically insulating sheet substrate having a front surface and a rear surface, a plurality of thermoelectric conversion elements, and a wiring layer. The plurality of thermoelectric conversion elements have an elongated shape extending in a first direction and are arranged such as to be lined up along a second direction intersecting the first direction at the front surface of the sheet substrate. The wiring layer includes a plurality of wires that electrically connect adjacent thermoelectric conversion elements in series at both lengthwise ends. The plurality of thermoelectric conversion elements are all p-type thermoelectric conversion elements or are all n-type thermoelectric conversion elements. A thermal resistance value of the wires is not less than a thermal resistance value of the thermoelectric conversion elements.

10 Claims, 21 Drawing Sheets

(56) References Cited

U.S. PATENT DOCUMENTS

| | | | |
|---|---|---|---|
| 2009/0277489 A1* | 11/2009 | Dannoux | H10N 10/17 136/201 |
| 2012/0227780 A1* | 9/2012 | Kurihara | H10N 10/17 136/224 |
| 2013/0333738 A1 | 12/2013 | Suemori et al. | |
| 2016/0104829 A1* | 4/2016 | Hayashi | H10N 10/17 136/203 |

FOREIGN PATENT DOCUMENTS

| | | |
|---|---|---|
| JP | 2018152546 A | 9/2018 |
| WO | 2011065185 A1 | 6/2011 |
| WO | 2012121133 A1 | 9/2012 |

OTHER PUBLICATIONS

Translation of Fig. 8 of JP H03-66182A, provided by STIC-Translations (Year: 2024).*

Machine translation of JPH03-66182 (Year: 1991).*

Nov. 9, 2021, International Search Report issued in the International Patent Application No. PCT/JP2021/034006.

www.aist.go.jp, Retrieved on Oct. 21, 2022, from URL: https://www.aist.go.jp/aist_j/press_release/pr2012/pr20120831/pr20120831.html.

Mar. 28, 2023, International Preliminary Report on Patentability issued in the International Patent Application No. PCT/JP2021/034006.

* cited by examiner

| Setting examples | Element (material) | Thermal conductivity K [W/mk] | Electrical conductivity δ [S/cm] | Length [mm] | Width W [mm] | Thickness H [μm] | Thermal resistance [K/W] | Electrical resistance |
|---|---|---|---|---|---|---|---|---|
| Example 1 | Thermoelectric conversion element 20 (CNTs) | 15 | 900 | 15 | 1.5 | 50 | 13.3 | 2.222 |
| | Wire 60 (copper) | 400 | $6 \times 10^7$ | 16 | 0.15 | 15 | 17.8 | 0.001 |
| Example 2 | Wire 60 (copper) | 400 | $6 \times 10^7$ | 16 | 0.15 | 20 | 13.3 | 0.001 | ns of this patent page follow.

THERMOELECTRIC CONVERSION MODULE AND METHOD OF PRODUCING THERMOELECTRIC CONVERSION MODULE

TECHNICAL FIELD

The present disclosure relates to a thermoelectric conversion module and a method of producing a thermoelectric conversion module.

BACKGROUND

There are known thermoelectric conversion modules that include a plurality of thermoelectric conversion elements (for example, refer to Patent Literature (PTL) 1, PTL 2, and Non-Patent Literature (NPL) 1). A thermoelectric conversion element is an element that exploits a temperature difference between both ends thereof in order to convert heat to electrical power.

CITATION LIST

Patent Literature

PTL 1: WO2012/121133A1
PTL 2: JP2015-144212A

Non-Patent Literature

NPL 1: National Institute of Advanced Industrial Science and Technology, "Development of high thermoelectric conversion performance conductive polymer thin film", press release of National Institute of Advanced Industrial Science and Technology, [online], Aug. 31, 2012, [searched on Aug. 17, 2020], internet <https://www.aist-.go.jp/aist_j/press_release/pr2012/pr20120831/pr20120831.html>

SUMMARY

Technical Problem

In a thermoelectric conversion module that includes a plurality of thermoelectric conversion elements, it is necessary for the plurality of thermoelectric conversion elements to be electrically connected via wires. Connection of a plurality of thermoelectric conversion elements by wires may result in heat at high-temperature ends of the thermoelectric conversion elements being transmitted to low-temperature ends of the thermoelectric conversion elements via the wires. When heat is transmitted from the high-temperature ends of the thermoelectric conversion elements to the low-temperature ends of the thermoelectric conversion elements, this may reduce the temperature difference between both ends of the thermoelectric conversion elements and reduce electrical power generated by the thermoelectric conversion elements.

Accordingly, an object of the present disclosure is to solve the problem set forth above and provide a thermoelectric conversion module and a method of producing a thermoelectric conversion module in which reduction of generated electrical power is suppressed.

Solution to Problem

The present disclosure aims to advantageously solve the problem set forth above, and a presently disclosed thermoelectric conversion module is a thermoelectric conversion module comprising: a sheet substrate that is electrically insulating and has a front surface and a rear surface; a plurality of thermoelectric conversion elements having an elongated shape extending in a first direction and arranged such as to be lined up along a second direction intersecting the first direction at the front surface of the sheet substrate; and a wiring layer including a plurality of wires that electrically connect adjacent thermoelectric conversion elements in series at both lengthwise ends, wherein the plurality of thermoelectric conversion elements are all p-type thermoelectric conversion elements or are all n-type thermoelectric conversion elements, and a thermal resistance value of the wires is not less than a thermal resistance value of the thermoelectric conversion elements. A configuration such as set forth above can suppress reduction of the temperature difference between both ends of the thermoelectric conversion elements. By suppressing reduction of the temperature difference between both ends of the thermoelectric conversion elements, it is possible to suppress reduction of electrical power generated by the thermoelectric conversion elements. Consequently, it is possible to provide a thermoelectric conversion module in which reduction of generated electrical power is suppressed.

In the presently disclosed thermoelectric conversion module, the plurality of thermoelectric conversion elements are preferably all p-type thermoelectric conversion elements. Depending on the thermoelectric conversion material forming the thermoelectric conversion elements, durability may be higher for p-type thermoelectric conversion elements than n-type thermoelectric conversion elements. Thus, the thermoelectric conversion module can be provided with excellent durability through the plurality of thermoelectric conversion elements all being p-type thermoelectric conversion elements.

In the presently disclosed thermoelectric conversion module, an electrical resistance value of the wires is preferably not more than an electrical resistance value of the thermoelectric conversion elements. Through a configuration such as set forth above, it is possible to inhibit current flowing in the thermoelectric conversion module from being limited by the electrical resistance value of the wires.

In the presently disclosed thermoelectric conversion module, the plurality of thermoelectric conversion elements preferably all contain carbon nanotubes. A configuration such as set forth above can further improve mechanical strength of the thermoelectric conversion module and enables weight reduction of the thermoelectric conversion module.

In the presently disclosed thermoelectric conversion module, the plurality of thermoelectric conversion elements are preferably also formed at the rear surface in addition to at the front surface of the sheet substrate. By forming thermoelectric conversion elements at both the front surface and the rear surface of the sheet substrate in this manner, it is possible to increase the density of thermoelectric conversion elements in the thermoelectric conversion module. Increasing the density of thermoelectric conversion elements in the thermoelectric conversion module enables compactization of the thermoelectric conversion module.

In the presently disclosed thermoelectric conversion module, part of each thermoelectric conversion element formed at the front surface preferably overlaps with part of a thermoelectric conversion element formed at the rear surface in plan view of the sheet substrate. A configuration such as set forth above enables compactization of the thermoelectric conversion module.

In the presently disclosed thermoelectric conversion module, the plurality of thermoelectric conversion elements preferably all have rectangular shapes of roughly the same dimensions. A configuration such as set forth above enables compactization of the thermoelectric conversion module.

In the presently disclosed thermoelectric conversion module, respective lengths of the plurality of thermoelectric conversion elements along the first direction, respective widths of the plurality of thermoelectric conversion elements along the second direction, and respective thicknesses of the plurality of thermoelectric conversion elements are preferably adjusted such that respective electrical resistance values of the plurality of thermoelectric conversion elements are roughly the same. Through the plurality of thermoelectric conversion elements each having the same electrical resistance value, electrical power loss in the thermoelectric conversion module can be reduced.

In the presently disclosed thermoelectric conversion module, it is preferable that the respective thicknesses of the plurality of thermoelectric conversion elements are roughly the same, the respective lengths of the plurality of thermoelectric conversion elements differ, and the respective widths of the plurality of thermoelectric conversion elements differ.

In the presently disclosed thermoelectric conversion module, it is preferable that the sheet substrate has a trapezoidal shape, the sheet substrate has a first edge corresponding to one leg among two legs of a trapezoid and a second edge corresponding to another leg among the two legs, a distance between the first edge and the second edge in the first direction increases along the second direction, and the plurality of thermoelectric conversion elements extend along the first direction from the first edge to the second edge. Through the sheet substrate having a trapezoidal shape, the degree of freedom of arrangement location of the thermoelectric conversion module can increase.

The present disclosure aims to advantageously solve the problem set forth above, and a presently disclosed method of producing a thermoelectric conversion module is a method of producing a thermoelectric conversion module that includes: a sheet substrate that is electrically insulating and includes a substrate having a front surface and a rear surface and an insulating layer formed at the front surface of the substrate; a plurality of thermoelectric conversion elements having an elongated shape extending in a first direction and arranged such as to be lined up along a second direction intersecting the first direction at a side corresponding to a front surface of the insulating layer; and a wiring layer including a plurality of wires that electrically connect adjacent thermoelectric conversion elements in series at both lengthwise ends at a side corresponding to a rear surface of the insulating layer, the method comprising: a wiring layer formation step of forming the wiring layer above the front surface of the substrate; an insulating layer formation step of forming the insulating layer above the substrate and the wiring layer such that only both ends of each of the wires included in the wiring layer are exposed; an element formation step of forming a thermoelectric conversion element layer above the insulating layer; a thermoelectric conversion element formation step of cutting the thermoelectric conversion element layer along the first direction to form a plurality of thermoelectric conversion elements lined up along the second direction; and a connection step of connecting both ends of the wires that are exposed and both ends of the plurality of thermoelectric conversion elements such that the plurality of thermoelectric conversion elements are all electrically connected in series. A production method such as set forth above makes it possible to provide a thermoelectric conversion module in which reduction of generated electrical power is suppressed.

Moreover, in the presently disclosed method of producing a thermoelectric conversion module, the thermoelectric conversion element layer is preferably a layer that contains carbon nanotubes. Through a configuration such as set forth above, mechanical strength further improves, and a lightweight thermoelectric conversion module can be produced.

In the presently disclosed method of producing a thermoelectric conversion module, the thermoelectric conversion element formation step is preferably performed using a UV laser, a nanosecond laser, or a femtosecond laser. By using a UV laser, a nanosecond laser, or a femtosecond laser, it is possible to reduce heat generation due to the laser. Reducing heat generation due to the laser makes it possible to suppress widening of gaps between the thermoelectric conversion elements in the second direction and to increase the density of thermoelectric conversion elements in the thermoelectric conversion module.

Advantageous Effect

According to the present disclosure, it is possible to provide a thermoelectric conversion module and a method of producing a thermoelectric conversion module in which reduction of generated electrical power is suppressed.

DETAILED DESCRIPTION

Figure 1:
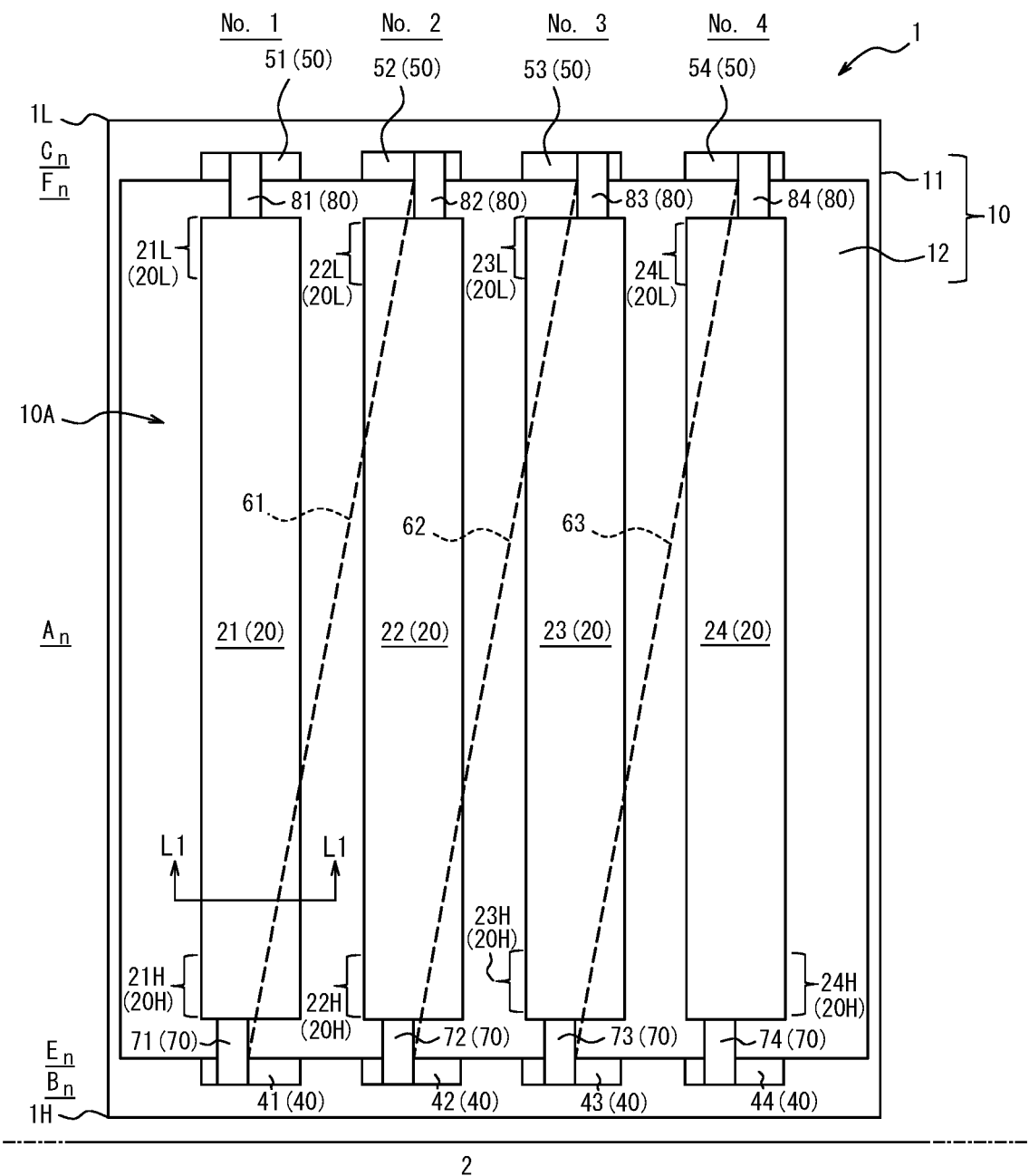
FIG. 1 is an external view of a thermoelectric conversion module according to a first embodiment of the present disclosure.
Figure 1:
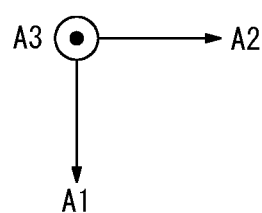

The following describes embodiments according to the present disclosure with reference to the drawings. Common elements of configuration in the drawings are allotted the same reference signs.

First Embodiment

Figure 2:
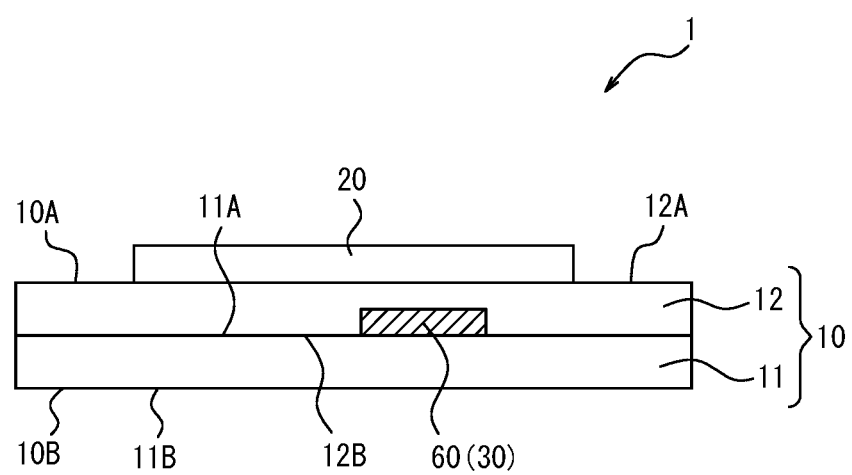
FIG. 2 is a cross-sectional view of the thermoelectric conversion module along a line L1-L1 illustrated in FIG. 1.
Figure 2:
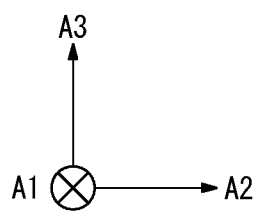
Figure 3:
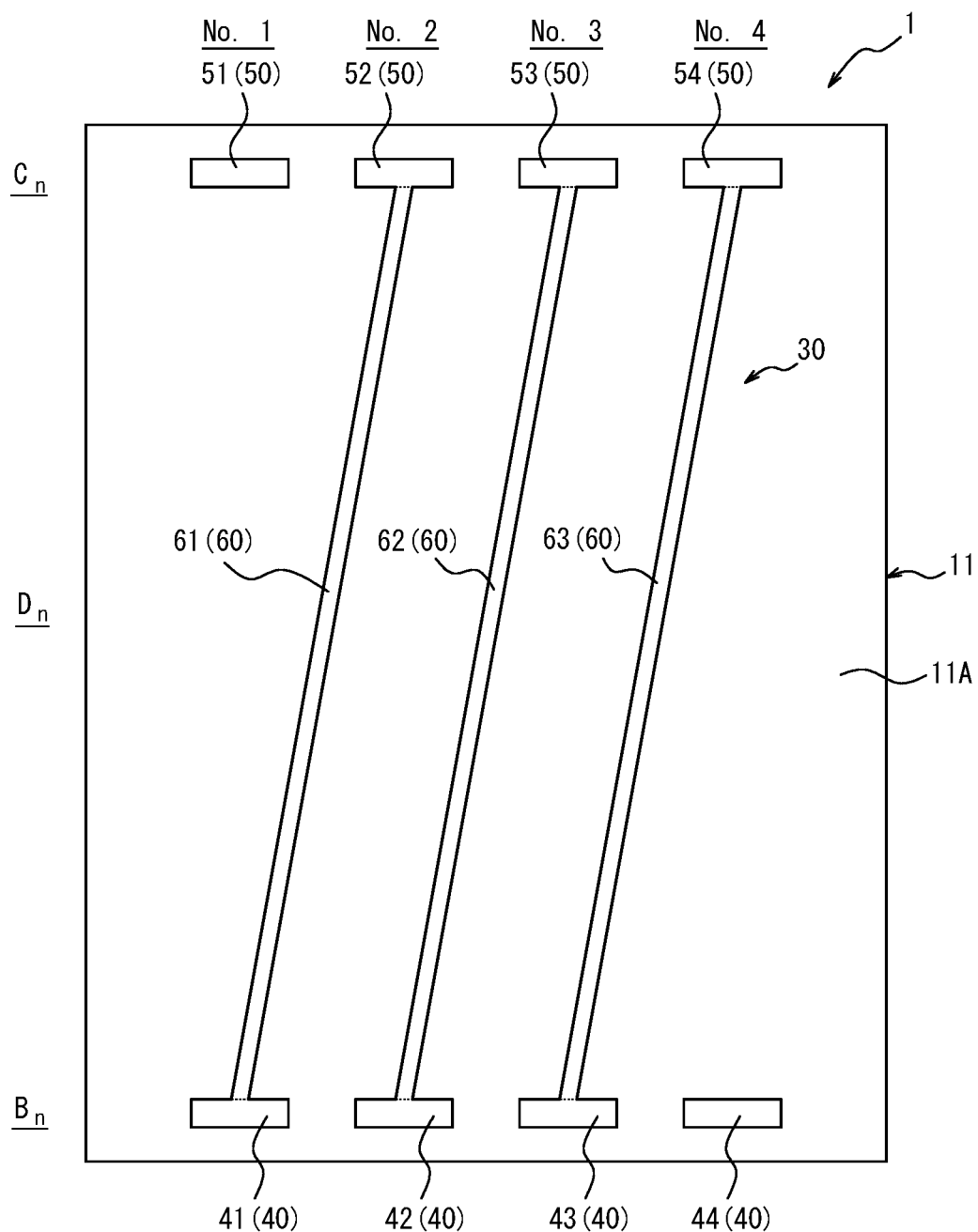
FIG. 3 illustrates a wiring layer illustrated in FIG. 1.
Figure 4:
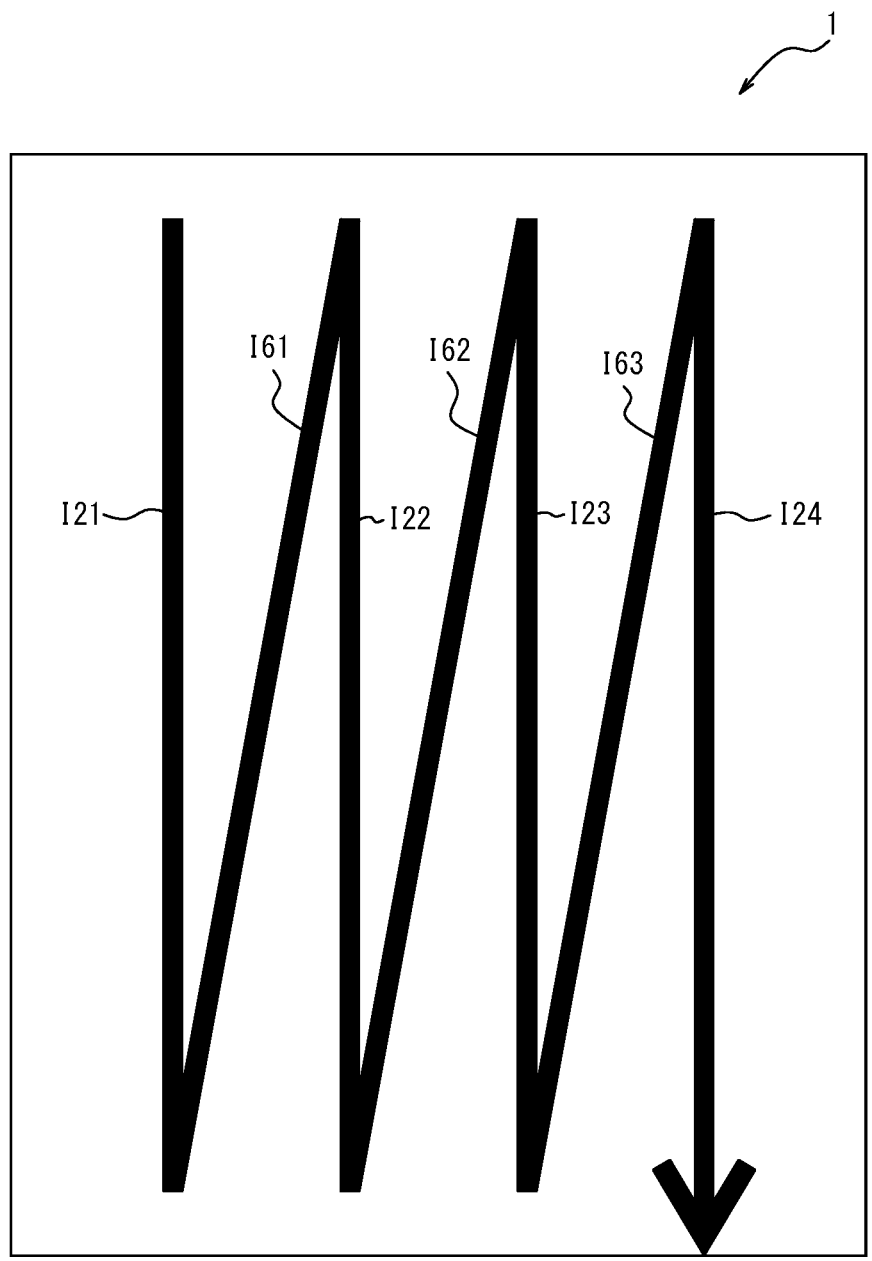
FIG. 4 illustrates a current path in the thermoelectric conversion module illustrated in FIG. 1.
Figure 6:
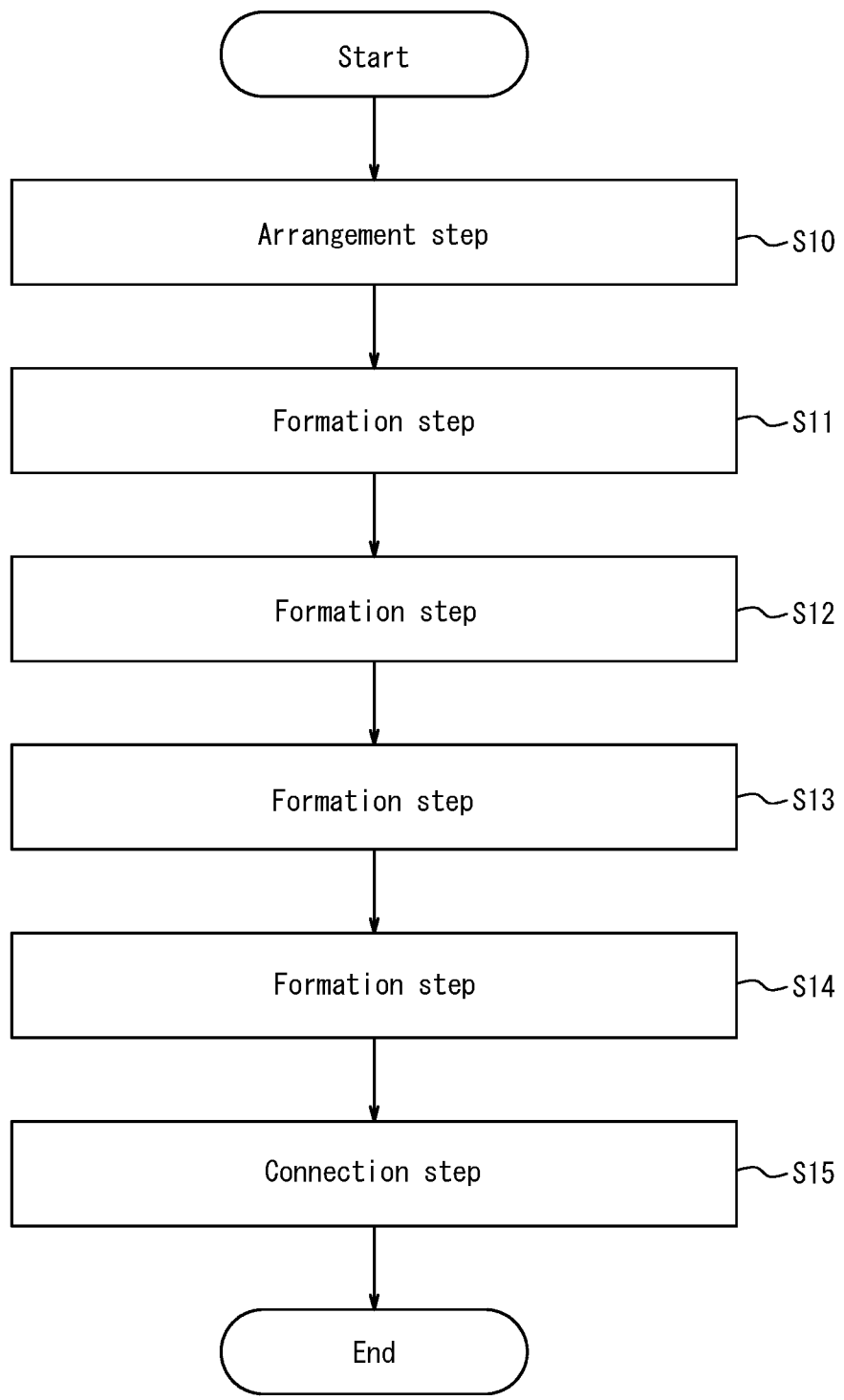
FIG. 6 is a flowchart illustrating flow of a method of producing the thermoelectric conversion module illustrated in FIG. 1.

FIG. 1 is an external view of a thermoelectric conversion module 1 according to a first embodiment of the present disclosure. FIG. 2 is a cross-sectional view of the thermoelectric conversion module 1 along a line L1-L1 illustrated in FIG. 1. FIG. 3 illustrates a wiring layer 30 illustrated in FIG. 1. The configuration illustrated in FIG. 3 corresponds to a configuration after implementation of a formation step S11 of a wiring layer 30 such as illustrated in FIG. 6, which is described further below. FIG. 4 illustrates a current path in the thermoelectric conversion module illustrated in FIG. 1.

As illustrated in FIG. 1, the thermoelectric conversion module 1 can be arranged at a heat source 2. The thermoelectric conversion module 1 has a first edge 1H and a second edge 1L on a sheet substrate 10, which is described further below. The first edge 1H and the second edge 1L are opposite to each other. The first edge 1H can be located close to the heat source 2 when the thermoelectric conversion module 1 is arranged at the heat source 2. The second edge 1L can be located far from the heat source 2 when the thermoelectric conversion module 1 is arranged at the heat source 2.

The temperature around the first edge 1H can be higher than the temperature around the second edge 1L as a result of the first edge 1H being located further toward the heat source 2 than the second edge 1L. In other words, the temperature around the second edge 1L can be lower than the temperature around the first edge 1H.

In FIG. 1, a first direction A1 is a direction in which the first edge 1H and the second edge 1L are opposite to each other. In the present embodiment, the first direction A1 is defined as a direction toward the first edge 1H from the second edge 1L of the thermoelectric conversion module 1.

In FIG. 1, a second direction A2 is a direction that is orthogonal to the first direction A1. However, it is not essential for the second direction A2 to be orthogonal to the first direction A1 so long as the second direction A2 intersects the first direction A1. In the present embodiment, the second direction A2 is defined as a direction toward the right side of the page from the left side of the page in FIG. 1.

In FIG. 1, a third direction A3 is a direction that is orthogonal to a plane including the first direction A1 and the second direction A2. In the present embodiment, the third direction A3 is defined as a direction toward the foreground of the page from the background of the page in FIG. 1.

In the following description, "above" indicates a side in the third direction A3 unless otherwise specified. Moreover, "below" indicates a side in an opposite direction to the third direction A3 unless otherwise specified.

As illustrated in FIG. 1, the shape of the thermoelectric conversion module 1 as viewed from the third direction A3 is a quadrilateral shape such as a rectangular shape. The thermoelectric conversion module 1 includes the sheet substrate 10, thermoelectric conversion elements 21, 22, 23, and 24, first joining members 71, 72, 73, and 74, and second joining members 81, 82, 83, and 84 as illustrated in FIG. 1. The thermoelectric conversion module 1 also includes a wiring layer 30 as illustrated in FIG. 3. The wiring layer 30 is located in the sheet substrate 10. The wiring layer 30 may be located at a side corresponding to a rear surface 12B of an insulating layer 12 described further below. The wiring layer 30 includes first electrodes 41, 42, 43, and 44, second electrodes 51, 52, 53, and 54, and wires 61, 62, and 63.

In the following description, the thermoelectric conversion elements 21 to 24 are also referred to collectively as "thermoelectric conversion elements 20" when no specific distinction is made therebetween. FIG. 1 illustrates a thermoelectric conversion module 1 that includes 4 thermoelectric conversion elements 20. However, the number of the plurality of thermoelectric conversion elements 20 included in the thermoelectric conversion module 1 may be any number.

In the following description, the first electrodes 41 to 44 are also referred to collectively as "first electrodes 40" when no specific distinction is made therebetween. Moreover, the second electrodes 51 to 54 are also referred to collectively as "second electrodes 50" when no specific distinction is made therebetween. Furthermore, the wires 61 to 63 are also referred to collectively as "wires 60" when no specific distinction is made therebetween. FIG. 3 illustrates a wiring layer 30 that includes 4 first electrodes 40, 4 second electrodes 50, and 3 wires 60. However, the number of first electrodes 40, the number of second electrodes 50, and the number of wires 60 included in the wiring layer 30 may be numbers in accordance with the number of thermoelectric conversion elements 20 included in the thermoelectric conversion module 1.

In the following description, the first joining members 71 to 74 are also referred to collectively as "first joining members 70" when no specific distinction is made therebetween. Moreover, the second joining members 81 to 84 are also referred to collectively as "second joining members 80" when no specific distinction is made therebetween. FIG. 1 illustrates a thermoelectric conversion module 1 that includes 4 first joining members 70 and 4 second joining members 80. However, the number of first joining members 70 and the number of second joining members 80 included in the thermoelectric conversion module 1 may be numbers in accordance with the number of thermoelectric conversion elements 20 included in the thermoelectric conversion module 1.

In the following description, numbers allotted along the second direction A2 to the plurality of thermoelectric conversion elements 20 included in the thermoelectric conversion module 1 are also referred to as "number $A_n$" (n is an integer). A minimum value (n=1) for the number $A_n$ is taken to be 1. The number $A_n$ increases one by one along the second direction A2. Numbers $A_n$ for the thermoelectric conversion elements 21, 22, 23, and 24 are No. 1, No. 2, No. 3, and No. 4, respectively.

In the following description, numbers allotted along the second direction A2 to the plurality of first electrodes 40 included in the wiring layer 30 are also referred to as "number $B_n$," (n is an integer). A minimum value (n=1) for the number $B_n$ is taken to be 1. The number $B_n$ increases one by one along the second direction A2. Numbers $B_n$ allotted along the second direction A2 to the first electrodes 41, 42, 43, and 44 are No. 1, No. 2, No. 3, and No. 4, respectively.

In the following description, numbers allotted along the second direction A2 to the plurality of second electrodes 50 included in the wiring layer 30 are also referred to as "number $C_n$," (n is an integer). A minimum value (n=1) for the number $C_n$ is taken to be 1. The number $C_n$ increases one by one along the second direction A2. Numbers $C_n$ allotted along the second direction A2 to the second electrodes 51, 52, 53, and 54 are No. 1, No. 2, No. 3, and No. 4, respectively.

In the following description, numbers allotted along the second direction A2 to the plurality of wires 60 included in the wiring layer 30 are also referred to as "number $D_n$" (n is an integer). A minimum value (n=1) for the number $D_n$ is taken to be 1. The number $D_n$ increases one by one along the second direction A2. Numbers $D_n$ allotted along the second direction A2 to the wires 61, 62, and 63 are No. 1, No. 2, and No. 3, respectively.

In the following description, numbers allotted along the second direction A2 to the plurality of first joining members 70 included in the thermoelectric conversion module 1 are also referred to as "number $E_n$," (n is an integer). A minimum value (n=1) for the number $E_n$ is taken to be 1. The number $E_n$ increases one by one along the second direction A2. Numbers $E_n$ allotted to the first joining members 71, 72, 73, and 74 are No. 1, No. 2, No. 3, and No. 4, respectively.

In the following description, numbers allotted along the second direction A2 to the plurality of second joining members 80 included in the thermoelectric conversion module 1 are also referred to as "number $F_n$" (n is an integer). A minimum value (n=1) for the number $F_n$ is taken to be 1. The number $F_n$ increases one by one along the second direction A2. Numbers $F_n$ allotted to the second joining members 81, 82, 83, and 84 are No. 1, No. 2, No. 3, and No. 4, respectively.

The sheet substrate 10 such as illustrated in FIG. 1 is electrically insulating. The sheet substrate 10 may be flexible. The material for forming the sheet substrate 10 can be any electrically insulating material without any specific limitations. The shape of the sheet substrate 10 as viewed from the third direction A3 is a quadrilateral shape such as a rectangular shape. The sheet substrate 10 may be parallel to a plane including the first direction A1 and the second direction A2.

The sheet substrate 10 has the first edge 1H described above and the second edge 1L described above. The sheet substrate 10 also has a front surface 10A and a rear surface 10B as illustrated in FIG. 2. The front surface 10A and the rear surface 10B are opposite to each other. The front surface 10A is a surface that faces in the third direction A3 among surfaces of the sheet substrate 10. The rear surface 10B is a surface that faces in an opposite direction to the third direction A3 among surfaces of the sheet substrate 10.

The sheet substrate 10 includes a substrate 11 and an insulating layer 12 as illustrated in FIG. 2.

The substrate 11 is electrically insulating. The substrate 11 may be flexible. The material for forming the substrate 11 can be any material such as polyimide or epoxy glass without any specific limitations. As illustrated in FIG. 1, the shape of the substrate 11 as viewed from the third direction A3 is a quadrilateral shape such as a rectangular shape. The substrate 11 may be parallel to a plane including the first direction A1 and the second direction A2.

The substrate 11 has a front surface 11A and a rear surface 11B as illustrated in FIG. 2. The front surface 11A and the rear surface 11B are opposite to each other. The front surface 11A is a surface that faces in the third direction A3 among surfaces of the substrate 11. The rear surface 11B is a surface that faces in an opposite direction to the third direction A3 among surfaces of the substrate 11. The rear surface 11B may correspond to the rear surface 10B of the sheet substrate 10.

The insulating layer 12 is electrically insulating. The insulating layer 12 may be flexible. The material for forming the insulating layer 12 can be any electrically insulating material without any specific limitations. The insulating layer 12 may be located at the front surface 11A of the substrate 11. As illustrated in FIG. 1, the shape of the insulating layer 12 as viewed from the third direction A3 is a quadrilateral shape such as a rectangular shape. The insulating layer 12 may be parallel to a plane including the first direction A1 and the second direction A2.

The insulating layer 12 has a front surface 12A and a rear surface 12B as illustrated in FIG. 2. The front surface 12A and the rear surface 12B are opposite to each other. The front surface 12A is a surface that faces in the third direction A3 among surfaces of the insulating layer 12. The front surface 12A may correspond to the front surface 10A of the sheet substrate 10. The rear surface 12B is a surface that faces in an opposite direction to the third direction A3 among surfaces of the insulating layer 12.

The plurality of thermoelectric conversion elements 21 to 24 are all p-type thermoelectric conversion elements or are all n-type thermoelectric conversion elements. Depending on the thermoelectric conversion material forming a thermoelectric conversion element 20, durability may be higher for one of a p-type thermoelectric conversion element and an n-type thermoelectric conversion element than for the other thereof. Through the plurality of thermoelectric conversion elements 20 included in the thermoelectric conversion module 1 all being p-type thermoelectric conversion elements or all being n-type thermoelectric conversion elements, the thermoelectric conversion module 1 can have excellent durability.

The thermoelectric conversion material for forming the thermoelectric conversion elements 20 can be a bismuth-tellurium-based compound, an antimony-based compound, a silicon-based compound, a metal oxide-based compound, a Heusler alloy-based compound, a conductive polymer compound, conductive fibers, a composite material of any thereof, or the like, without any specific limitations. In particular, it is preferable to use conductive fibers, and more preferable to use fibrous carbon nanostructures such as carbon nanotubes (hereinafter, also referred to as "CNTs"). This is because the mechanical strength of the presently disclosed thermoelectric conversion module 1 can be further improved and the weight thereof can be reduced by using CNTs. Although single-walled CNTs and/or multi-walled CNTs can be used as the CNTs without any specific limitations, it is preferable that the CNTs are single-walled CNTs. This is because single-walled CNTs tend to have superior thermoelectric characteristics (Seebeck coefficient). Note that the single-walled carbon nanotubes may be CNTs produced in accordance with a method (super growth method; refer to WO2006/011655A1) in which, during synthesis of CNTs through chemical vapor deposition (CVD) by supplying a feedstock compound and a carrier gas onto a substrate having a catalyst layer for CNT production at the surface thereof, a trace amount of an oxidant (catalyst activating material) is provided in the system so as to dramatically improve catalytic activity of the catalyst layer (hereinafter, CNTs produced in accordance with this method are also referred to as "SGCNTs"). In addition, a feature of SGCNTs is that they have a large number of bends. Although CNTs have high thermal conductivity through movement of electrons, an effect of reduction of thermal conductivity thereof through phonon vibration is also thought to be high. However, SGCNTs have a structure that impairs amplification of phonon vibration due the large number of bends compared to CNTs produced by other typical methods, and thus the reduction of thermal conductivity caused by phonon vibration can be suppressed. Consequently, SGCNTs can act as superior thermoelectric conversion materials compared to other typical CNTs.

The thermoelectric conversion elements 21 to 24 may all contain CNTs. Such a configuration can further improve mechanical strength of the thermoelectric conversion module 1 and enables weight reduction of the thermoelectric conversion module 1.

In a case in which the thermoelectric conversion material for forming the thermoelectric conversion elements 20 is an organic material such as CNTs, for example, the thermoelectric conversion elements 21 to 24 may all be p-type thermoelectric conversion elements. Oxidation of the thermoelectric conversion elements 20 through oxygen, moisture, or the like in the atmosphere may act as a major cause of deterioration of characteristics of the thermoelectric conversion elements 20 in a case in which the thermoelectric conversion material is an organic material. In this case, p-type thermoelectric conversion elements can have higher durability than n-type thermoelectric conversion elements because n-type thermoelectric conversion elements are more easily affected by oxidation through oxygen, moisture, or the like in the atmosphere than p-type thermoelectric conversion elements. In a case in which the thermoelectric conversion material is an organic material, for example, the thermoelectric conversion module 1 can be provided with excellent durability through the plurality of thermoelectric conversion elements 20 included in the thermoelectric conversion module 1 all being p-type thermoelectric conversion elements.

The thermoelectric conversion elements 20 extend along the first direction A1 as illustrated in FIG. 1. The shape of the thermoelectric conversion elements 20 as viewed from the third direction A3 is an elongated shape such as a rectangular shape. A lengthwise direction of the thermoelectric conversion elements 20 is along the first direction A1. The lengthwise direction of the thermoelectric conversion elements 20 may be parallel to the first direction A1. The thermoelectric conversion elements 21 to 24 may each have the same shape. The cross-sectional shape of the thermoelectric conversion elements 20 may be a thin film shape as illustrated in FIG. 2.

As illustrated in FIG. 1, the thermoelectric conversion elements 21 to 24 are arranged such as to be lined up along the second direction A2 at the front surface 10A of the sheet substrate 10 (for example, at the front surface 12A of the insulating layer 12). For example, the thermoelectric conversion elements 21 to 24 are arranged such as to be lined up along the second direction A2 at a side corresponding to the front surface 12A of the insulating layer 12. The thermoelectric conversion elements 21 to 24 may be lined up along the second direction A2 with gaps therebetween. The width of these gaps may be any width so long as it is possible to ensure electrical insulation between two thermoelectric conversion elements 20 that are adjacent to each other in the second direction A2.

The thermoelectric conversion elements 21 to 24 may all have rectangular shapes that are of roughly the same dimensions. As a result of the thermoelectric conversion elements 21 to 24 all having rectangular shapes that are of roughly the same dimensions, the thermoelectric conversion elements 21 to 24 can be efficiently arranged at the front surface 10A of the sheet substrate 10. A configuration such as set forth above enables compactization of the thermoelectric conversion module.

The thermoelectric conversion elements 20 each have a first end 20H and a second end 20L in the first direction A1. The first end 20H is located toward the first edge 1H of the thermoelectric conversion module 1. The second end 20L is located toward the second edge 1L of the thermoelectric conversion module 1. Note that the first ends 20H of the thermoelectric conversion elements 21, 22, 23, and 24 are also referred to as "first end 21H", "first end 22H", "first end 23H", and "first end 24H", respectively. Moreover, the second ends 20L of the thermoelectric conversion elements 21, 22, 23, and 24 are also referred as "second end 21L", "second end 22L", "second end 23L", and "second end 24L", respectively. Note that in the configuration illustrated in FIG. 1, the first ends 21H to 24H have different locations in the first direction A1. However, the locations of the first ends 21H to 24H in the first direction A1 may be the same. Also note that in the configuration illustrated in FIG. 1, the second ends 21L to 24L have different locations in the first direction A1. However, the locations of the second ends 21L to 24L in the first direction A1 may be the same.

The thermoelectric conversion elements 20 can exploit a temperature difference between the first ends 20H and the second ends 20L to generate electricity. More specifically, the temperature of the first ends 20H of the thermoelectric conversion elements 20 can be higher than the temperature of the second ends 20L as a result of the first ends 20H being located further toward the first edge 1H than the second ends 20L. A temperature difference can arise between the first ends 20H and the second ends 20L through the temperature of the first ends 20H becoming higher than the temperature of the second ends 20L. When a temperature difference arises between the first ends 20H and the second ends 20L, this can create a temperature gradient in the thermoelectric conversion elements 20. Electromotive force arising through the Seebeck effect as a result of this temperature gradient enables generation of electricity by the thermoelectric conversion elements 20.

When the thermoelectric conversion elements 20 generate electricity, current flowing in the thermoelectric conversion elements 20 can be generated. For example, currents I21, I22, I23, and I24 flowing in the first direction A1 in the thermoelectric conversion elements 21, 22, 23, and 24, respectively, can be generated as illustrated in FIG. 4.

Respective lengths of the thermoelectric conversion elements 21 to 24 along the first direction A1, respective widths of the thermoelectric conversion elements 21 to 24 along the second direction A2, and respective thicknesses of the thermoelectric conversion elements 21 to 24 in the third direction A3 may be adjusted such that respective electrical resistance values of the thermoelectric conversion elements 21 to 24 are roughly the same. When the respective electrical resistance values of the thermoelectric conversion elements 21 to 24 differ, electrically connecting the thermoelectric conversion elements 21 to 24 is series results in current that can be generated in the thermoelectric conversion module 1 being determined by a thermoelectric conversion element 20 having a small electrical resistance value. It is possible to inhibit current that can be generated in the thermoelectric conversion module 1 being determined by a thermoelectric conversion element 20 having a small electrical resistance value through the respective electrical resistance values of the thermoelectric conversion elements 21 to 24 being roughly the same. A configuration such as set forth above can reduce electrical power loss in the thermoelectric conversion module 1.

The first electrodes 40, the second electrodes 50, and the wires 60 may be formed of the same electrically conductive material or may be formed of different electrically conductive materials. The electrically conductive material for forming each of the first electrodes 40, the second electrodes 50, and the wires 60 can be any metal such as copper or aluminum without any specific limitations. In the following description, the first electrodes 40, the second electrodes 50, and the wires 60 are considered to be formed of the same electrically conductive material.

The first electrodes 40 may be located at the front surface 11A of the substrate 11. The first electrodes 41 to 44 may be lined up along the second direction A2 with gaps therebetween. The width of these gaps may be any width so long as it is possible to ensure electrical insulation between two first electrodes 40 that are adjacent to each other in the second direction A2.

As illustrated in FIG. 1, at least one part of each of the first electrodes 40 may be exposed from the sheet substrate 10 (for example, from the insulating layer 12). The at least one part of each of the first electrodes 40 that is exposed from the sheet substrate 10 (for example, from the insulating layer 12) may be electrically connected to the first end 20H of a thermoelectric conversion element 20 via a first joining member 70.

In the present embodiment, at least one part of a number $B_n$ first electrode 40 that is exposed from the insulating layer 12 may be electrically connected to the first end 20H of a thermoelectric conversion element 20 of the same number $A_n$ as the number $B_n$ via a first joining member 70 of the same number $E_n$ as the number $B_n$. For example, at least one part of the No. 1 first electrode 41 that is exposed from the insulating layer 12 is electrically connected to the first end 21H of the No. 1 thermoelectric conversion element 21 via the No. 1 first joining member 71. Moreover, at least one part of the No. 2 first electrode 42 that is exposed from the insulating layer 12 is electrically connected to the first end 22H of the No. 2 thermoelectric conversion element 22 via the No. 2 first joining member 72. Furthermore, at least one part of the No. 3 first electrode 43 that is exposed from the insulating layer 12 is electrically connected to the first end 23H of the No. 3 thermoelectric conversion element 23 via the No. 3 first joining member 73. Also, at least one part of the No. 4 first electrode 44 that is exposed from the insulating layer 12 is electrically connected to the first end 24H of the No. 4 thermoelectric conversion element 24 via the No. 4 first joining member 74.

The location of the number $B_n$ first electrode 40 in the second direction A2 may be the same as the location in the second direction A2 of the thermoelectric conversion element 20 of the same number $A_n$ as the number $B_n$. The number $B_n$ first electrode 40 may be located further toward the first edge 1H of the thermoelectric conversion module 1 than the first end 20H of the thermoelectric conversion element 20 of the same number $A_n$ as the number $B_n$. The number $B_n$ first electrode 40 may be located between the first end 20H of the thermoelectric conversion element 20 of the same number $A_n$ as the number $B_n$ and the first edge 1H of the thermoelectric conversion module 1. For example, the No. 1 first electrode 41 is located between the first end 21H of the No. 1 thermoelectric conversion element 21 and the first edge 1H. Moreover, the No. 2 first electrode 42 is located between the first end 22H of the No. 2 thermoelectric conversion element 22 and the first edge 1H. Furthermore, the No. 3 first electrode 43 is located between the first end 23H of the No. 3 thermoelectric conversion element 23 and the first edge 1H. Also, the No. 4 first electrode 44 is located between the first end 24H of the No. 4 thermoelectric conversion element 24 and the first edge 1H.

Figure 5:
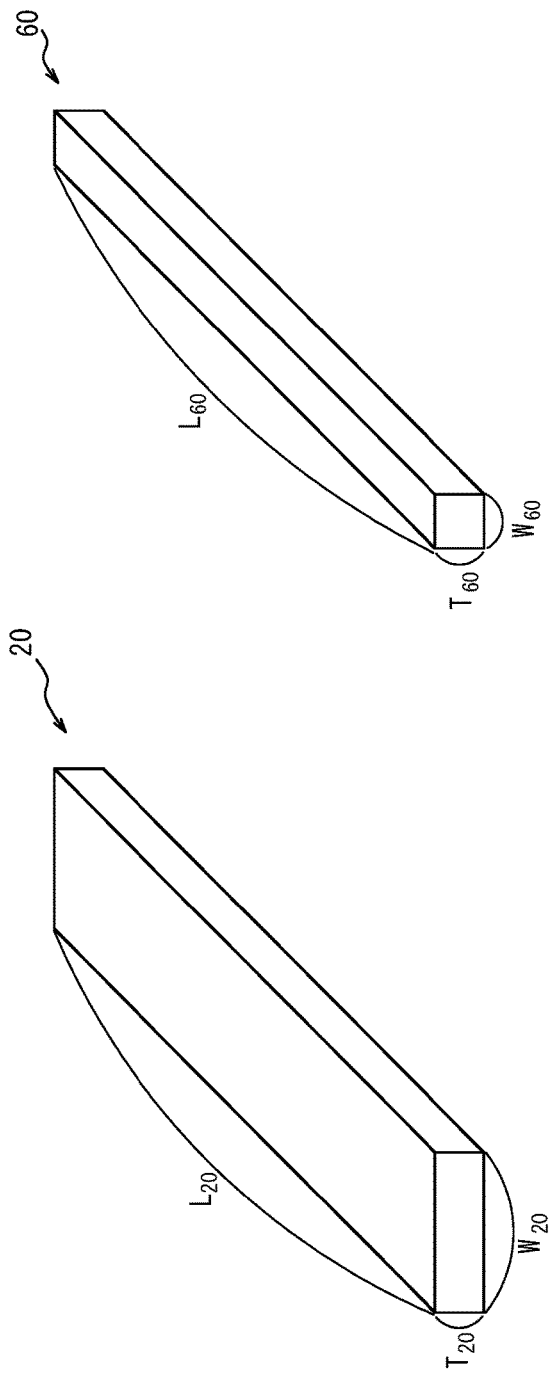
FIG. 5 is an illustration for describing setting of thermal resistance values of a thermoelectric conversion element and a wire.

An electrical resistance value of the first electrodes 40 may be not more than an electrical resistance value of the wires 60. The first electrodes 40 may be configured such that an electrical resistance value of the first electrodes 40 is not more than an electrical resistance value of the wires 60. As one example, in a case in which the thickness of the first electrodes 40 in the third direction A3 and the thickness of the wires 60 in the third direction A3 are the same, the width of the first electrodes 40 along the second direction A2 may be wider than the width $W_{60}$ of the wires 60 such as illustrated in FIG. 5, which is described further below. A configuration such as set forth above makes it possible for the first electrodes 40 to have an electrical resistance value that is not more than an electrical resistance value of the wires 60.

A lead-out wire for extracting electrical power generated by the thermoelectric conversion module 1 may be electrically connected to any of the plurality of first electrodes 40. As one example, this lead-out wire may be electrically connected to the first electrode 44.

As illustrated in FIG. 3, the second electrodes 50 may be located at the front surface 11A of the substrate 11. The second electrodes 51 to 54 may be lined up along the second direction A2 with gaps therebetween. The width of these gaps may be any width so long as it is possible to ensure electrical insulation between two second electrodes 50 that are adjacent to each other in the second direction A2.

As illustrated in FIG. 1, at least one part of each of the second electrodes 50 may be exposed from the sheet substrate 10 (for example, from the insulating layer 12). The at least one part of each of the second electrodes 50 that is exposed from the sheet substrate 10 (for example, from the insulating layer 12) may be electrically connected to the second end 20L of a thermoelectric conversion element 20 via a second joining member 80.

In the present embodiment, at least one part of a number $C_n$ second electrode 50 that is exposed from the insulating layer 12 may be electrically connected to the second end 20L of a thermoelectric conversion element 20 of the same number $A_n$ as the number $C_n$ via a second joining member 80 of the same number $F_n$ as the number $C_n$. For example, at least one part of the No. 1 second electrode 51 that is exposed from the insulating layer 12 is electrically connected to the second end 21L of the No. 1 thermoelectric conversion element 21 via the No. 1 second joining member 81. Moreover, at least one part of the No. 2 second electrode 52 that is exposed from the insulating layer 12 is electrically connected to the second end 22L of the No. 2 thermoelectric conversion element 22 via the No. 2 second joining member 82. Furthermore, at least one part of the No. 3 second electrode 53 that is exposed from the insulating layer 12 is electrically connected to the second end 23L of the No. 3 thermoelectric conversion element 23 via the No. 3 second joining member 83. Also, at least one part of the No. 4 second electrode 54 that is exposed from the insulating layer 12 is electrically connected to the second end 24L of the No. 4 thermoelectric conversion element 24 via the No. 4 second joining member 84.

The location of the number $C_n$ second electrode 50 in the second direction A2 may be the same as the location in the second direction A2 of the thermoelectric conversion element 20 of the same number $A_n$ as the number $C_n$. The number $C_n$ second electrode 50 may be located further toward the second edge 1L of the thermoelectric conversion module 1 than the second end 20L of the thermoelectric conversion element 20 of the same number $A_n$ as the number $C_n$. The number $C_n$ second electrode 50 may be located between the second end 20L of the thermoelectric conversion element 20 of the same number $A_n$ as the number $C_n$ and the second edge 1L of the thermoelectric conversion module 1. For example, the No. 1 second electrode 51 is located between the second end 21L of the No. 1 thermoelectric conversion element 21 and the second edge 1L. Moreover, the No. 2 second electrode 52 is located between the second end 22L of the No. 2 thermoelectric conversion element 22 and the second edge 1L. Furthermore, the No. 3 second electrode 53 is located between the second end 23L of the No. 3 thermoelectric conversion element 23 and the second edge 1L. Also, the No. 4 second electrode 54 is located between the second end 24L of the No. 4 thermoelectric conversion element 24 and the second edge 1L.

An electrical resistance value of the second electrodes 50 may be not more than an electrical resistance value of the wires 60. The second electrodes 50 may be configured such that an electrical resistance value of the second electrodes 50 is not more than an electrical resistance value of the wires 60. As one example, in a case in which the thickness of the second electrodes 50 in the third direction A3 and the thickness of the wires 60 in the third direction A3 are the same, the width of the second electrodes 50 along the second direction A2 may be wider than the width $W_{60}$ of the wires 60 such as illustrated in FIG. 5, which is described further below. A configuration such as set forth above makes it possible for the second electrodes 50 to have an electrical resistance value that is not more than an electrical resistance value of the wires 60.

A lead-out wire for extracting electrical power generated by the thermoelectric conversion module 1 may be electrically connected to any of the plurality of second electrodes 50. As one example, this lead-out wire may be electrically connected to the second electrode 51.

As illustrated in FIG. 2, the wires 60 may be located in the sheet substrate 10. The wires 60 may be located at the front surface 11A of the substrate 11 together with the first electrodes 40 and the second electrodes 50 as illustrated in FIG. 3. The wires 60 may be located at a side corresponding to the rear surface 12B of the insulating layer 12. The wires 60 may be located at a side corresponding to the rear surface 12B of the insulating layer 12 together with the first electrodes 40 and the second electrodes 50.

The wires 60 electrically connect, in series, thermoelectric conversion elements 20 that are adjacent to each other in the second direction A2 at both ends of the thermoelectric conversion elements 20 (i.e., at the first end 20H and the second end 20L). In the present embodiment, for two thermoelectric conversion elements 20 that are adjacent to each other in the second direction A2, a wire 60 electrically connects a first electrode 40 that is electrically connected to the first end 20H of one of these thermoelectric conversion elements 20 and a second electrode 50 that is electrically connected to the second end 20L of the other of these thermoelectric conversion elements 20.

The plurality of wires 60 may electrically connect the plurality of thermoelectric conversion elements 20 in series in an order corresponding to the numbers $A_n$ allotted to the thermoelectric conversion elements 20 by electrically connecting the plurality of first electrodes 40 and the plurality of second electrodes 50 as illustrated in FIG. 3. As one example, a number $D_n$ wire 60 may electrically connect a first electrode 40 of the same number $E_n$ as the number $D_n$ and a second electrode 50 of a number $F_{n+1}$ that is one larger than the number $D_n$. One end of the number $D_n$ wire 60 may be connected to the first electrode 40 of the same number $E_n$ as the number $D_n$. The other end of the number $D_n$ wire 60 may be electrically connected to the second electrode 50 of the number $F_{n+1}$ that is one larger than the number $D_n$. The number $D_n$ wire 60 may extend in a linear shape from the first electrode 40 of the same number $E_n$ as the number $D_n$ to the second electrode 50 of the number $F_{n+1}$ that is one larger than the number $D_n$.

For example, one end of the No. 1 wire 61 is electrically connected to the No. 1 first electrode 41. The other end of the No. 1 wire 61 is electrically connected to the No. 2 (i.e., number one larger than No. 1) second electrode 52. One end of the No. 2 wire 62 is electrically connected to the No. 2 first electrode 42. The other end of the No. 2 wire 62 is electrically connected to the No. 3 (i.e., number one larger than No. 2) second electrode 53. One end of the No. 3 wire 63 is electrically connected to the No. 3 first electrode 43. The other end of the No. 3 wire 63 is electrically connected to the No. 4 (i.e., number one larger than No. 3) second electrode 54.

Through a configuration such as set forth above, the plurality of thermoelectric conversion elements 20 are electrically connected in series in an order corresponding to the numbers $A_n$ that are allotted to the thermoelectric conversion elements 20. As a result of the plurality of thermoelectric conversion elements 20 being electrically connected in series, it is possible for a single current path to form in the thermoelectric conversion module 1 as illustrated in FIG. 4 when the plurality of thermoelectric conversion elements 20 generate electricity. In FIG. 4, currents I61, I62, and I63 are currents that flow in the wires 61, 62, 63, and 64.

The first joining members 70 are electrically conductive. The first joining members 70 may each be formed of any member such as silver paste or solder. A number $E_n$ first joining member 70 may electrically connect the first end 20H of a thermoelectric conversion element 20 of the same number $A_n$ as the number $E_n$ and a first electrode 40 of the same number $B_n$ as the number $E_n$. The number $E_n$ first joining member 70 may extend along the first direction A1 from the first end 20H of the thermoelectric conversion element 20 of the same number $A_n$ as the number $E_n$ to the first electrode 40 of the same number $B_n$ as the number $E_n$.

For example, the No. 1 first joining member 71 electrically connects the first end 21H of the No. 1 thermoelectric conversion element 21 and the No. 1 first electrode 41. The No. 1 first joining member 71 extends along the first direction A1 from the first end 21H of the No. 1 thermoelectric conversion element 21 to the No. 1 first electrode 41. Moreover, the No. 2 first joining member 72 electrically connects the first end 22H of the No. 2 thermoelectric conversion element 22 and the No. 2 first electrode 42. The No. 2 first joining member 72 extends along the first direction A1 from the first end 22H of the No. 2 thermoelectric conversion element 22 to the No. 2 first electrode 42. Furthermore, the No. 3 first joining member 73 electrically connects the first end 23H of the No. 3 thermoelectric conversion element 23 and the No. 3 first electrode 43. The No. 3 first joining member 73 extends along the first direction A1 from the first end 23H of the No. 3 thermoelectric conversion element 23 to the No. 3 first electrode 43. Also, the No. 4 first joining member 74 electrically connects the first end 24H of the No. 4 thermoelectric conversion element 24 and the No. 4 first electrode 44. The No. 4 first joining member 74 extends along the first direction A1 from the first end 24H of the No. 4 thermoelectric conversion element 24 to the No. 4 first electrode 44.

An electrical resistance value of the first joining members 70 may be not more than an electrical resistance value of the wires 60. The first joining members 70 may be configured such that an electrical resistance value of the first joining members 70 is not more than an electrical resistance value of the wires 60. An electrical resistance value of the first joining members 70 may be set as not more than an electrical resistance value of the wires 60 through appropriate selection of the material of the first joining members 70. As one example, in a case in which the material of the wires 60 is copper, the material of the first joining members 70 may be silver paste.

The second joining members 80 are electrically conductive. The second joining members 80 may each be formed of any member such as silver paste or solder. A number $F_n$ second joining member 80 may electrically connect the second end 20L of a thermoelectric conversion element 20 of the same number $A_n$ as the number $F_n$ and a second electrode 50 of the same number $C_n$ as the number $F_n$. The number $F_n$ second joining member 80 may extend along the first direction A1 from the second end 20L of the thermoelectric conversion element 20 of the same number $A_n$ as the number $F_n$ to the second electrode 50 of the same number $C_n$ as the number $F_n$.

For example, the No. 1 second joining member 81 electrically connects the second end 21L of the No. 1 thermoelectric conversion element 21 and the No. 1 second electrode 51. The No. 1 second joining member 81 extends along the first direction A1 from the second end 21L of the No. 1 thermoelectric conversion element 21 to the No. 1 second electrode 51. Moreover, the No. 2 second joining member 82 electrically connects the second end 22L of the No. 2 thermoelectric conversion element 22 and the No. 2 second electrode 52. The No. 2 second joining member 82 extends along the first direction A1 from the second end 22L of the No. 2 thermoelectric conversion element 22 to the No. 2 second electrode 52. Furthermore, the No. 3 second joining member 83 electrically connects the second end 23L of the No. 3 thermoelectric conversion element 23 and the No. 3 second electrode 53. The No. 3 second joining member 83 extends along the first direction A1 from the second end 23L of the No. 3 thermoelectric conversion element 23 to the No. 3 second electrode 53. Also, the No. 4 second joining member 84 electrically connects the second end 24L of the No. 4 thermoelectric conversion element 24 and the No. 4 second electrode 54. The No. 4 second joining member 84 extends along the first direction A1 from the second end 24L of the No. 4 thermoelectric conversion element 24 to the No. 4 second electrode 54.

An electrical resistance value of the second joining members 80 may be not more than an electrical resistance value of the wires 60. The second joining members 80 may be configured such that an electrical resistance value of the second joining members 80 is not more than an electrical resistance value of the wires 60. An electrical resistance value of the second joining members 80 may be set as not more than an electrical resistance value of the wires 60 through appropriate selection of the material of the second joining members 80. As one example, in a case in which the material of the wires 60 is copper, the material of the second joining members 80 may be silver paste.

In the present embodiment, a thermal resistance value of the wires 60 is not less than a thermal resistance value of the thermoelectric conversion elements 20. The wires 60 may be configured such that a thermal resistance value of the wires 60 is not less than a thermal resistance value of the thermoelectric conversion elements 20 as described below with reference to FIG. 5. Through a thermal resistance value of the wires 60 being not less than a thermal resistance value of the thermoelectric conversion elements 20, it is possible to inhibit the transmission of heat from the first end 20H of a thermoelectric conversion element 20 to the second end 20L of another thermoelectric conversion element 20 via a wire 60. For example, transmission of heat from the first end 21H of the thermoelectric conversion element 21 to the second end 22L of the thermoelectric conversion element 22 via the wire 61 can be inhibited. By inhibiting the transmission of heat from the first end 20H of a thermoelectric conversion element 20 to the second end 20L of another thermoelectric conversion element 20, it is possible to suppress reduction of a temperature difference between the first ends 20H and the second ends 20L in the thermoelectric conversion elements 20. By suppressing reduction of the temperature difference between the first ends 20H and the second ends 20L, it is possible to suppress reduction of electrical power generated by the thermoelectric conversion elements 20.

FIG. 5 is an illustration for describing setting of thermal resistance values of a thermoelectric conversion element 20 and a wire 60. In the following description, the length, width, and thickness of the thermoelectric conversion element 20 are also referred to as "length $L_{20}$", "width $W_{20}$", and "thickness $T_{20}$", respectively. The length $L_{20}$ is the length along the first direction A1 of the thermoelectric conversion element 20 such as illustrated in FIG. 1. The width $W_{20}$ is the width along the second direction A2 of the thermoelectric conversion element 20 such as illustrated in FIG. 1. The thickness $T_{20}$ is the thickness in the third direction A3 of the thermoelectric conversion element 20 such as illustrated in FIG. 2. Moreover, the length, width, and thickness of the wire 60 are also referred to as "length $L_{60}$", "width $W_{60}$", and "thickness $T_{60}$", respectively. The length $L_{60}$ is the length that a number $D_n$ wire 60 extends from the first electrode 40 of the same number $B_n$ as the number $D_n$ to the number $C_{n+1}$ (i.e., number one larger than number $D_n$) second electrode 50 such as illustrated in FIG. 3. The thickness $T_{60}$ is the thickness in the third direction A3 of the wire 60 such as illustrated in FIG. 2. The width $W_{60}$ is the width of the wire 60 in a direction orthogonal to the third direction A3 and the direction in which the number $D_n$ wire 60 extends from the first electrode 40 of the same number $B_n$ as the number $D_n$ to the number $C_{n+1}$ (i.e., number one larger than number $D_n$) second electrode 50 such as illustrated in FIG. 3.

The length $L_{60}$, the width $W_{60}$, and the thickness $T_{60}$ of the wire 60 may be set such that a thermal resistance value of the wire 60 is not less than a thermal resistance value of the thermoelectric conversion element 20. In this case, the length $L_{60}$, the width $W_{60}$, and the thickness $T_{60}$ of the wire 60 may be set such as to satisfy the following formula (1).

$$(1/\kappa_{20}) \times \{L_{20}/(T_{20} \times W_{20})\} \leq (1/\kappa_{60}) \times \{L_{60}/(T_{60} \times W_{60})\} \quad \text{Formula (1)}$$

In formula (1), thermal conductivity $\kappa_{20}$ is the thermal conductivity of the thermoelectric conversion element 20. Thermal conductivity $\kappa_{60}$ is the thermal conductivity of the wire 60.

Moreover, a thermal resistance value of the wire 60 may be not less than a thermal resistance value of the thermoelectric conversion element 20, and an electrical resistance value of the wire 60 may be not more than an electrical resistance value of the thermoelectric conversion element 20. In other words, the wire 60 may be configured such that a thermal resistance value of the wire 60 is not less than a thermal resistance value of the thermoelectric conversion element 20 and an electrical resistance value of the wire 60 is not more than an electrical resistance value of the thermoelectric conversion element 20. In this case, the length $L_{60}$, the width $W_{60}$, and the thickness $T_{60}$ of the wire 60 may be set such as to satisfy formula (1) while also satisfying the following formula (2). Through an electrical resistance value of the wire 60 being not more than an electrical resistance value of the thermoelectric conversion element 20, it is possible to inhibit current flowing in the thermoelectric conversion module 1 such as illustrated in FIG. 4 from being limited by the electrical resistance value of the wire 60.

$$(1/\delta_{20}) \times \{L_{20}/(T_{20} \times W_{20})\} \geq (1/\delta_{60}) \times \{L_{60}/(T_{60} \times W_{60})\} \quad \text{Formula (2)}$$

In formula (2), electrical conductivity $\delta_{20}$ is the electrical conductivity of the thermoelectric conversion element 20. Electrical conductivity $\delta_{60}$ is the electrical conductivity of the wire 60.

As can be seen from the preceding formulae (1) and (2), an electrical resistance value of the wire 60 can increase as a thermal resistance value of the wire 60 increases. In other words, an electrical resistance value of the overall thermoelectric conversion module 1 can increase due to electrical resistance values of the wires 61 to 63 increasing as thermal resistance values of the wires 61 to 63 increase. The total electrical resistance value of the wires 61 to 63 may be set such as to be approximately 10% of the electrical resistance value of the overall thermoelectric conversion module 1. Through a configuration such as set forth above, even when electrical resistance values of the wires 61 to 63 increase as a result of thermal resistance values of the wires 61 to 63 being increased, the total electrical resistance value of the wires 61 to 63 can be of a level similar to design error of the electrical resistance value of the overall thermoelectric conversion module 1.

Examples of settings satisfying formula (1) and formula (2) can be summarized as in the table presented in FIG. 5. In the table presented in FIG. 5, the thermal conductivity $\kappa_{20}$ of the thermoelectric conversion element 20 is 15 W/mK and the electrical conductivity $\delta_{20}$ of the thermoelectric conversion element 20 is 900 S/cm. Moreover, the length $L_{20}$, the width $W_{20}$, and the thickness $T_{20}$ of the thermoelectric conversion element 20 are 15 mm, 1.5 mm, and 50 μm, respectively. A thermal resistance value of a thermoelectric conversion element 20 having such a configuration is 13.3 K/W. Moreover, an electrical resistance value of this thermoelectric conversion element 20 is 2.222Ω.

In Example 1, the material of the wire 60 is copper. In a case in which the material of the wire 60 is copper, the thermal conductivity $\kappa_{60}$ of the wire 60 is 400 W/mK and the electrical conductivity $\delta_{60}$ of the wire 60 is 6×10⁷ S/cm. The length $L_{60}$, the width $W_{60}$, and the thickness $T_{60}$ of the wire 60 in Example 1 are set as 16 mm, 0.15 mm, and 15 μm, respectively. A thermal resistance value of a wire 60 having such a configuration is 17.8 K/W. The thermal resistance value (17.8 K/W) of this wire 60 is larger than the thermal resistance value (13.3 K/W) of the thermoelectric conversion element 20. Moreover, an electrical resistance value of the wire 60 is 0.001Ω. The electrical resistance value (0.001Ω) of the wire 60 is smaller than the electrical resistance value (2.222Ω) of the thermoelectric conversion element 20.

In Example 2, the material of the wire 60 is copper in the same manner as in Example 1. The length $L_{60}$, the width $W_{60}$, and the thickness $T_{60}$ of the wire 60 in Example 2 are set as 16 mm, 0.15 mm, and 20 μm, respectively. A thermal resistance value of a wire 60 having such a configuration is 13.3 K/W. The thermal resistance value (13.3 K/W) of this wire 60 is as same as to the thermal resistance value (13.3 K/W) of the thermoelectric conversion element 20. Moreover, an electrical resistance value of the wire 60 is 0.001Ω. The electrical resistance value (0.001Ω) of the wire 60 is smaller than the electrical resistance value (2.222Ω) of the thermoelectric conversion element 20.

In this manner, a thermal resistance value of the wires 60 is not less than a thermal resistance value of the thermoelectric conversion elements 20 in the thermoelectric conversion module 1. Such a configuration makes it possible to suppress reduction of a temperature difference between the first ends 20H and the second ends 20L in the thermoelectric conversion elements 20 as previously described. By suppressing reduction of the temperature difference between the first ends 20H and the second ends 20L, it i s possible to suppress reduction of electrical power generated by the thermoelectric conversion elements 20. Consequently, according to the present embodiment, it is possible to provide a thermoelectric conversion module 1 in which reduction of generated electrical power is suppressed.

(Method of Producing Thermoelectric Conversion Module)

FIG. 6 is a flowchart illustrating flow of a method of producing the thermoelectric conversion module 1 illustrated in FIG. 1. As illustrated in FIG. 6, the method of producing the thermoelectric conversion module 1 according to the present embodiment includes an arrangement step S10, formation steps S11, S12, S13, and S14, and a connection step S15 that are described below. However, the method by which the thermoelectric conversion module 1 according to the present embodiment is produced is not limited to the production method described below.

<Arrangement Step S10>

Figure 7:
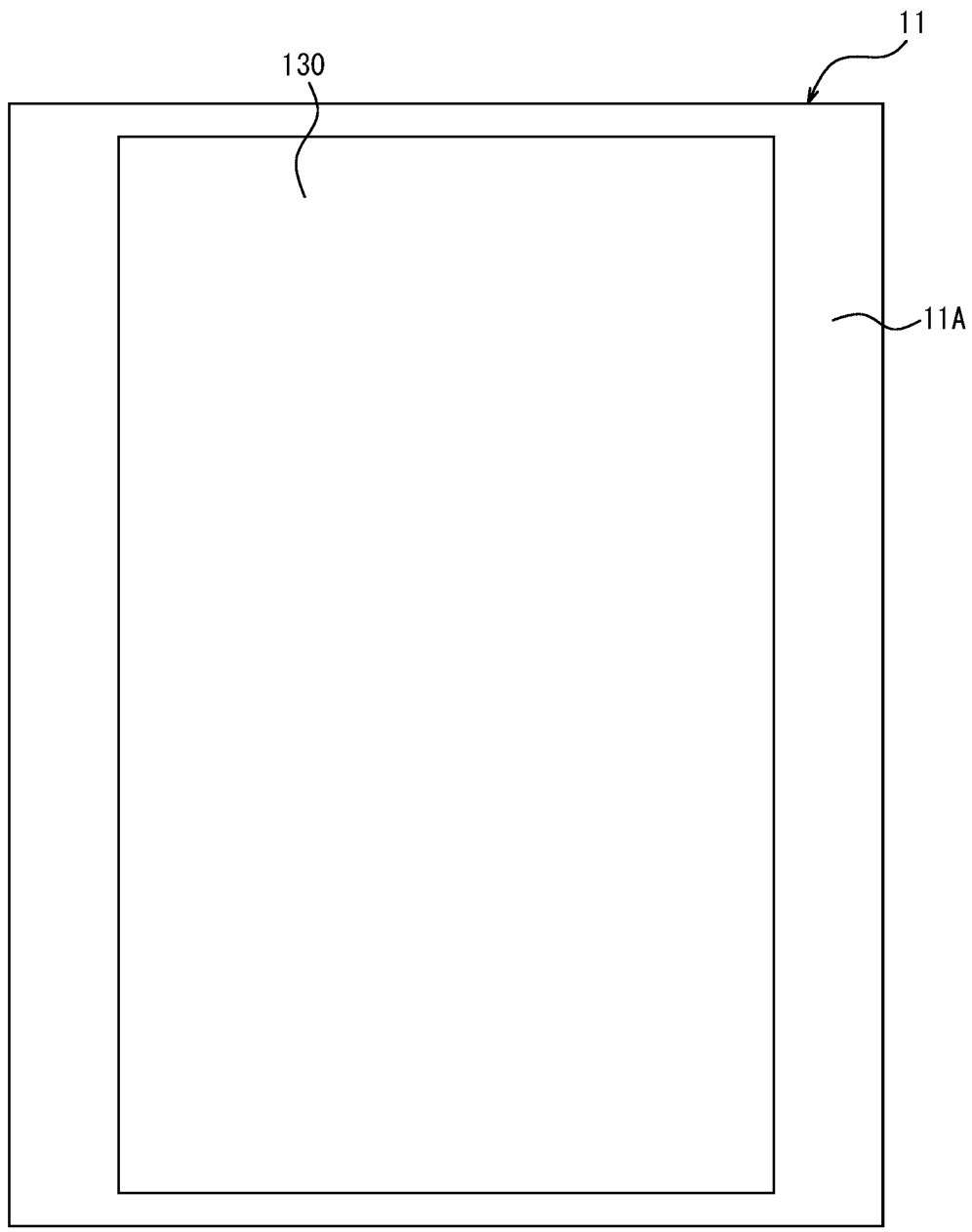
FIG. 7 illustrates configuration after an arrangement step of metal foil is performed.
Figure 7:
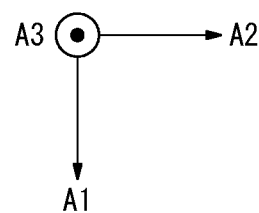

The arrangement step S10 is a step of arranging metal foil 130 on a substrate 11 as illustrated in FIG. 7. The metal foil 130 may be arranged at a front surface 11A of the substrate 11. The metal foil 130 may be adhered to the front surface 11A of the substrate 11 through any adhesive that has thermal conductivity. The metal foil 130 can constitute a wiring layer 30 after undergoing the formation step S11 and the like described below. The metal foil 130 may be any metal foil such as copper or aluminum.

<Formation Step S11>

The formation step S11 (wiring layer formation step) is a step of forming a wiring layer 30 above the front surface 11A of the substrate 11 as illustrated in FIG. 3 through patterning of the metal foil 130. Commonly known photolithography or the like may be used in patterning of the metal foil 130.

<Formation Step S12>

Figure 8:
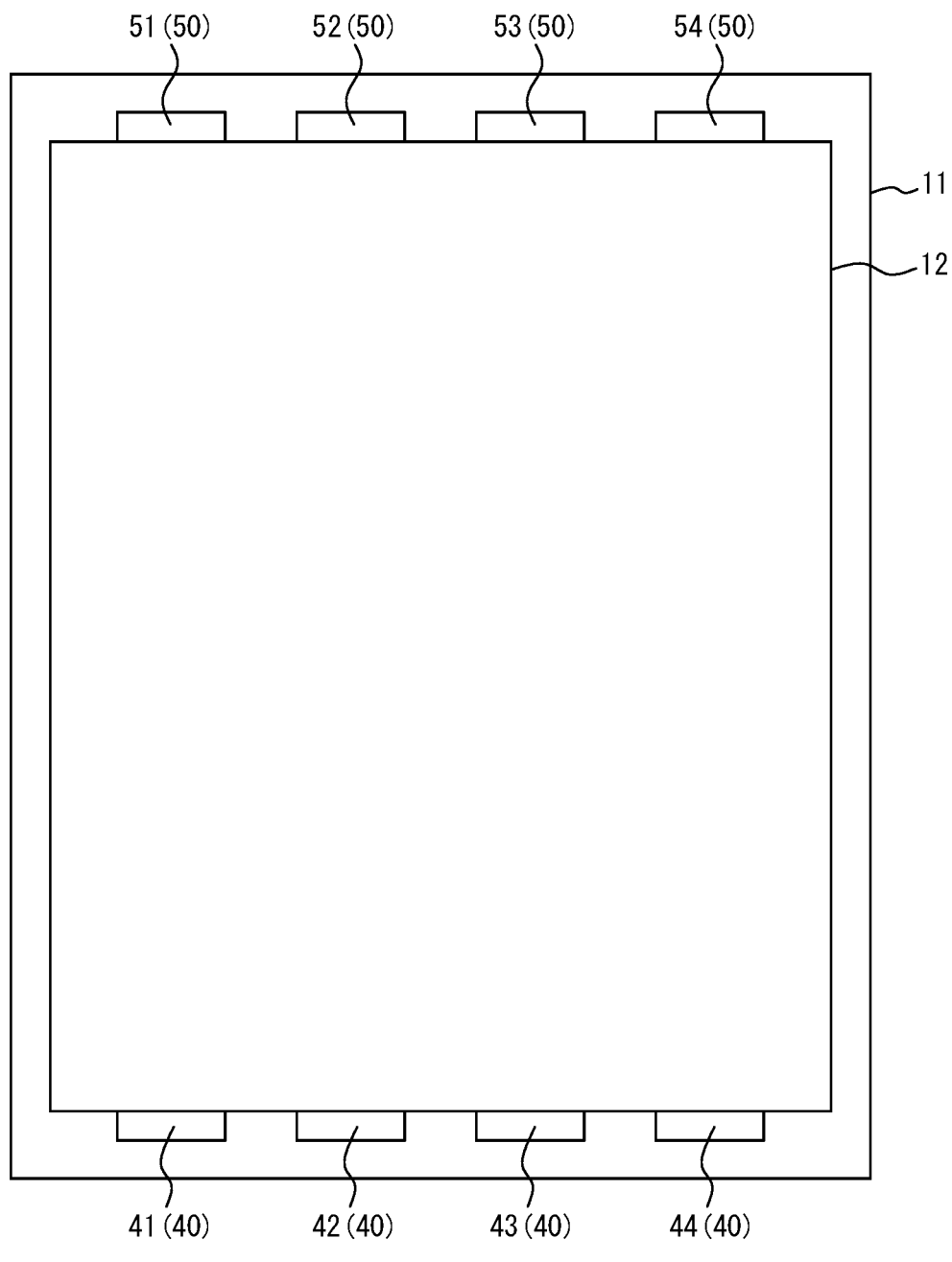
FIG. 8 illustrates configuration after a formation step of an insulating layer is performed.
Figure 8:
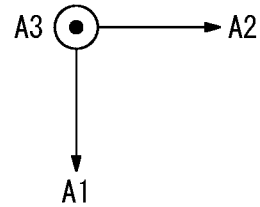

The formation step S12 (insulating layer formation step) is a step of forming an insulating layer 12 above the substrate 11 and the wiring layer 30 as illustrated in FIG. 8. The insulating layer 12 may be formed in the formation step S12 by applying an electrically insulating material above the substrate 11 and the wiring layer 30 such as illustrated in FIG. 3. In the formation step S12, the insulating layer 12 is formed above the substrate 11 and the wiring layer 30 such that first electrodes 40 and second electrodes 50 are exposed as illustrated in FIG. 8. The first electrodes 40 and the second electrodes 50 can also be said to be both ends of wires 60. In other words, the formation step S12 can also be said to be a step of forming an insulating layer 12 above the substrate 11 and the wiring layer 30 such that only both ends of wires 60 are exposed from the insulating layer 12. A sheet substrate 10 is formed as a result of the insulating layer 12 being formed at the front surface 11A of the substrate 11. In other words, the sheet substrate 10 includes the substrate 11 and the insulating layer 12 formed at the front surface 11A of the substrate 11.

<Formation Step S13>

The formation step S13 (element formation step) is a step of forming a thermoelectric conversion element layer above the insulating layer 12. The thermoelectric conversion element layer is a layer that contains CNTs. The thermoelectric conversion element layer can constitute thermoelectric conversion elements 20 after undergoing the formation step S16 and the like described below. As previously described, the use of CNTs in the thermoelectric conversion material for forming the thermoelectric conversion elements 20 can further improve mechanical strength of the thermoelectric conversion module 1 and enables weight reduction. As a result of the thermoelectric conversion element layer containing CNTs, mechanical strength further improves, and a light-weight thermoelectric conversion module 1 can be produced.

Figure 9:
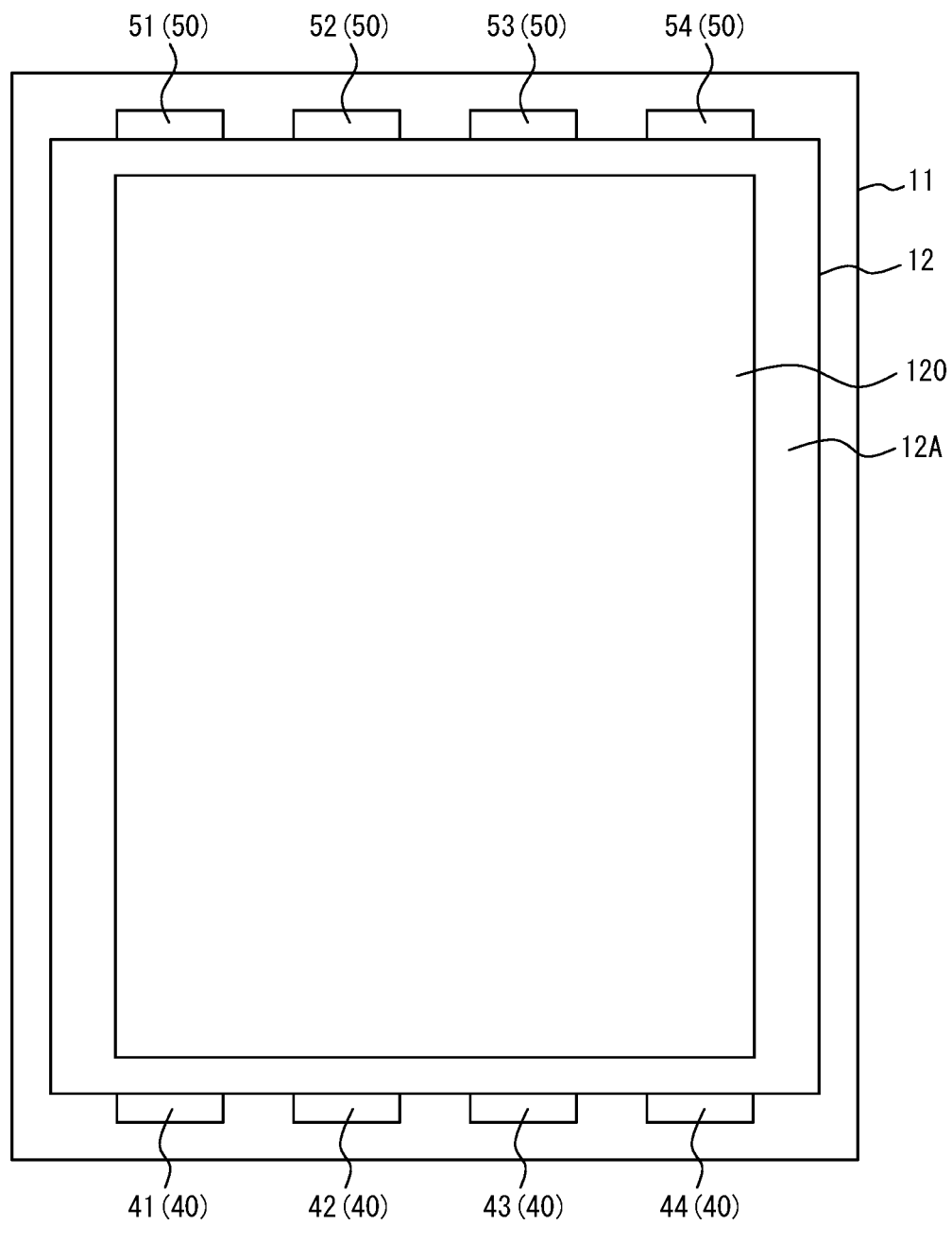
FIG. 9 illustrates configuration after arrangement of a carbon nanotube sheet.

In the present embodiment, the thermoelectric conversion element layer is taken to be a CNT sheet 120 (carbon nanotube sheet) such as illustrated in FIG. 9. The CNT sheet 120 contains CNTs. In the present embodiment, the formation step S13 is a step of arranging the CNT sheet 120 on the insulating layer 12. The CNT sheet 120 may be arranged at a front surface 12A of the insulating layer 12 (i.e., the front surface 10A of the sheet substrate 10), for example. The CNT sheet 120 may be adhered to the front surface 12A of the insulating layer 12 through any adhesive sheet such as epoxy resin.

The CNT sheet 120 can constitute thermoelectric conversion elements 20 after undergoing the formation step S14 and the like described below. In a case in which the thermoelectric conversion elements 20 are to be formed as p-type thermoelectric conversion elements, a p-type CNT sheet 120 may be used. In a case in which the thermoelectric conversion elements 20 are to be formed as n-type thermoelectric conversion elements, an n-type CNT sheet 120 may be used. The thickness of the CNT sheet 120 in the third direction A3 may be approximately 50 μm. A thickness of approximately 50 μm for the CNT sheet 120 makes it possible for electrical characteristics of the thermoelectric conversion elements 20 to be displayed. For example, the amount of electricity generated by the thermoelectric conversion elements 20, as an electrical characteristic of the thermoelectric conversion elements 20, can be ensured to a certain extent.

Note that in the formation step S13, a CNT coating film formed by an application method using a CNT dispersion liquid may be arranged on the insulating layer 12 instead of the CNT sheet 120. However, a CNT coating film suffers from a problem that CNTs aggregate during a process of drying the CNT dispersion liquid, resulting in reduction of electrical conductivity of the CNT coating film and reduction of free-standing ability of the CNT coating film. Moreover, in order to produce a CNT coating film of 50 μm in thickness by an application method, it is desirable to add a binder to the CNT dispersion liquid. However, adding a binder to the CNT dispersion liquid ultimately results in a problem of reduction of electrical conductivity of the CNT coating film. Such problems can be solved by using a CNT sheet 120 in the formation step S13.

The CNT sheet 120 can be any of those described in Japanese Patent Application No. 2018-065290, but is not specifically limited thereto. The CNT sheet 120 may contain bundles in which a plurality of single-walled CNTs are entangled. The thickness of these bundles may be 1 μm or less. Through the thickness of the bundles being 1 μm or less, it is possible to reduce fuzzing of a cut surface of a thermoelectric conversion element 20 caused by a laser in the subsequently described formation step S14. By reducing fuzzing of thermoelectric conversion elements 20, it is possible to inhibit the occurrence of a short-circuit caused by fuzzing of the thermoelectric conversion elements 20.

Depending on the state of the CNT sheet 120, a sheet serving as a cover may be arranged on the CNT sheet 120 or a resin material may be applied onto the CNT sheet 120 in the formation step S13 in order to reduce damage caused by a laser in the subsequently described formation step S14.

<Formation Step S14>

Figure 10:
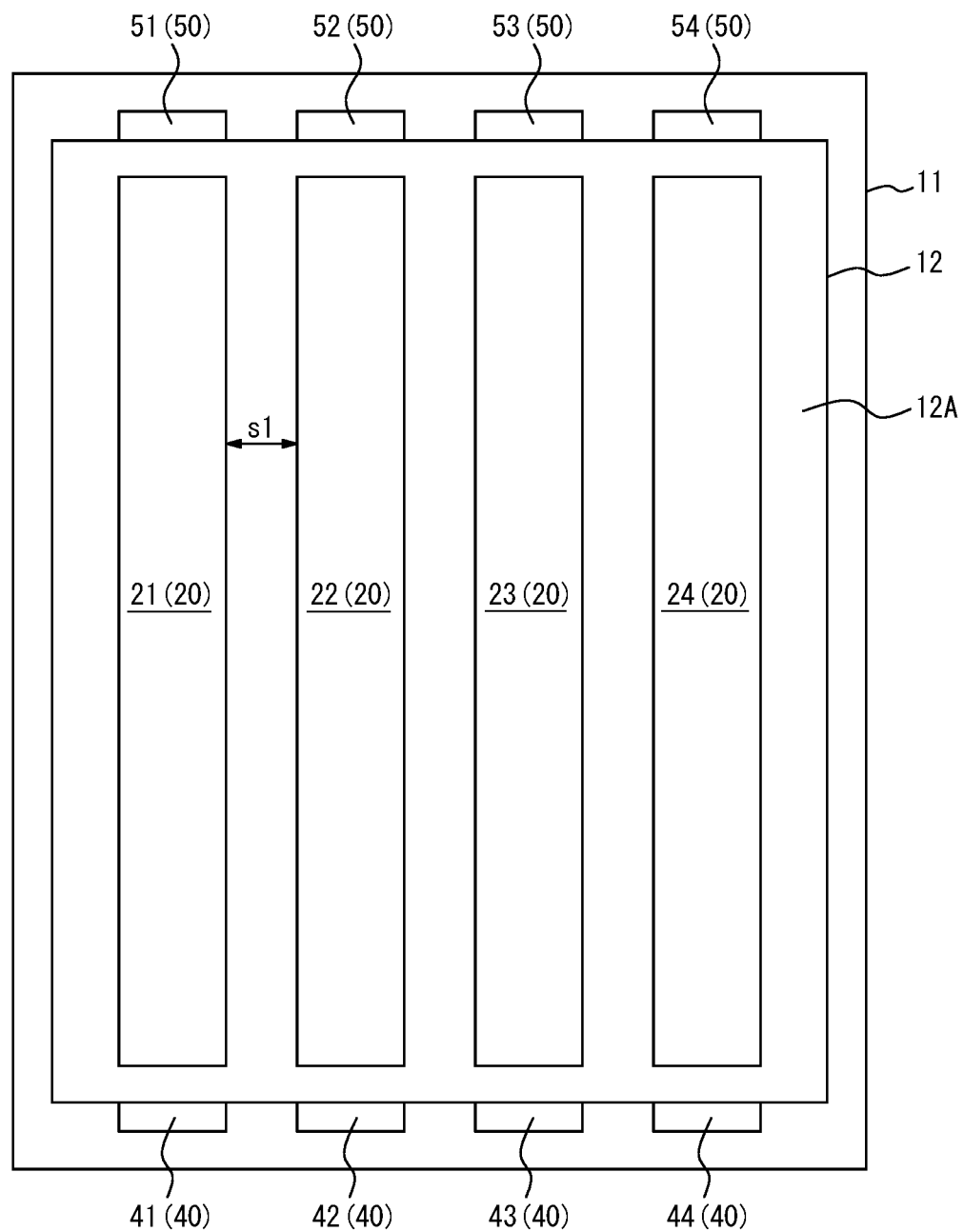
FIG. 10 illustrates configuration after cutting of the carbon nanotube sheet.

The formation step S14 (thermoelectric conversion element formation step) is a step of cutting the thermoelectric conversion element layer (i.e., the CNT sheet 120) along the first direction A1 to form a plurality of thermoelectric conversion elements 20 lined up in the first direction A1. Cutting of the CNT sheet 120 along the first direction A1 forms gaps s1 such as illustrated in FIG. 10. These gaps s1 make it possible to partition two thermoelectric conversion elements 20 that are adjacent to each other in the second direction A2.

The formation step S14 may be performed using a laser. In the formation step S14, the CNT sheet 120 may be cut along the first direction A1 by the laser. The CNT sheet 120 may be irradiated with the laser from a side corresponding to the third direction A3. Cutting of the CNT sheet 120 along the first direction A1 by the laser makes it possible to form gaps s1 such as illustrated in FIG. 10.

In the formation step S14, the CNT sheet 120 may be cut along the first direction A1 by a UV (UltraViolet) laser, a nanosecond laser, or a femtosecond laser. However, the laser used in the formation step S14 is not limited to these lasers. Any laser that enables cutting of just the CNT sheet 120 may be used in the formation step S14. For example, in a case in which a UV laser having a power of 5 W is used, the UV laser may be scanned along the first direction A1 about 10 times to several 10 s of times at sites corresponding to gaps s1 in the CNT sheet 120.

The thermal conductivity of the CNT sheet 120 in an in-plane direction can be approximately 100 times the thermal conductivity of the CNT sheet 120 in a thickness direction. For example, the thermal conductivity of the CNT sheet 120 in the second direction A2 can be approximately 100 times the thermal conductivity of the CNT sheet 120 in the third direction A3. For this reason, in a case in which a heating laser such as a YAG (Yttrium Aluminum Garnet) laser is used in the formation step S14, the gaps s1 may widen in the second direction A2 as the CNT sheet 120 is cut along the first direction A1 by the heating laser. In a case in which the thickness of the CNT sheet 120 in the third direction A3 is approximately 50 μm, the use of a heating laser in the formation step S14 may result in widening of the gaps s1 by approximately 5 mm in the second direction A2.

In contrast, generation of heat due to the laser can be reduced by using a laser such as a UV laser, a nanosecond laser, or a femtosecond laser in the formation step S14. By reducing heat generation due to the laser in the formation step S14, widening of the gaps s1 in the second direction A2 can be suppressed. Suppressing widening of the gaps s1 in the second direction A2 makes it possible to increase the density of thermoelectric conversion elements 20 in the thermoelectric conversion module 1. Increasing the density of thermoelectric conversion elements 20 in the thermoelectric conversion module 1 enables compactization of the thermoelectric conversion module 1.

The spot diameter of a UV laser can be smaller than the spot diameter of other lasers. For example, the spot diameter of a UV laser can be approximately 8 μm. Through a UV laser having a smaller spot diameter, it is possible to narrow the focus of the UV laser on the CNT sheet 120. In a case in which a UV laser is used in the formation step S14, narrowing of the focus of the UV laser on the CNT sheet 120 and reduction of heat generation due to the UV laser make it possible to improve processing accuracy in patterning of the CNT sheet 120. For example, the width of the gaps s1 along the second direction A2 can be approximately 0.05 mm to 0.1 mm. By improving processing accuracy in patterning of the CNT sheet 120, the density of thermoelectric conversion elements 20 in the thermoelectric conversion module 1 can be further increased, and the size of the thermoelectric conversion module 1 can be further reduced.

The use of a laser in the formation step S14 makes it possible to perform patterning of the CNT sheet 120 by the laser through computer control. Such a configuration can simplify the formation step S14.

<Connection Step S15>

The connection step S15 is a step of electrically connecting the first electrodes 40 and the second electrodes 50 that are exposed from the insulating layer 12 and both ends (i.e., first ends 20H and second ends 20L) of the plurality of thermoelectric conversion elements 20 such that the plurality of thermoelectric conversion elements 20 are all electrically connected in series. The first electrodes 40 and the second electrodes 50 can also be said to be both ends of wires 60. In other words, the connection step S15 can also be said to be a step of electrically connecting both ends of the wires 60 that are exposed from the insulating layer 12 and both ends of the plurality of thermoelectric conversion elements 20 such that the plurality of thermoelectric conversion elements 20 are all electrically connected in series.

In the present embodiment, the connection step S15 is a step of applying silver paste from the first ends 20H of the thermoelectric conversion elements 20 such as illustrated in FIG. 1 to the first electrodes 40 and applying silver paste from the second ends 20L of the thermoelectric conversion elements 20 to the second electrodes 50.

By applying silver paste from the first ends 20H to the first electrodes 40 in the connection step S15, it is possible to electrically connect the first ends 20H of the thermoelectric conversion elements 20 and the first electrodes 40. This silver paste can constitute first joining members 70 after drying.

By applying silver paste from the second ends 20L to the second electrodes 50 in the connection step S15, it is possible to electrically connect the second ends 20L of the thermoelectric conversion elements 20 and the second electrodes 50. This silver paste can constitute second joining members 80 after drying.

In this manner, the CNT sheet 120 can be cut along the first direction A1 by a UV laser, a nanosecond laser, or a femtosecond laser in the formation step S14 of the method of producing the thermoelectric conversion module 1 according to the present embodiment. A configuration such as set forth above can suppress widening of gaps s1 such as illustrated in FIG. 10 in the second direction A2 as previously described. Suppressing widening of the gaps s1 in the second direction A2 makes it possible to increase the density of thermoelectric conversion elements 20 in the thermoelectric conversion module 1 and reduce the size of the thermoelectric conversion module 1.

Modified Examples of Wires

The configuration by which a thermal resistance value of the wires 60 is not less than a thermal resistance value of the thermoelectric conversion elements 20 is not limited to the configuration described above with reference to FIG. 5.

Figure 11:
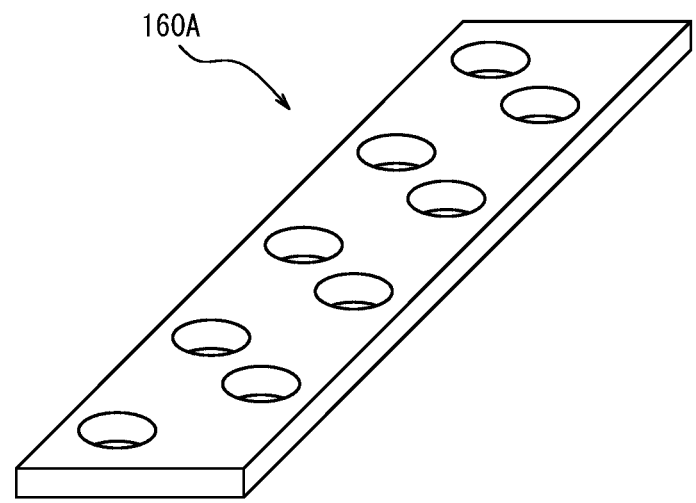
FIG. 11 illustrates a first modified example of wires illustrated in FIG. 3.

For example, a wire 160A such as illustrated in FIG. 11 may be adopted such that a thermal resistance value of the wire 160A is not less than a thermal resistance value of a thermoelectric conversion element 20. The wire 160A includes a plurality of holes 160a. The thermal resistance value of the wire 160A can be higher in a case in which the wire 160A includes holes 160a than in a case in which holes 160a are not included. The number of holes 160a included in the wire 160A may be set as appropriate such that the thermal resistance value of the wire 160A is not less than the thermal resistance value of the thermoelectric conversion element 20. Moreover, the number of holes 160a included in the wire 160A may be set as appropriate such that the thermal resistance value of the wire 160A is not less than the thermal resistance value of the thermoelectric conversion element 20 and such that an electrical resistance value of the wire 160A is not more than an electrical resistance value of the thermoelectric conversion element 20.

Figure 12:
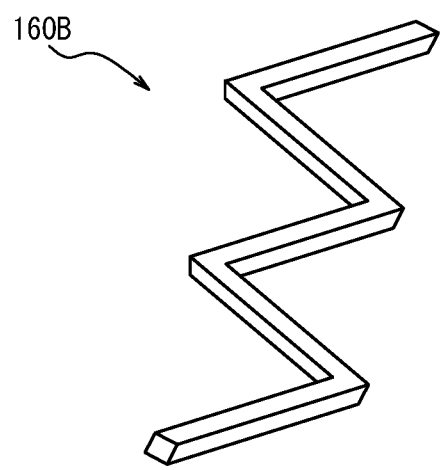
FIG. 12 illustrates a second modified example of wires illustrated in FIG. 3.

A wire 160B such as illustrated in FIG. 12, for example, may be adopted such that a thermal resistance value of the wire 160B is not less than a thermal resistance value of a thermoelectric conversion element 20. The wire 160B extends in a zig-zag shape. As a result of the wire 160B extending in a zig-zag shape, the wire length of the wire 160B can be longer than in a case in which the wire 160B does not extend in a zig-zag shape. Therefore, as a result of the wire 160B extending in a zig-zag shape, the thermal resistance value of the wire 160B can be higher than in a case in which the wire 160B does not extend in a zig-zag shape. The length for which the wire 160B extends in a zig-zag shape may be set as appropriate such that the thermal resistance value of the wire 160B is not less than the thermal resistance value of the thermoelectric conversion element 20. The length for which the wire 160B extends in a zig-zag shape may be set as appropriate such that the thermal resistance value of the wire 160B is not less than the thermal resistance value of the thermoelectric conversion element 20 and such that an electrical resistance value of the wire 160B is not more than an electrical resistance value of the thermoelectric conversion element 20.

Second Embodiment

Figure 13:
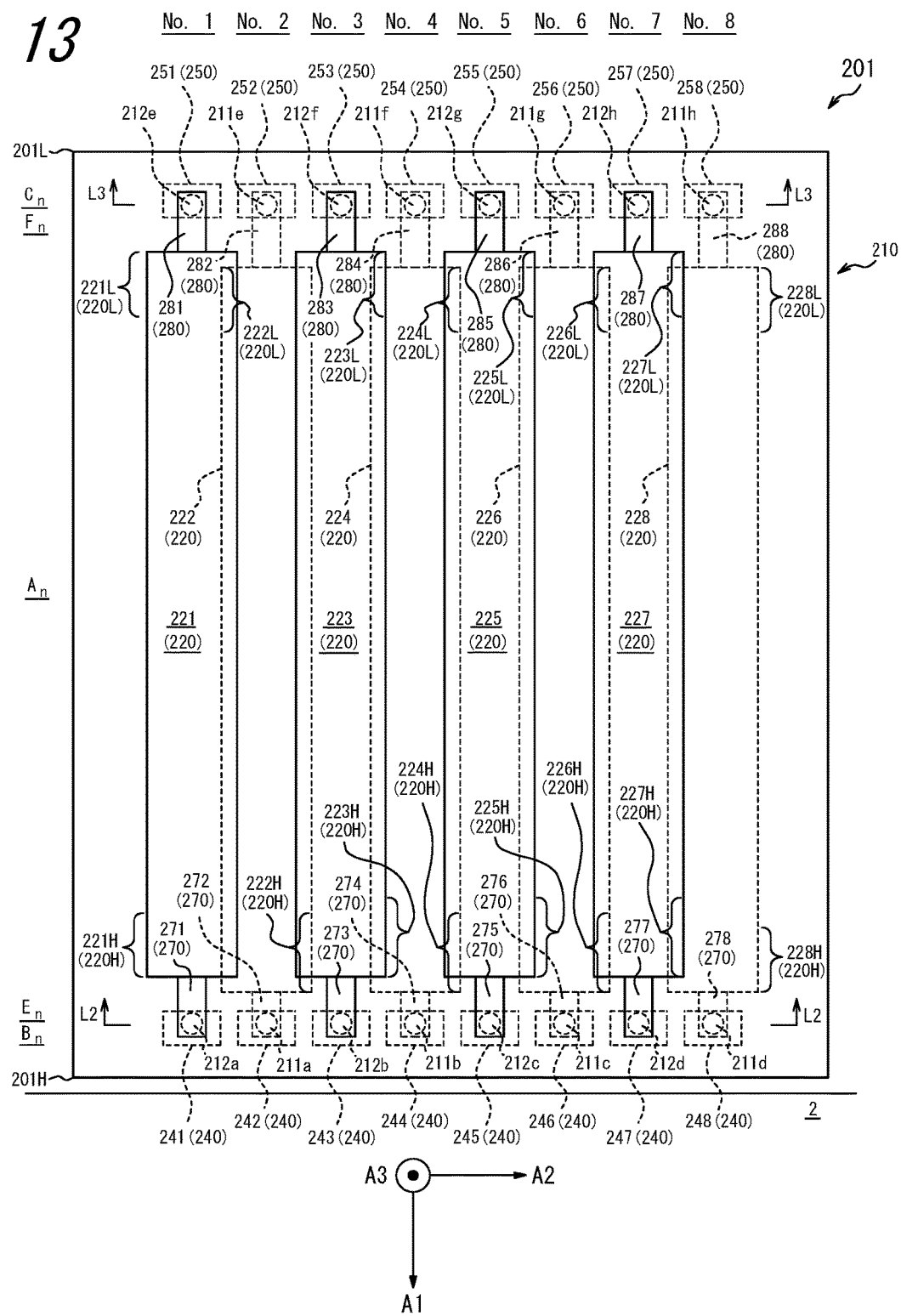
FIG. 13 is an external view of a thermoelectric conversion module according to a second embodiment of the present disclosure.
Figure 14:
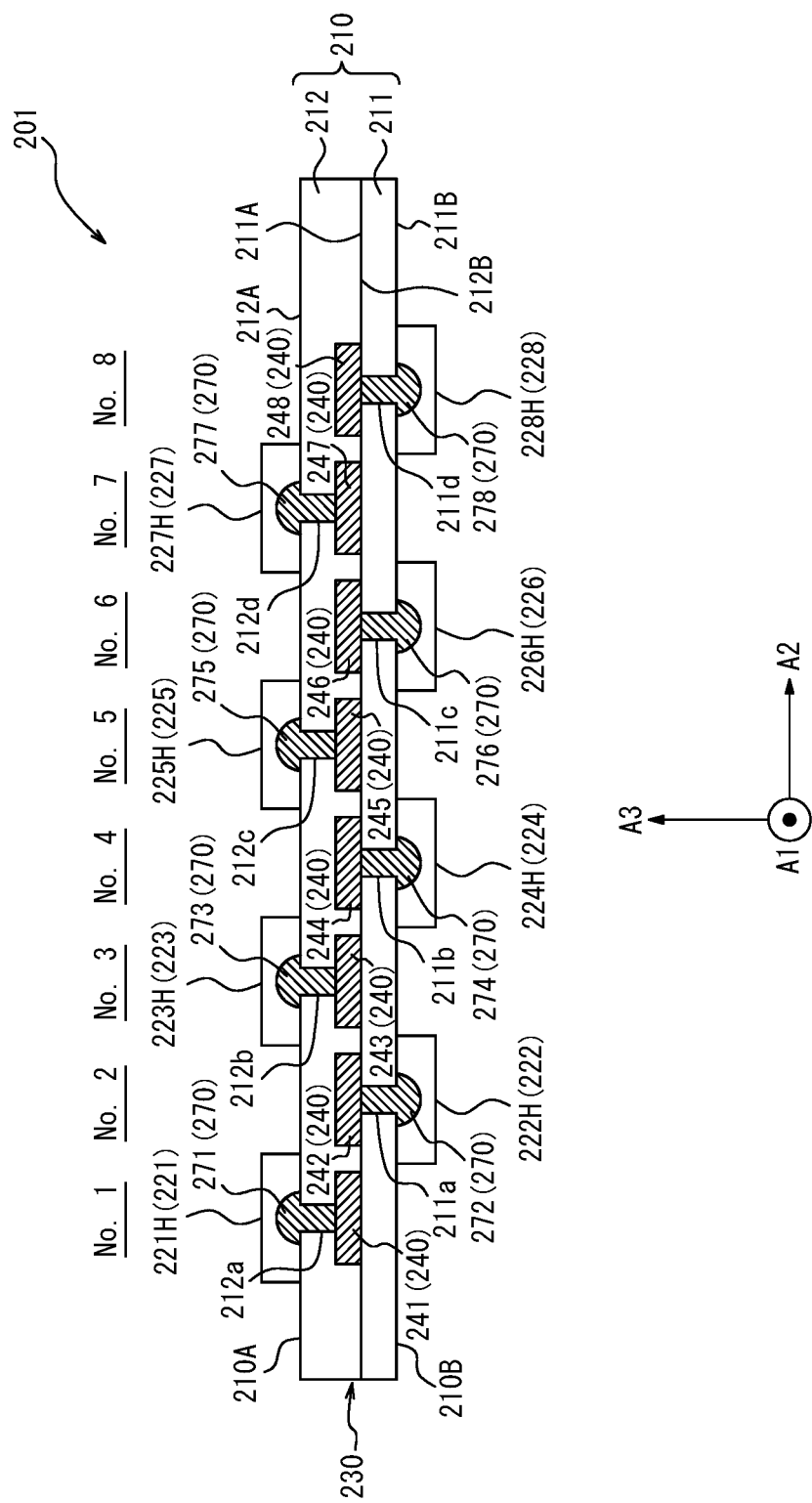
FIG. 14 is a cross-sectional view of the thermoelectric conversion module along a line L2-L2 illustrated in FIG. 13.
Figure 15:
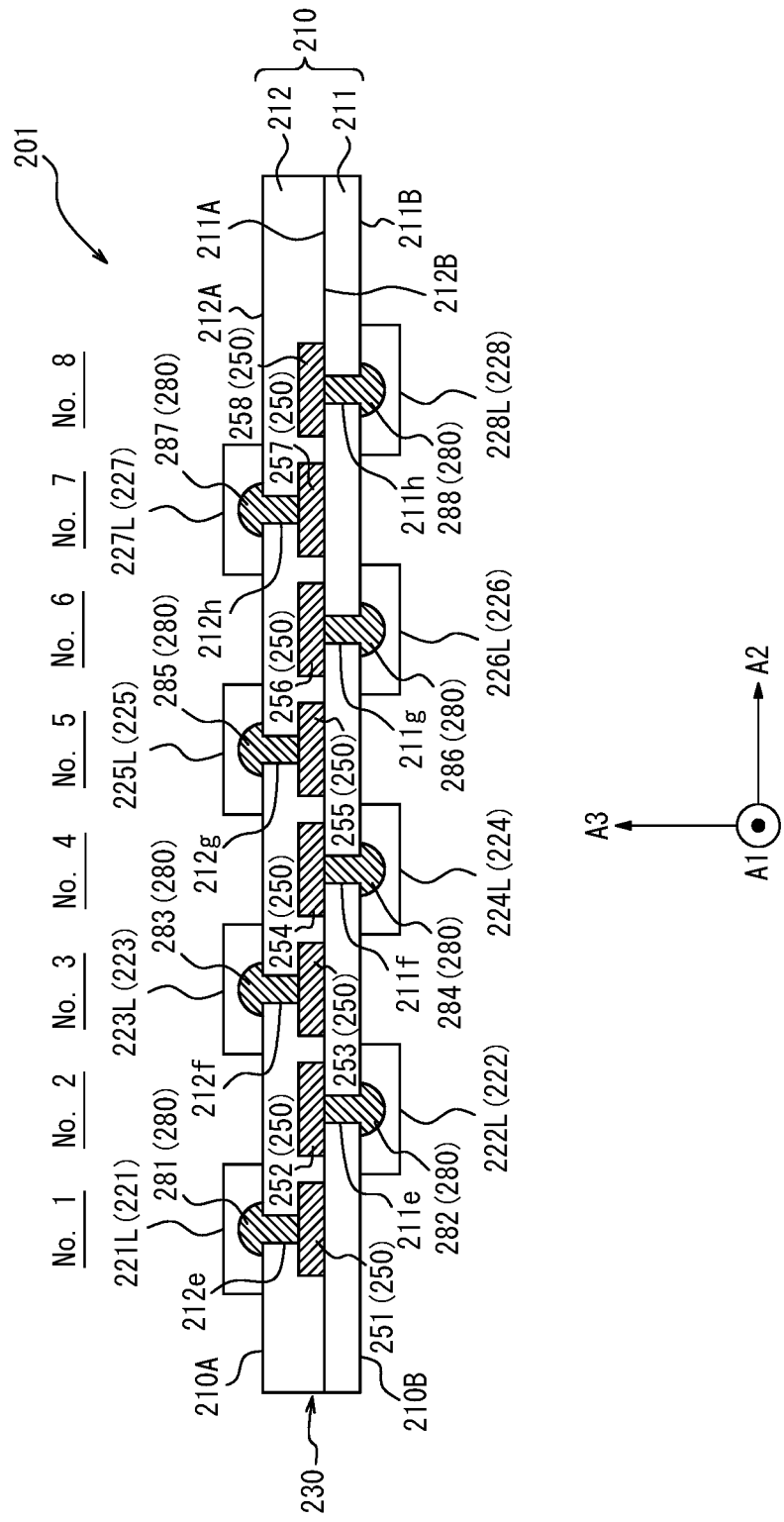
FIG. 15 is a cross-sectional view of the thermoelectric conversion module along a line L3-L3 illustrated in FIG. 13.
Figure 16:
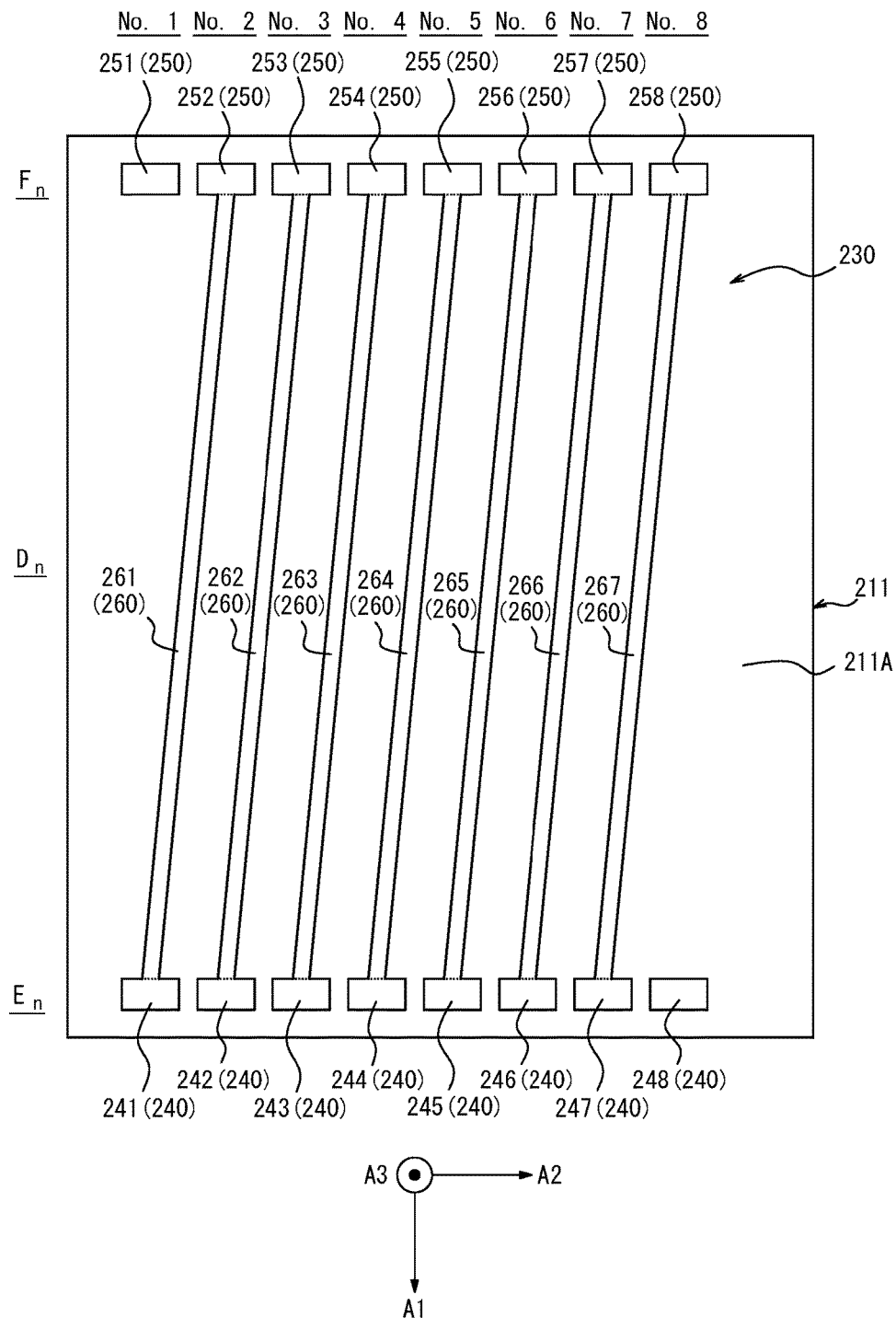
FIG. 16 illustrates a wiring layer illustrated in FIG. 14.
Figure 17:
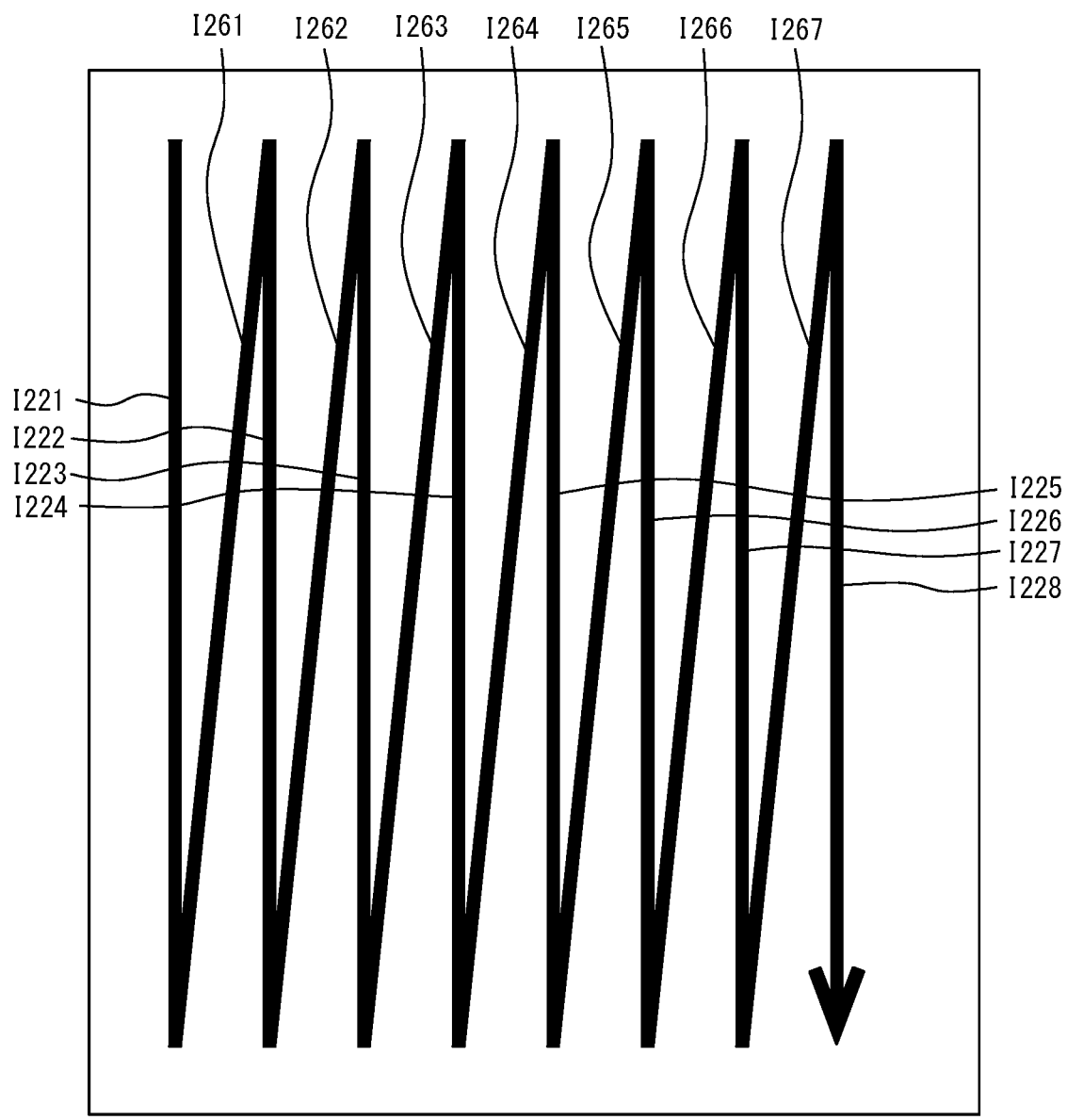
FIG. 17 illustrates a current path in the thermoelectric conversion module illustrated in FIG. 13.
Figure 17:
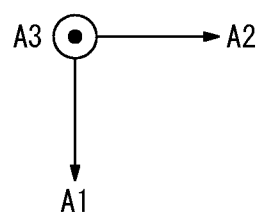
Figure 18:
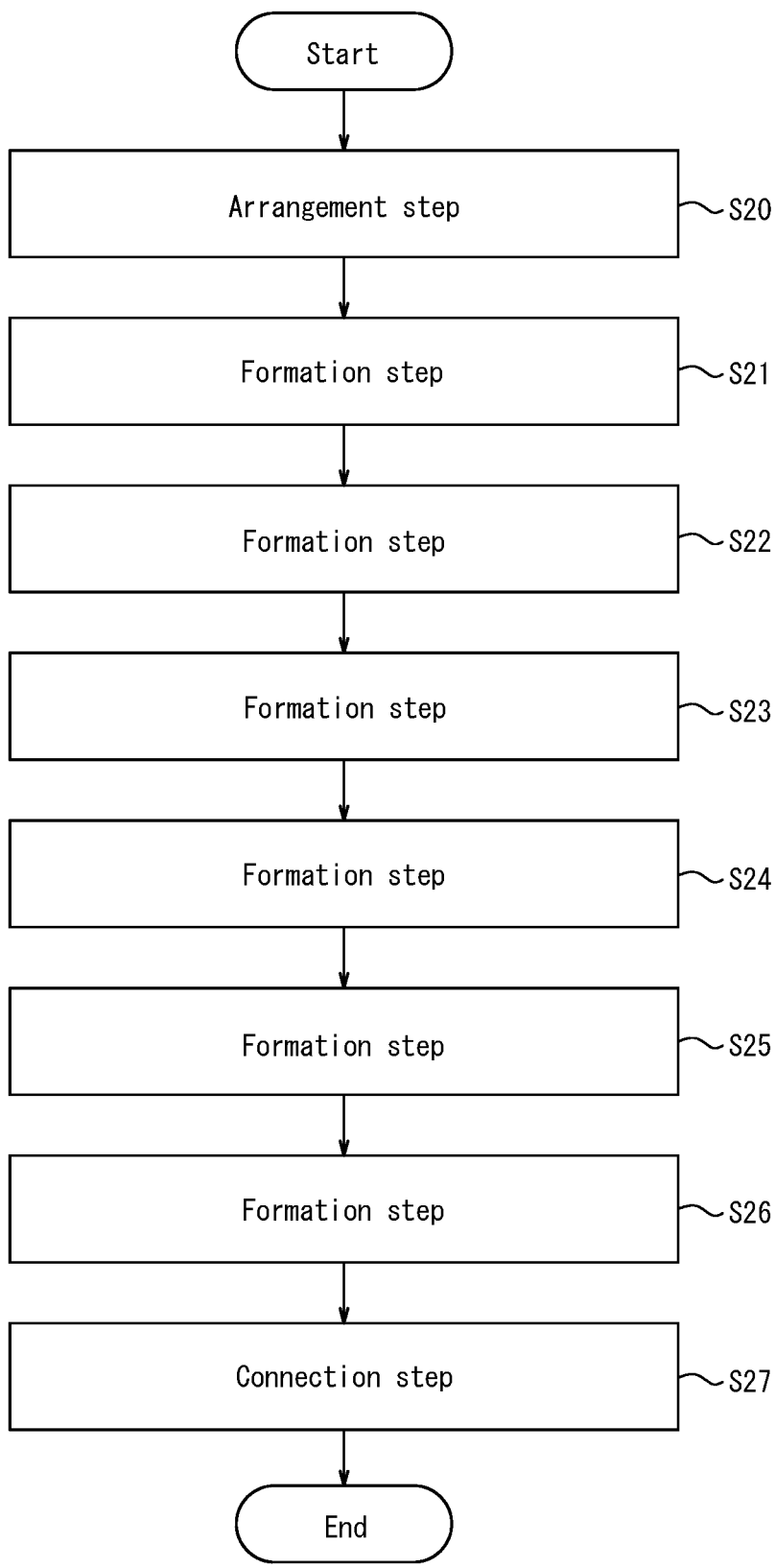
FIG. 18 is a flowchart illustrating flow of a method of producing the thermoelectric conversion module illustrated in FIG. 13.

FIG. 13 is an external view of a thermoelectric conversion module 201 according to a second embodiment of the present disclosure. FIG. 14 is a cross-sectional view of the thermoelectric conversion module 201 along a line L2-L2 illustrated in FIG. 13. FIG. 15 is a cross-sectional view of the thermoelectric conversion module 201 along a line L3-L3 illustrated in FIG. 13. FIG. 16 illustrates a wiring layer 230 that is illustrated in FIG. 14. The configuration illustrated in FIG. 16 corresponds to a configuration after implementation of a formation step of a wiring layer 230 such as illustrated in FIG. 18, which is described further below. FIG. 17 illustrates a current path in the thermoelectric conversion module illustrated in FIG. 13.

The thermoelectric conversion module 201 can be arranged at a heat source 2 in the same manner as in the first embodiment. The thermoelectric conversion module 201 has a first edge 201H and a second edge 201L on a sheet substrate 210, which is described further below. The first edge 201H and the second edge 201L are opposite to each other. The first edge 201H can be located close to the heat source 2 when the thermoelectric conversion module 201 is arranged at the heat source 2 in the same manner as the first edge 1H such as illustrated in FIG. 1. The second edge 201L can be located far from the heat source 2 when the thermoelectric conversion module 201 is arranged at the heat source 2 in the same manner as the second edge 1L such as illustrated in FIG. 1.

The temperature around the first edge 201H can be higher than the temperature around the second edge 201L in the same manner as for the first edge 1H such as illustrated in FIG. 1. In other words, the temperature around the second edge 201L can be lower than the temperature around the first edge 201H.

The first direction A1, the second direction A2, and the third direction A3 can be adopted in the second embodiment in the same manner as in the first embodiment. In the second embodiment, the first direction A1 is a direction in which the first edge 201H and the second edge 201L are opposite to each other. The first direction A1 is defined as a direction toward the first edge 201H from the second edge 201L. Moreover, in the present embodiment, the third direction A3 is defined as a direction toward the foreground of the page from the background of the page in FIG. 13.

As illustrated in FIG. 13, the shape of the thermoelectric conversion module 201 as viewed from the third direction A3 is a quadrilateral shape such as a rectangular shape. The thermoelectric conversion module 201 includes the sheet substrate 210, thermoelectric conversion elements 221, 222, 223, 224, 225, 226, 227, and 228, a wiring layer 230, first joining members 271, 272, 273, 274, 275, 276, 277, and 278, and second joining members 281, 282, 283, 284, 285, 286, 287, and 288 as illustrated in FIG. 13 and FIG. 14. The wiring layer 230 is located in the sheet substrate 210 as illustrated in FIG. 14. The wiring layer 230 may be located at a side corresponding to a rear surface 212B of an insulating layer 212 that is described further below. As illustrated in FIG. 16, the wiring layer 230 includes first electrodes 241, 242, 243, 244, 245, 246, 247, and 248, second electrodes 251, 252, 253, 254, 255, 256, 257, and 258, and wires 261, 262, 263, 264, 265, 266, and 267.

In the following description, the thermoelectric conversion elements 221 to 228 are also referred to collectively as "thermoelectric conversion elements 220" when no specific distinction is made therebetween. FIG. 13 illustrates a thermoelectric conversion module 201 that includes 8 thermoelectric conversion elements 220. However, the number of thermoelectric conversion elements 220 included in the thermoelectric conversion module 201 may be any number.

In the following description, the first electrodes 241 to 248 are also referred to collectively as "first electrodes 240" when no specific distinction is made therebetween. Moreover, the second electrodes 251 to 258 are also referred to collectively as "second electrodes 250" when no specific distinction is made therebetween. Furthermore, the wires 261 to 267 are also referred to collectively as "wires 260" when no specific distinction is made therebetween. FIG. 16 illustrates a wiring layer 230 that includes 8 first electrodes 240, 8 second electrodes 250, and 7 wires 260. However, the number of first electrodes 240, the number of second electrodes 250, and the number of wires 260 included in the wiring layer 230 may be numbers in accordance with the number of thermoelectric conversion elements 220 included in the thermoelectric conversion module 201.

In the following description, the first joining members 271 to 278 are also referred to collectively as "first joining members 270" when no specific distinction is made therebetween. Moreover, the second joining members 281 to 288 are also referred to collectively as "second joining members 280" when no specific distinction is made therebetween. FIG. 13 illustrates a thermoelectric conversion module 201 that includes 8 first joining members 270 and 8 second joining members 280. However, the number of first joining members 270 and the number of second joining members 280 included in the thermoelectric conversion module 201 may be numbers in accordance with the number of thermoelectric conversion elements 220 included in the thermoelectric conversion module 201.

In the following description, numbers allotted along the second direction A2 to the plurality of thermoelectric conversion elements 220 included in the thermoelectric conversion module 201 are also referred to as "number $A_n$," (n is an integer) in the same manner as in the first embodiment. A minimum value (n=1) for the number $A_n$ is taken to be 1. The number $A_n$ increases one by one along the second direction A2. Numbers $A_n$ for the thermoelectric conversion elements 221, 222, 223, 224, 225, 226, 227, and 228 are No. 1, No. 2, No. 3, No. 4, No. 5, No. 6, No. 7, and No. 8, respectively.

In the following description, numbers allotted along the second direction A2 to the plurality of first electrodes 240 included in the wiring layer 230 are also referred to as "number Be" (n is an integer) in the same manner as in the first embodiment. A minimum value (n=1) for the number $B_n$ is taken to be 1. The number $B_n$ increases one by one along the second direction A2. Numbers $B_n$ allotted along the second direction A2 to the first electrodes 241, 242, 243, 244, 245, 246, 247, and 248 are No. 1, No. 2, No. 3, No. 4, No. 5, No. 6, No. 7, and No. 8, respectively.

In the following description, numbers allotted along the second direction A2 to the plurality of second electrodes 250 included in the wiring layer 230 are also referred to as "number $C_n$," (n is an integer) in the same manner as in the first embodiment. A minimum value (n=1) for the number $C_n$ is taken to be 1. The number Cn increases one by one along the second direction A2. Numbers $C_n$ allotted along the second direction A2 to the second electrodes 251, 252, 253, 254, 255, 256, 257, and 258 are No. 1, No. 2, No. 3, No. 4, No. 5, No. 6, No. 7, and No. 8, respectively.

In the following description, numbers allotted along the second direction A2 to the plurality of wires 260 included in the wiring layer 230 are also referred to as "number Do" (n is an integer) in the same manner as in the first embodiment. A minimum value (n=1) for the number $D_n$ is taken to be 1. The number $D_n$ increases one by one along the second direction A2. Numbers $D_n$ allotted along the second direction A2 to the wires 261, 262, 263, 264, 265, 266, and 267 are No. 1, No. 2, No. 3, No. 4, No. 5, No. 6, and No. 7, respectively.

In the following description, numbers allotted along the second direction A2 to the plurality of first joining members 270 included in the thermoelectric conversion module 201 are also referred to as "number $E_n$," (n is an integer) in the same manner as in the first embodiment. A minimum value (n=1) for the number $E_n$ is taken to be 1. The number $E_n$ increases one by one along the second direction A2. Numbers $E_n$ for the first joining members 271, 272, 273, 274, 275, 276, 277, and 278 are No. 1, No. 2, No. 3, No. 4, No. 5, No. 6, No. 7, and No. 8, respectively.

In the following description, numbers allotted along the second direction A2 to the plurality of second joining members 280 included in the thermoelectric conversion module 201 are also referred to as "number $F_n$" (n is an integer) in the same manner as in the first embodiment. A minimum value (n=1) for the number $F_n$ is taken to be 1. The number $F_n$ increases one by one along the second direction A2. Numbers $F_n$ for the second joining members 281, 282, 283, 284, 285, 286, 287, and 288 are No. 1, No. 2, No. 3, No. 4, No. 5, No. 6, No. 7, and No. 8, respectively.

The sheet substrate 210 is electrically insulating. The sheet substrate 210 may be flexible. The material for forming the sheet substrate 210 can be any electrically insulating material without any specific limitations. The shape of the sheet substrate 210 as viewed from the third direction A3 is a quadrilateral shape such as a rectangular shape. The sheet substrate 210 has a first edge 201H and a second edge 201L. The sheet substrate 210 may be parallel to a plane including the first direction A1 and the second direction A2.

As illustrated in FIG. 14, the sheet substrate 210 has a front surface 210A and a rear surface 210B. The front surface 210A and the rear surface 210B are opposite to each other. The front surface 210A is a surface that faces in the third direction A3 among surfaces of the sheet substrate 210. The rear surface 210B is a surface that faces in an opposite direction to the third direction A3 among surfaces of the sheet substrate 210.

As illustrated in FIG. 14, the sheet substrate 210 includes a substrate 211 and an insulating layer 212.

The substrate 211 is electrically insulating. The substrate 211 may be flexible. The material of the substrate 211 may be the same as the material of the substrate 11 such as illustrated in FIG. 2. The shape of the substrate 211 as viewed from the third direction A3 is a quadrilateral shape such as a rectangular shape. The substrate 211 may be parallel to a plane including the first direction A1 and the second direction A2.

The substrate 211 has a front surface 211A and a rear surface 211B. The front surface 211A and the rear surface 211B are opposite to each other. The front surface 211A is a surface that faces in the third direction A3 among surfaces of the substrate 211. The rear surface 211B is a surface that faces in an opposite direction to the third direction A3 among surfaces of the substrate 211. The rear surface 211B may correspond to the rear surface 210B of the sheet substrate 210.

As illustrated in FIG. 14, the substrate 211 includes openings 211a, 211b, 211c, and 211d. Locations of the openings 211a to 211d as viewed from the third direction A3 may correspond to locations of the first electrodes 242, 244, 246, and 248 as illustrated in FIG. 13. As illustrated in FIG. 15, the substrate 211 includes openings 211e, 211f, 211g, and 211h. Locations of the openings 211e to 211h as viewed from the third direction A3 may correspond to locations of the second electrodes 252, 254, 256, and 258 as illustrated in FIG. 13. The shape of the openings 211a to 211h as viewed from the third direction A3 is a circular shape. However, the shape of the openings 211a to 211h may be any shape.

The insulating layer 212 is electrically insulating. The insulating layer 212 may be flexible. The material of the insulating layer 212 may be the same as the material of the insulating layer 12 such as illustrated in FIG. 2. The shape of the i insulating layer 212 as viewed from the third direction A3 is a quadrilateral shape such as a rectangular shape. The insulating layer 212 may be parallel to a plane including the first direction A1 and the second direction A2.

The insulating layer 212 has a front surface 212A and a rear surface 212B. The front surface 212A and the rear surface 212B are opposite to each other. The front surface 212A is a surface that faces in the third direction A3 among surfaces of the insulating layer 212. The front surface 212A may correspond to the front surface 210A of the sheet substrate 210. The rear surface 212B is a surface that faces in an opposite direction to the third direction A3 among surfaces of the insulating layer 212.

As illustrated in FIG. 14, the insulating layer 212 includes openings 212a, 212b, 212c, and 212d. Locations of the openings 212a to 212d as viewed from the third direction A3 may correspond to locations of the first electrodes 241, 243, 245, and 247 as illustrated in FIG. 13. As illustrated in FIG. 15, the insulating layer 212 includes openings 212e, 212f, 212g, and 212h. Locations of the openings 212e to 212h as viewed from the third direction A3 may correspond to locations of the second electrodes 251, 253, 255, and 257 as illustrated in FIG. 13. The shape of the openings 212a to 212h as viewed from the third direction A3 is a circular shape. However, the shape of the openings 212a to 212h may be any shape.

The plurality of thermoelectric conversion elements 221 to 228 are all p-type thermoelectric conversion elements or are all n-type thermoelectric conversion elements. The thermoelectric conversion material for forming the thermoelectric conversion elements 220 can be any of the thermoelectric conversion materials previously described in the first embodiment without any specific limitations. In a case in which the thermoelectric conversion material for forming the thermoelectric conversion elements 220 is an organic material such as CNTs, for example, the thermoelectric conversion elements 221 to 228 may all be p-type thermoelectric conversion elements in the same manner as previously described in the first embodiment. The thermoelectric conversion elements 221 to 228 may all contain CNTs in the same manner as previously described in the first embodiment.

The thermoelectric conversion elements 220 extend along the first direction A1 as illustrated in FIG. 13. The shape of the thermoelectric conversion elements 220 as viewed from the third direction A3 is an elongated shape such as a rectangular shape. A lengthwise direction of the thermoelectric conversion elements 220 is along the first direction A1. The lengthwise direction of the thermoelectric conversion elements 220 may be parallel to the first direction A1. The thermoelectric conversion elements 221 to 228 may each have the same shape. The cross-sectional shape of the thermoelectric conversion elements 220 may be a thin film shape as illustrated in FIG. 14 and FIG. 15.

The plurality of thermoelectric conversion elements 220 are also formed at the rear surface 210B of the sheet substrate 210 in addition to at the front surface 210A of the sheet substrate 210. In the present embodiment, thermoelectric conversion elements 220 for which the number $A_n$ is an odd number are formed at the front surface 210A. For example, the thermoelectric conversion elements 221, 223, 225, and 227 are formed at the front surface 210A. Moreover, in the present embodiment, thermoelectric conversion elements 220 for which the number $A_n$ is an even number are formed at the rear surface 210B. For example, the thermoelectric conversion elements 222, 224, 226, and 228 are formed at the rear surface 210B. The thermoelectric conversion elements 220 for which the number $A_n$ is an odd number may be arranged at a side corresponding to the front surface 212A of the insulating layer 212 and the thermoelectric conversion elements 220 for which the number $A_n$ is an even number may be arranged at a side correspond to the rear surface 211B of the substrate 211.

By forming thermoelectric conversion elements 220 at both the front surface 210A and the rear surface 210B of the sheet substrate 210 in this manner, it is possible to increase the density of thermoelectric conversion elements 220 in the thermoelectric conversion module 201. Increasing the density of thermoelectric conversion elements 220 in the thermoelectric conversion module 201 enables compactization of the thermoelectric conversion module 201.

The thermoelectric conversion elements 221 to 228 are arranged such as to be lined up along the second direction A2. In the present embodiment, the thermoelectric conversion elements 221, 223, 225, and 227 may be lined up along the second direction A2 with gaps therebetween at the front surface 210A of the sheet substrate 210. The width of these gaps may be any width so long as it is possible to ensure electrical insulation between two thermoelectric conversion elements 220 that are adjacent to each other in the second direction A2. Moreover, the thermoelectric conversion elements 222, 224, 226, and 228 may be lined up along the second direction A2 with gaps therebetween at the rear surface 210B of the sheet substrate 210. The width of these gaps may be any width so long as it is possible to ensure electrical insulation between two thermoelectric conversion elements 220 that are adjacent to each other in the second direction A2.

At least one part of each thermoelectric conversion element 220 formed at the front surface 210A overlaps with at least one part of a thermoelectric conversion element 220 formed at the rear surface 210B in plan view of the sheet substrate 210 as illustrated in FIG. 13 (i.e., as viewed from the third direction A3). Through at least one part of each thermoelectric conversion element 220 located at the front surface 210A overlapping with at least one part of a thermoelectric conversion element 220 located at the rear surface 210B as viewed from the third direction A3, it is possible to reduce the size of the thermoelectric conversion module 201. However, it is not essential that at least one part of each thermoelectric conversion element 220 formed at the front surface 210A overlaps with at least one part of a thermoelectric conversion element 220 formed at the rear surface 210B as viewed from the third direction A3.

The thermoelectric conversion elements 220 each have a first end 220H and a second end 220L in the first direction A1 in the same manner as the thermoelectric conversion elements 20 such as illustrated in FIG. 1. The first end 220H is located toward the first edge 201H of the thermoelectric conversion module 201. The second end 220L is located toward the second edge 201L of the thermoelectric conversion module 201. The first ends 220H of the thermoelectric conversion elements 221 to 228 are also referred to as "first end 221H", "first end 222H", "first end 223H", "first end 224H", "first end 225H", "first end 226H", "first end 227H", and "first end 228H", respectively. Moreover, the second ends 220L of the thermoelectric conversion elements 221 to 228 are also referred to as "second end 221L", "second end 222L", "second end 223L", "second end 224L", "second end 225L", "second end 226L", "second end 227L", and "second end 228L", respectively. Note that in the configuration illustrated in FIG. 13, the first ends 221H to 228H have different locations in the first direction A1. However, the locations of the first ends 221H to 228H in the first direction A1 may be the same. Also note that in the configuration illustrated in FIG. 1, the second ends 221L to 228L have different locations in the first direction A1. However, the locations of the second ends 221L to 228L in the first direction A1 may be the same.

The locations of the first ends 222H, 224H, 226H, and 228H in the first direction A1 may be different from or the same as the locations of the first ends 221H, 223H, 225H, and 227H in the first direction A1 as viewed from the third direction A3, depending on the configuration of the wiring layer 230.

The thermoelectric conversion elements 220 can generate electricity as a result of a temperature difference arising between the first ends 220H and the second ends 220L in the same manner as the thermoelectric conversion elements 20 such as illustrated in FIG. 1. When the thermoelectric conversion elements 220 generate electricity, current flowing in the thermoelectric conversion elements 220 can be generated. For example, currents I221, I222, I223, I224, I225, I226, I227, and I228 flowing in the first direction A1 in the thermoelectric conversion elements 221, 222, 223, 224, 225, 226, 227, and 228, respectively, can be generated as illustrated in FIG. 17.

The thermoelectric conversion elements 221 to 228 may all have rectangular shapes of roughly the same dimensions in the same manner as previously described in the first embodiment. Respective lengths of the thermoelectric conversion elements 221 to 228 along the first direction A1, respective widths of the thermoelectric conversion elements 221 to 228 along the second direction A2, and respective thicknesses of the thermoelectric conversion elements 221 to 228 in the third direction A3 may be adjusted such that respective electrical resistance values of the thermoelectric conversion elements 221 to 228 are roughly the same in the same manner as previously described in the first embodiment.

The first electrodes 240, the second electrodes 250, and the wires 260 may be formed of the same electrically conductive material or may be formed of different electrically conductive materials. The electrically conductive material for forming each of the first electrodes 240, the second electrodes 250, and the wires 260 can be any metal such as copper or aluminum without any specific limitations. In the following description, the first electrodes 240, the second electrodes 250, and the wires 260 are considered to be formed of the same electrically conductive material.

The first electrodes 240 may be located at the front surface 211A of the substrate 211. As illustrated in FIG. 13, the first electrodes 241 to 248 may be lined up along the second direction A2 with gaps therebetween. The width of these gaps may be any width so long as it is possible to ensure electrical insulation between two first electrodes 240 that are adjacent to each other in the second direction A2.

At least one part of each of the first electrodes 240 may be exposed from the sheet substrate 210 (i.e., from the substrate 211 or the insulating layer 212). The at least one part of each of the first electrodes 240 that is exposed from the substrate 211 or the insulating layer 212 may be electrically connected to the first end 220H of a thermoelectric conversion element 220 via a first joining member 270.

In the present embodiment, at least one part of a first electrode 240 for which the number $B_n$ is an odd number may be exposed from an opening in the insulating layer 212 as illustrated in FIG. 14. For example, at least one part of the first electrode 241 for which the number $B_n$ is an odd number is exposed from the opening 212a in the insulating layer 212. Moreover, at least one part of the first electrode 243 for which the number $B_n$ is an odd number is exposed from the opening 212b in the insulating layer 212. At least one part of the first electrode 245 for which the number $B_n$ is an odd number is exposed from the opening 212c in the insulating layer 212. At least one part of the first electrode 247 for which the number $B_n$ is an odd number is exposed from the opening 212d in the insulating layer 212.

The at least one part of the first electrode 240 for which the number $B_n$ is an odd number that is exposed from the opening in the insulating layer 212 may be electrically connected to the first end 220H of a thermoelectric conversion element 220 of the same number $A_n$ as the number $B_n$ via a first joining member 270 of the same number $E_n$ as the number $B_n$ as illustrated in FIG. 14. For example, in the case of the first electrodes 241, 243, 245, and 247 for which the number $B_n$ is an odd number, at least one part of each thereof is exposed from the openings 212a to 212d, respectively, in the insulating layer 212. The at least one part of the No. 1 first electrode 241 that is exposed from the opening 212a is electrically connected to the first end 221H of the No. 1 thermoelectric conversion element 221 via the No. 1 first joining member 271. The at least one part of the No. 3 first electrode 243 that is exposed from the opening 212b is electrically connected to the first end 223H of the No. 3 thermoelectric conversion element 223 via the No. 3 first joining member 273. The at least one part of the No. 5 first electrode 245 that is exposed from the opening 212c is electrically connected to the first end 225H of the No. 5 thermoelectric conversion element 225 via the No. 5 first joining member 275. The at least one part of the No. 7 first electrode 247 that is exposed from the opening 212d is electrically connected to the first end 227H of the No. 7 thermoelectric conversion element 227 via the No. 7 first joining member 277.

In the present embodiment, at least one part of a first electrode 240 for which the number $B_n$ is an even number may be exposed from an opening in the substrate 211 as illustrated in FIG. 14. For example, at least one part of the first electrode 242 for which the number $B_n$ is an even number is exposed from the opening 211a in the substrate 211. Moreover, at least one part of the first electrode 244 for which the number $B_n$ is an even number is exposed from the opening 211b in the substrate 211. Furthermore, at least one part of the first electrode 246 for which the number $B_n$ is an even number is exposed from the opening 211c in the substrate 211. Also, at least one part of the first electrode 248 for which the number $B_n$ is an even number is exposed from the opening 211d in the substrate 211.

The at least one part of the first electrode 240 for which the number $B_n$ is an even number that is exposed from the opening in the substrate 211 may be electrically connected to the first end 220H of a thermoelectric conversion element 220 of the same number $A_n$ as the number $B_n$ via a first joining member 270 of the same number $E_n$ as the number $B_n$ as illustrated in FIG. 14. For example, in the case of the first electrodes 242, 244, 246, and 248 for which the number $B_n$ is an even number, at least one part of each thereof is exposed from the openings 211a to 211d, respectively, in the substrate 211. The at least one part of the No. 2 first electrode 242 that is exposed from the opening 211a is electrically connected to the first end 222H of the No. 2 thermoelectric conversion element 222 via the No. 2 first joining member 272. The at least one part of the No. 4 first electrode 244 that is exposed from the opening 211b is electrically connected to the first end 224H of the No. 4 thermoelectric conversion element 224 via the No. 4 first joining member 274. The at least one part of the No. 6 first electrode 246 that is exposed from the opening 211c is electrically connected to the first end 226H of the No. 6 thermoelectric conversion element 226 via the No. 6 first joining member 276. The at least one part of the No. 8 first electrode 248 that is exposed from the opening 211d is electrically connected to the first end 222H of the No. 8 thermoelectric conversion element 228 via the No. 8 first joining member 278.

The location of a number $B_n$ first electrode 240 in the second direction A2 may be the same as the location in the second direction A2 of a thermoelectric conversion element 220 of the same number $A_n$ as the number $B_n$ as illustrated in FIG. 13. The number $B_n$ first electrode 240 may be located further toward the first edge 201H of the thermoelectric conversion module 201 than the first end 220H of the thermoelectric conversion element 220 of the same number $A_n$ as the number $B_n$. The number $B_n$ first electrode 240 may be located between the first end 220H of the thermoelectric conversion element 220 of the same number $A_n$ as the number $B_n$ and the first edge 201H. For example, the first electrodes 241, 243, 245, and 247 are located between the first ends 221H, 223H, 225H, and 227H and the first edge 201H. Moreover, the first electrodes 242, 244, 246, and 248 are located between the first ends 222H, 224H, 226H, and 228H and the first edge 201H.

An electrical resistance value of the first electrodes 240 may be not more than an electrical resistance value of the wires 260. The first electrodes 240 may be configured such that an electrical resistance value of the first electrodes 240 is not more than an electrical resistance value of the wires 260 in the same manner as previously described in the first embodiment.

A lead-out wire for extracting electrical power generated by the thermoelectric conversion module 201 may be electrically connected to any of the plurality of first electrodes 240 in the same manner as previously described in the first embodiment. In the present embodiment, this lead-out wire may be electrically connected to the first electrode 248.

The second electrodes 250 may be located at the front surface 211A of the substrate 211. The second electrodes 251 to 258 may be lined up along the second direction A2 with gaps therebetween as illustrated in FIG. 13. The width of these gaps may be any width so long as it is possible to ensure electrical insulation between two second electrodes 250 that are adjacent to each other in the second direction A2.

At least one part of each of the second electrodes 250 may be exposed from the sheet substrate 210 (i.e., from the substrate 211 or the insulating layer 212). The at least one part of each of the second electrodes 250 that is exposed from the substrate 211 or the insulating layer 212 may be electrically connected to the second end 220L of a thermoelectric conversion element 220 via a second joining member 280.

In the present embodiment, at least one part of a second electrode 250 for which the number $C_n$ is an odd number may be exposed from an opening in the insulating layer 212 as illustrated in FIG. 15. For example, at least one part of the second electrode 251 for which the number $C_n$ is an odd number is exposed from the opening 212e in the insulating layer 212. Moreover, at least one part of the second electrode 253 for which the number $C_n$ is an odd number is exposed from the opening 212f in the insulating layer 212. Furthermore, at least one part of the second electrode 255 for which the number $C_n$ is an odd number is exposed from the opening 212g in the insulating layer 212. Also, at least one part of the second electrode 257 for which the number $C_n$ is an odd number is exposed from the opening 212h in the insulating layer 212.

The at least one part of the second electrode 250 for which the number $C_n$ is an odd number that is exposed from the opening in the insulating layer 212 may be electrically connected to the second end 220L of a thermoelectric conversion element 220 of the same number $A_n$ as the number $C_n$ via a second joining member 280 of the same number $F_n$ as the number $C_n$ as illustrated in FIG. 15. For example, in the case of the second electrodes 251, 253, 255, and 257 for which the number $C_n$ is an odd number, at least one part of each thereof is exposed from the openings 212e to 212h, respectively, in the insulating layer 212. The at least one part of the No. 1 second electrode 251 that is exposed from the opening 212e is electrically connected to the second end 221L of the No. 1 thermoelectric conversion element 221 via the No. 1 second joining member 281. The at least one part of the No. 3 second electrode 253 that is exposed from the opening 212f is electrically connected to the second end 223L of the No. 3 thermoelectric conversion element 223 via the No. 3 second joining member 283. The at least one part of the No. 5 second electrode that is exposed from the opening 212g is electrically connected to the second end 225L of the No. 5 thermoelectric conversion element 225 via the No. 5 second joining member 285. The at least one part of the No. 7 second electrode 257 that is exposed from the opening 212h is electrically connected to the second end 227L of the No. 7 thermoelectric conversion element 227 via the No. 7 second joining member 287.

In the present embodiment, at least one part of a second electrode 250 for which the number $C_n$ is an even number may be exposed from the substrate 211 as illustrated in FIG. 15. For example, at least one part of the second electrode 252 for which the number Cn is an even number is exposed from the opening 211e in the substrate 211. At least one part of the second electrode 254 for which the number $C_n$ is an even number is exposed from the opening 211f in the substrate 211. At least one part of the second electrode 256 for which the number $C_n$ is an even number is exposed from the opening 211g in the substrate 211. At least one part of the second electrode 258 for which the number $C_n$ is an even number is exposed from the opening 211h in the substrate 211.

The at least one part of the second electrode 250 for which the number $C_n$ is an even number that is exposed from the opening in the substrate 211 may be electrically connected to the second end 220L of a thermoelectric conversion element 220 of the same number $A_n$ as the number $C_n$ via a second joining member 280 of the same number $F_n$ as the number $C_n$. For example, in the case of the second electrodes 252, 254, 256, and 258 for which the number $C_n$ is an even number, at least one part of each thereof is exposed from the openings 211e to 211h, respectively, in the substrate 211. The at least one part of the No. 2 second electrode 252 that is exposed from the opening 211e is electrically connected to the second end 222L of the No. 2 thermoelectric conversion element 222 via the No. 2 second joining member 282. The at least one part of the No. 4 second electrode 254 that is exposed from the opening 211f is electrically connected to the second end 224L of the No. 4 thermoelectric conversion element 224 via the No. 4 second joining member 284. The at least one part of the No. 6 second electrode 256 that is exposed from the opening 211g is electrically connected to the second end 226L of the No. 6 thermoelectric conversion element 226 via the No. 6 second joining member 286. The at least one part of the No. 8 second electrode 258 that is exposed from the opening 211h is electrically connected to the second end 228L of the No. 8 thermoelectric conversion element 228 via the No. 8 second joining member 288.

The location of a number $C_n$ second electrode 250 in the second direction A2 may be the same as the location in the second direction A2 of a thermoelectric conversion element 220 of the same number $A_n$ as the number $C_n$ as illustrated in FIG. 13. The number $C_n$ second electrode 250 may be located further toward the second edge 201L of the thermoelectric conversion module 201 than the second end 220L of the thermoelectric conversion element 220 of the same number $A_n$ as the number $C_n$. The number $C_n$ second electrode 250 may be located between the second end 220L of the thermoelectric conversion element 220 of the same number $A_n$ as the number $C_n$ and the second edge 201L. For example, the second electrodes 251, 253, 255, and 257 are located between the second ends 221L, 223L, 225L, and 227L and the second edge 201L. Moreover, the second electrodes 252, 254, 256, and 258 are located between the second ends 222L, 224L, 226L, and 228L and the second edge 201L.

An electrical resistance value of the second electrodes 250 may be not more than an electrical resistance value of the wires 260. The second electrodes 250 may be configured such that an electrical resistance value of the second electrodes 250 is not more than an electrical resistance value of the wires 260 in the same manner as previously described in the first embodiment.

A lead-out wire for extracting electrical power generated by the thermoelectric conversion module 201 may be electrically connected to any of the plurality of second electrodes 250 in the same manner as previously described in the first embodiment. In the present embodiment, this lead-out wire may be electrically connected to the second electrode 251.

The wires 260 are located in the sheet substrate 210 as illustrated in FIG. 16. The wires 260 may be located at the front surface 211A of the substrate 211 together with the first electrodes 240 and the second electrodes 250 as illustrated in FIG. 16. The wires 260 may be located at a side corresponding to the rear surface 212B of the insulating layer 212. The wires 260 may be located at a side corresponding to the rear surface 212B of the insulating layer 212 together with the first electrodes 240 and the second electrodes 250.

The wires 260 electrically connect, in series, thermoelectric conversion elements 220 that are adjacent to each other in the second direction A2 at both ends of the thermoelectric conversion elements 220 (i.e., at first ends 220H and second ends 220L). In the present embodiment, for two thermoelectric conversion elements 220 that are adjacent to each other in the second direction A2, a wire 260 electrically connects a first electrode 240 that is electrically connected to the first end 220H of one of these thermoelectric conversion elements 220 and a second electrode 250 that is electrically connected to the second end 220L of the other of these thermoelectric conversion elements 220.

The plurality of wires 260 may electrically connect the plurality of thermoelectric conversion elements 220 in series in an order corresponding to the numbers $A_n$ allotted to the thermoelectric conversion elements 220 by electrically connecting the plurality of first electrodes 240 and the plurality of second electrodes 250 as illustrated in FIG. 16. As one example, a number $D_n$ wire 260 may electrically connect a first electrode 240 of the same number $E_n$ as the number $D_n$ and a second electrode 250 of a number $F_{n+1}$ that is one larger than the number $D_n$. One end of the number $D_n$ wire 260 may be connected to the first electrode 240 of the same number $E_n$ as the number $D_n$. The other end of the number $D_n$ wire 260 may be electrically connected to the second electrode 250 of the number $F_{n+1}$ that is one larger than the number $D_n$. The number $D_n$ wire 260 may extend in a linear shape from the first electrode 240 of the same number $E_n$ as the number $D_n$ to the second electrode 250 of the number $F_{n+1}$ that is one larger than the number $D_n$.

For example, one end of the No. 1 wire 261 is electrically connected to the No. 1 first electrode 241. The other end of the No. 1 wire 261 is electrically connected to the No. 2 (i.e., number one larger than No. 1) second electrode 252. One end of the No. 2 wire 262 is electrically connected to the No. 2 first electrode 242. The other end of the No. 2 wire 262 is electrically connected to the No. 3 (i.e., number one larger than No. 2) second electrode 253. One end of the No. 3 wire 263 is electrically connected to the No. 3 first electrode 243. The other end of the No. 3 wire 263 is electrically connected to the No. 4 (i.e., number one larger than No. 3) second electrode 254. One end of the No. 4 wire 264 is electrically connected to the No. 4 first electrode 244. The other end of the No. 4 wire 264 is electrically connected to the No. 5 (i.e., number one larger than No. 4) second electrode 255. One end of the No. 5 wire 265 is electrically connected to the No. 5 first electrode 245. The other end of the No. 5 wire 265 is electrically connected to the No. 6 (i.e., number one larger than No. 5) second electrode 256. One end of the No. 6 wire 266 is electrically connected to the No. 6 first electrode 246. The other end of the No. 6 wire 266 is electrically connected to the No. 7 (i.e., number one larger than No. 6) second electrode 257. One end of the No. 7 wire 267 is electrically connected to the No. 7 first electrode 247. The other end of the No. 7 wire 267 is electrically connected to the No. 8 (i.e., number one larger than No. 7) second electrode 258.

Through a configuration such as set forth above, the plurality of thermoelectric conversion elements 220 can be electrically connected in series in an order corresponding to the numbers $A_n$ allotted to the thermoelectric conversion elements 220. As a result of the plurality of thermoelectric conversion elements 220 being electrically connected in series, it is possible for a single current path to form in the thermoelectric conversion module 201 as illustrated in FIG. 17 when the plurality of thermoelectric conversion elements 220 generate electricity. In FIG. 17, currents I261, I262, I263, I264, I265, I266, and I267 are currents that flow in the wires 261, 262, 263, 264, 265, 266, and 267, respectively.

A thermal resistance value of the wires 260 may be not less than a thermal resistance value of the thermoelectric conversion elements 220. The wires 260 may be configured such that a thermal resistance value of the wires 260 is not less than a thermal resistance value of the thermoelectric conversion elements 220 in the same manner as previously described in the first embodiment. Moreover, a thermal resistance value of the wires 260 may be not less than a thermal resistance value of the thermoelectric conversion elements 220, and an electrical resistance value of the wires 260 may be not more than an electrical resistance value of the thermoelectric conversion elements 220. The wires 260 may be configured such that a thermal resistance value of the wires 260 is not less than a thermal resistance value of the thermoelectric conversion elements 220 and an electrical resistance value of the wires 260 is not more than an electrical resistance value of the thermoelectric conversion elements 20 in the same manner as previously described in the first embodiment. Note that wires 160A such as illustrated in FIG. 11 or wires 160B such as illustrated in FIG. 12 may be adopted instead of the wires 260.

The first joining members 270 are electrically conductive. The first joining members 270 may each be formed of any member such as silver paste or solder.

A number $E_n$ first joining member 270 may electrically connect the first end 220H of a thermoelectric conversion element 220 of the same number $A_n$ as the number $E_n$ and a first electrode 240 of the same number $B_n$ as the number $E_n$ in the same manner as in the first embodiment.

In the second embodiment, at least one part of a first joining member 270 for which the number $E_n$ is an odd number may be located in an opening in the insulating layer 212 as illustrated in FIG. 14. The first joining member 270 for which the number $E_n$ is an odd number may electrically connect the first end 220H of a thermoelectric conversion element 220 of the same number $A_n$ as the number $E_n$ and a first electrode 240 of the same number $B_n$ as the number $E_n$ via the opening in the insulating layer 212.

For example, at least one part of the No. 1 first joining member 271 is located in the opening 212a in the insulating layer 212. The No. 1 first joining member 271 electrically connects the first end 221H of the No. 1 thermoelectric conversion element 221 and the No. 1 first electrode 241 via the opening 212a in the insulating layer 212. Moreover, at least one part of the No. 3 first joining member 273 is located in the opening 212b in the insulating layer 212. The No. 3 first joining member 273 electrically connects the first end 223H of the No. 3 thermoelectric conversion element 223 and the No. 3 first electrode 243 via the opening 212b in the insulating layer 212. Furthermore, at least one part of the No. 5 first joining member 275 is located in the opening 212c in the insulating layer 212. The No. 5 first joining member 275 electrically connects the first end 225H of the No. 5 thermoelectric conversion element 225 and the No. 5 first electrode 245 via the opening 212c in the insulating layer 212. Also, at least one part of the No. 7 first joining member 277 is located in the opening 212d in the insulating layer 212. The No. 7 first joining member 277 electrically connects the first end 227H of the No. 7 thermoelectric conversion element 227 and the No. 7 first electrode 247 via the opening 212d in the insulating layer 212.

As illustrated in FIG. 14, at least one part of a first joining member 270 for which the number $E_n$ is an even number may be located in an opening in the substrate 211. The first joining member 270 for which the number $E_n$ is an even number may electrically connect the first end 220H of a thermoelectric conversion element 220 of the same number $A_n$ as the number $E_n$ and a first electrode 240 of the same number $B_n$ as the number $E_n$ via the opening in substrate 211.

For example, at least one part of the No. 2 first joining member 272 is located in the opening 211a in the substrate 211. The No. 2 first joining member 272 electrically connects the first end 222H of the No. 2 thermoelectric conversion element 222 and the No. 2 first electrode 242 via the opening 211a in the substrate 211. Moreover, at least one part of the No. 4 first joining member 274 is located in the opening 211b in the substrate 211. The No. 4 first joining member 274 electrically connects the first end 224H of the No. 4 thermoelectric conversion element 224 and the No. 4 first electrode 244 via the opening 211b in the substrate 211. Furthermore, at least one part of the No. 6 first joining member 276 is located in the opening 211c in the substrate 211. The No. 6 first joining member 276 electrically connects the first end 226H of the No. 6 thermoelectric conversion element 226 and the No. 6 first electrode 246 via the opening 211c in the substrate 211. Also, at least one part of the No. 8 first joining member 278 is located in the opening 211d in the substrate 211. The No. 8 first joining member 278 electrically connects the first end 228H of the No. 8 thermoelectric conversion element 228 and the No. 8 first electrode 248 via the opening 211d in the substrate 211.

The first joining members 270 may be configured such that an electrical resistance value of the first joining members 270 is not more than an electrical resistance value of the wires 260 in the same manner as previously described in the first embodiment.

The second joining members 280 are electrically conductive. The second joining members 280 may each be formed of any member such as silver paste or solder.

A number $F_n$ second joining member 280 electrically connects the second end 220L of a thermoelectric conversion element 220 of the same number $A_n$ as the number $F_n$ and a second electrode 250 of the same number $C_n$ as the number $F_n$ in the same manner as in the first embodiment.

In the second embodiment, at least one part of a second joining member 280 for which the number $F_n$ is an odd number may be located in an opening in the insulating layer 212 as illustrated in FIG. 15. The second joining member 280 for which the number $F_n$ is an odd number may electrically connect the second end 220L of a thermoelectric conversion element 220 of the same number $A_n$ as the number $F_n$ and a second electrode 250 of the same number $C_n$ as the number $F_n$ via the opening in the insulating layer 212.

For example, at least one part of the No. 1 second joining member 281 is located in the opening 212e in the insulating layer 212. The No. 1 second joining member 281 electrically connects the second end 221L of the No. 1 thermoelectric conversion element 221 and the No. 1 second electrode 251 via the opening 212e in the insulating layer 212. Moreover, at least one part of the No. 3 second joining member 283 is located in the opening 212f in the insulating layer 212. The No. 3 second joining member 283 electrically connects the second end 223L of the No. 3 thermoelectric conversion element 223 and the No. 3 second electrode 253 via the opening 212f in the insulating layer 212. Furthermore, at least one part of the No. 5 second joining member 285 is located in the opening 212g in the insulating layer 212. The No. 5 second joining member 285 electrically connects the second end 225L of the No. 5 thermoelectric conversion element 225 and the No. 5 second electrode 255 via the opening 212g in the insulating layer 212. Also, at least one part of the No. 7 second joining member 287 is located in the opening 212h in the insulating layer 212. The No. 7 second joining member 287 electrically connects the second end 227L of the No. 7 thermoelectric conversion element 227 and the No. 7 second electrode 257 via the opening 212h in the insulating layer 212.

In the second embodiment, at least one part of a second joining member 280 for which the number $F_n$ is an even number may be located in an opening in the substrate 211 as illustrated in FIG. 15. The second joining member 280 for which the number $F_n$ is an even number may electrically connect the second end 220L of a thermoelectric conversion element 220 of the same number $A_n$ as the number $F_n$ and a second electrode 250 of the same number $C_n$ as the number $F_n$ via the opening in the substrate 211.

For example, at least one part of the No. 2 second joining member 282 is located in the opening 211e in the substrate 211. The No. 2 second joining member 282 electrically connects the second end 222L of the No. 2 thermoelectric conversion element 222 and the No. 2 second electrode 252 via the opening 211e in the substrate 211. Moreover, at least one part of the No. 4 second joining member 284 is located in the opening 211f in the substrate 211. The No. 4 second joining member 284 electrically connects the second end 224L of the No. 4 thermoelectric conversion element 224 and the No. 4 second electrode 254 via the opening 211f in the substrate 211. Furthermore, at least one part of the No. 6 second joining member 286 is located in the opening 211g in the substrate 211. The No. 6 second joining member 286 electrically connects the second end 226L of the No. 6 thermoelectric conversion element 226 and the No. 6 second electrode 256 via the opening 211g in the substrate 211. Also, at least one part of the No. 8 second joining member 288 is located in the opening 211h in the substrate 211. The No. 8 second joining member 288 electrically connects the second end 228L of the No. 8 thermoelectric conversion element 228 and the No. 8 second electrode 258 via the opening 211h in the substrate 211.

The second joining members 280 may be configured such that an electrical resistance value of the second joining members 280 is not more than an electrical resistance value of the wires 260 in the same manner as previously described in the first embodiment.

Other configurations and effects of the thermoelectric conversion module 201 according to the second embodiment are the same as for the thermoelectric conversion module 1 according to the first embodiment.

(Method of Producing Thermoelectric Conversion Module)

FIG. 18 is a flowchart illustrating flow of a method of producing the thermoelectric conversion module 201 illustrated in FIG. 13. As illustrated in FIG. 18, the method of producing the thermoelectric conversion module 201 according to the present embodiment includes an arrangement step S20, formation steps S21, S22, S23, S24, S25, and S26, and a connection step S27 described below. However, the method by which the thermoelectric conversion module 201 according to the present embodiment is produced is not limited to the production method described below. Note that FIGS. 19 to 23 correspond to the cross-sectional view illustrated in FIG. 14.

(Arrangement Step S20)

Figure 19:
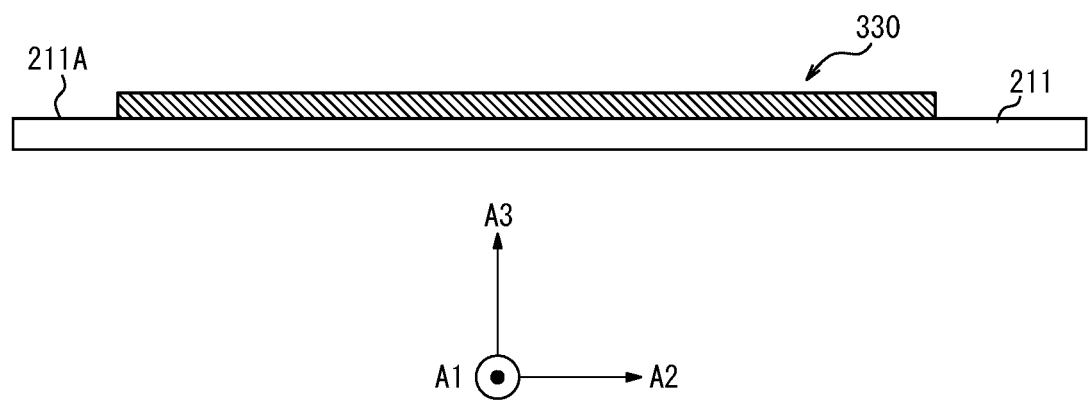
FIG. 19 illustrates configuration after an arrangement step of metal foil is performed.

The arrangement step S20 is a step of arranging metal foil 330 on a substrate 211 as illustrated in FIG. 19. The metal foil 330 may be arranged at a front surface 211A of the substrate 211. The metal foil 330 may be adhered to the front surface 211A of the substrate 211 through any adhesive having thermal conductivity in the same manner as for the arrangement step S10 described in the first embodiment. The metal foil 330 may be the same as the metal foil 130 such as illustrated in FIG. 7. The metal foil 330 can constitute a wiring layer 230 after undergoing the formation step S21 and the like described below.

<Formation Step S21>

The formation step S21 (wiring layer formation step) is a step of forming a wiring layer 230 above the front surface 211A of the substrate 211 such as illustrated in FIG. 16 through patterning of the metal foil 330. Commonly known photolithography or the like may be used in the patterning of the metal foil 330.

<Formation Step S22>

Figure 20:
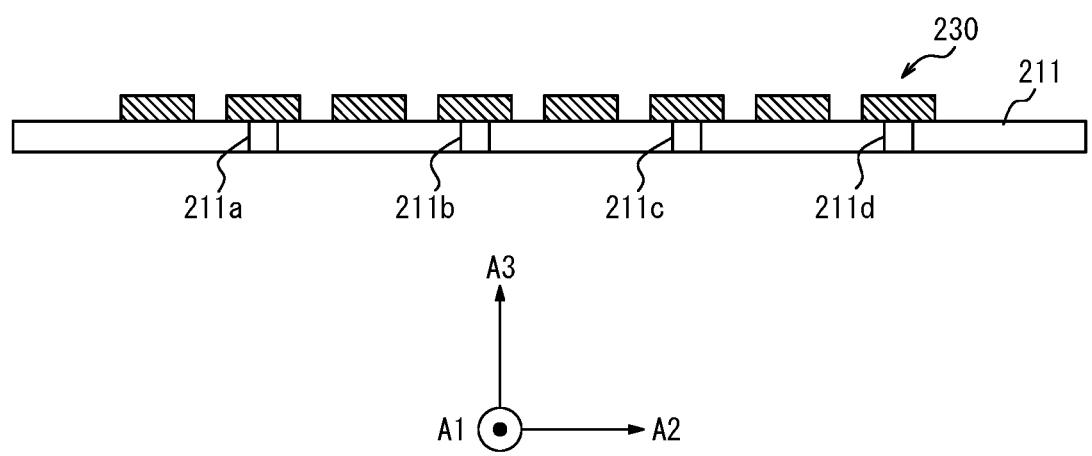
FIG. 20 illustrates configuration after a formation step of openings in a substrate is performed.
Figure 21:
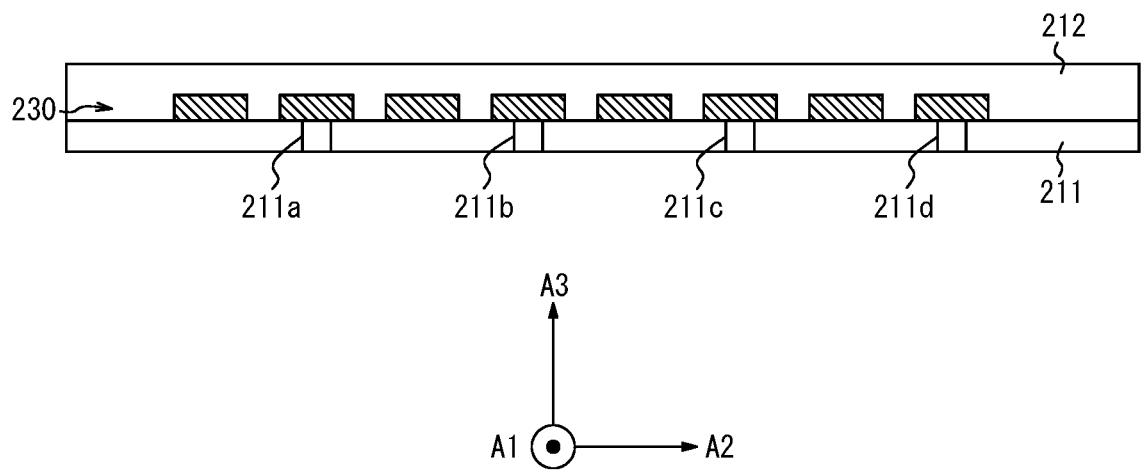
FIG. 21 illustrates configuration after a formation step of an insulating layer is performed.

The formation step S22 is a step of forming openings 211a, 211b, 211c, and 211d in the substrate 211 as illustrated in FIG. 20 and forming openings 211e, 211f, 211g, 211h in the substrate 211 such as illustrated in FIG. 15. The openings 211a to 211h may be formed using any laser.

<Formation Step S23>

The formation step S23 (insulating layer formation step) is a step of forming an insulating layer 212 above the substrate 211 and the wiring layer 230 as illustrated in FIG.

21. The insulating layer 212 may be formed by applying an electrically insulating material above the substrate 211 and the wiring layer 230 in the formation step S23. A sheet substrate 210 is formed as a result of the insulating layer 212 being formed at the front surface 211A of the substrate 211. In other words, the sheet substrate 210 includes the substrate 211 and the insulating layer 212 that is formed at the front surface 211A of the substrate 211.

<Formation Step S24>

Figure 22:
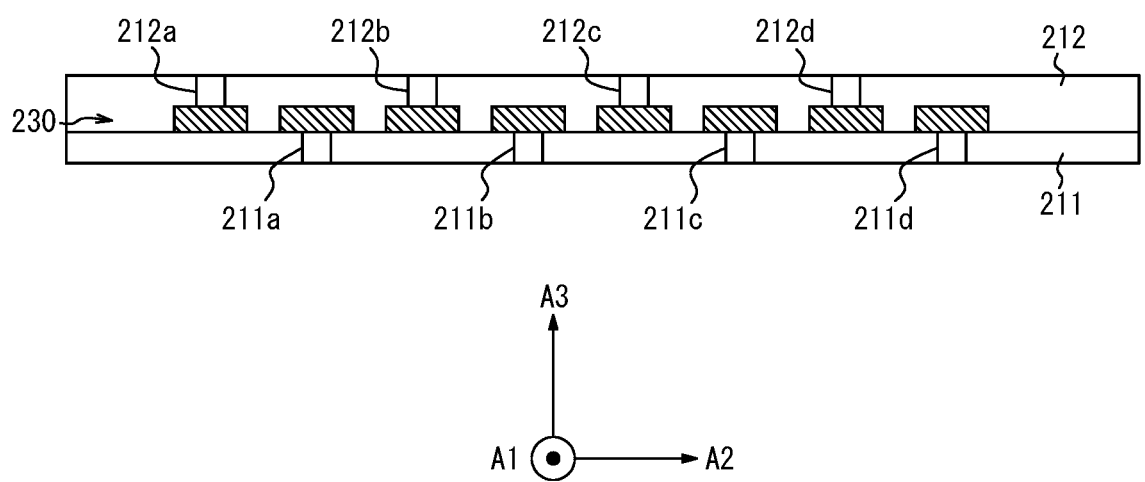
FIG. 22 illustrates configuration after a formation step of openings in the insulating layer is performed.

The formation step S24 is a step of forming openings 212a, 212b, 212c, and 212d in the insulating layer 212 as illustrated in FIG. 22 and forming openings 212e, 212f, 212g, and 212h in the insulating layer 212 such as illustrated in FIG. 15. The openings 212a to 212h may be formed using any laser.

<Formation Step S25>

Figure 23:
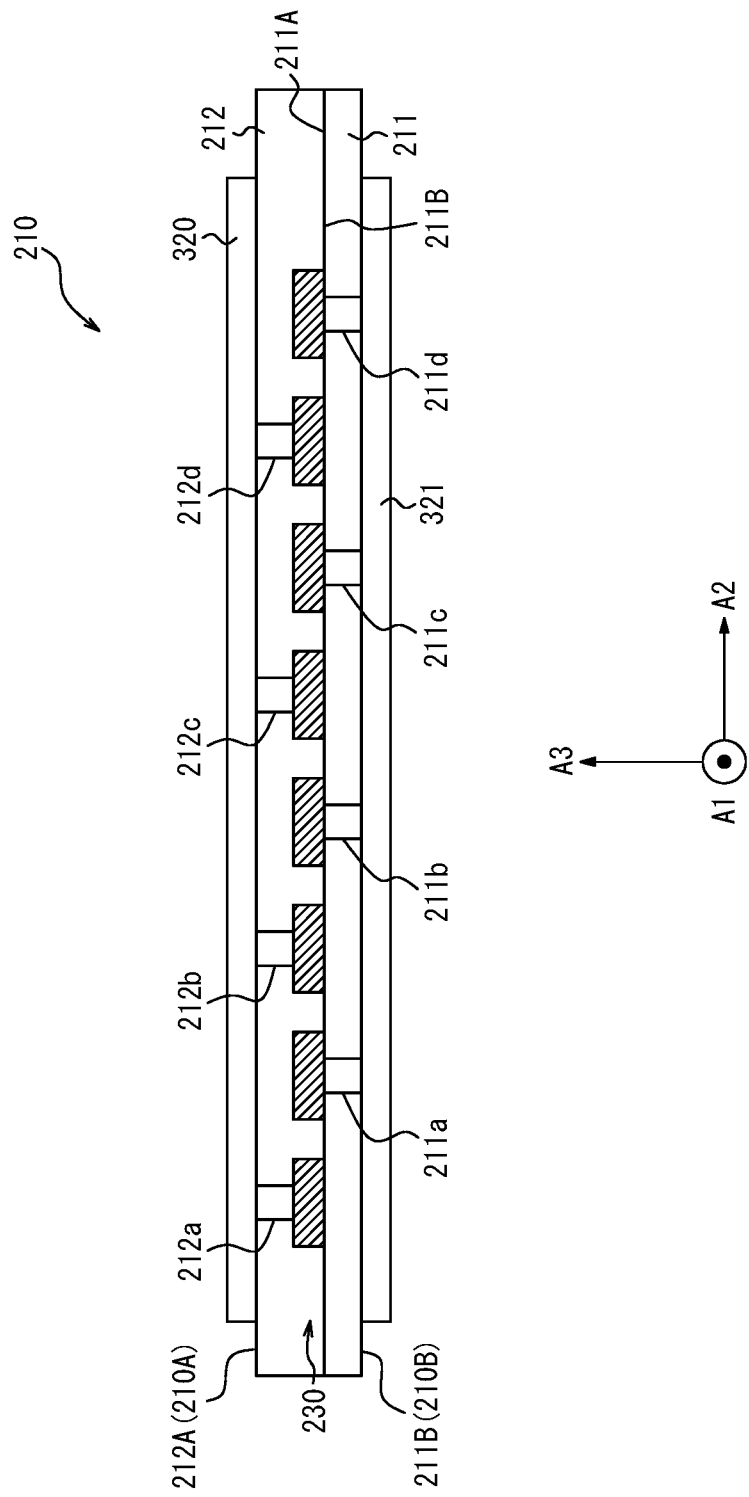
FIG. 23 illustrates configuration after arrangement of carbon nanotube sheets.

The formation step S25 (element formation step) is a step of forming a thermoelectric conversion element layer above the insulating layer 212 and forming a thermoelectric conversion element layer below the substrate 211. The thermoelectric conversion element layers are layers that contains CNTs as previously described. In the present embodiment, the thermoelectric conversion element layers are taken to be a CNT sheet 320 and a CNT sheet 321 such as illustrated in FIG. 23. The CNT sheets 320 and 321 contain CNTs. In the present embodiment, the formation step S25 is a step of arranging the CNT sheet 320 on the insulating layer 212 and arranging the CNT sheet 321 on the substrate 211. The CNT sheet 320 is arranged at a front surface 212A of the insulating layer 212 (i.e., the front surface 210A of the sheet substrate 210), for example. The CNT sheet 321 is arranged at the rear surface 211B of the substrate 211 (i.e., the rear surface 210B of the sheet substrate 210), for example.

The CNT sheet 320 can constitute thermoelectric conversion elements 221, 223, 225, and 227 after undergoing the formation step S26 and the like described below. Moreover, the CNT sheet 321 can constitute thermoelectric conversion elements 222, 224, 226, and 228 after undergoing the formation step S26 and the like described below. In a case in which the thermoelectric conversion elements 220 are to be formed as p-type thermoelectric conversion elements, p-type CNT sheets 320 and 321 may be used. In a case in which the thermoelectric conversion elements 220 are to be formed as n-type thermoelectric conversion elements, n-type CNT sheets 320 and 321 may be used.

The CNT sheets 320 and 321 may be adhered to the front surface 210A and the rear surface 210B, respectively, of the sheet substrate 210 through any adhesive sheet such as epoxy resin in the formation step S25.

Any of the same examples as given for the CNT sheet 120 previously described in the first embodiment may be used as the CNT sheets 320 and 321.

Other configurations of the formation step S25 are the same as for configurations of the formation step S13 described in the first embodiment.

<Formation Step S26>

The formation step S26 (thermoelectric conversion element formation step) is a step of cutting the thermoelectric conversion element layers (i.e., the CNT sheets 320 and 321) in the first direction A1 to form a plurality of thermoelectric conversion elements 220 lined up in the first direction A1. The formation step S26 may be performed using a laser. The CNT sheets 320 and 321 may be cut along the first direction A1 by the laser in the formation step S26 in the same manner as in the formation step S14 described in the first embodiment. The CNT sheets 320 and 321 may be cut along the first direction A1 using a UV laser, a nanosecond laser, or a femtosecond laser in the formation step S26 in the same manner as in the formation step S14 described in the first embodiment.

Other configurations of the formation step S26 are the same as configurations of the formation step S14 described in the first embodiment.

<Connection Step S27>

The connection step S27 is a step of electrically connecting first electrodes 240 and second electrodes 250 that are exposed from the substrate 211 or the insulating layer 212 and both ends (i.e., first ends 220H and second ends 220L) of a plurality of thermoelectric conversion elements 220 such that the plurality of thermoelectric conversion elements 220 are all electrically connected in series. The first electrodes 240 and the second electrodes 250 can also be said to be both ends of wires 260. In other words, the connection step S27 can also be said to be a step of electrically connecting both ends of the wires 260 that are exposed from the substrate 211 or the insulating layer 212 and the first ends 220H and the second ends 220L of the plurality of thermoelectric conversion elements 220 such that the plurality of thermoelectric conversion elements 220 are all electrically connected in series.

The connection step S27 according to the present embodiment is a step of applying silver paste from the first ends 220H of thermoelectric conversion elements 220, such as illustrated in FIG. 13, up to the first electrodes 240 that are exposed from the substrate 211 or the insulating layer 212 and applying silver paste from the second ends 220L of thermoelectric conversion elements 220, such as illustrated in FIG. 13, up to the second electrodes 250 that are exposed from the substrate 211 or the insulating layer 212.

In the connection step S27, silver paste is applied along the first direction A1 from the openings 212a to 212d in the insulating layer 212, such as illustrated in FIG. 14, up to the first ends 220H of thermoelectric conversion elements 220 for which the number $A_n$ is an odd number. Some of the silver paste is filled into the openings 212a to 212d and is electrically connected to first electrodes 240 for which the number $B_n$ is an odd number. This silver paste can constitute first joining members 270 for which the number $E_n$ is an odd number after drying.

In the connection step S27, silver paste is applied along the first direction A1 from the openings 211a to 211d in the substrate 211, such as illustrated in FIG. 14, up to the first ends 220H of thermoelectric conversion elements 220 for which the number $A_n$ is an even number. Some of the silver paste is filled into the openings 211a to 211d and is electrically connected to first electrodes 240 for which the number $B_n$ is an even number. This silver paste can constitute first joining members 270 for which the number $E_n$ is an even number after drying.

In the connection step S27, silver paste is applied along the first direction A1 from the openings 212e to 212h in the insulating layer 212, such as illustrated in FIG. 15, up to the second ends 220L of thermoelectric conversion elements 220 for which the number $A_n$ is an odd number. Some of the silver paste is filled into the openings 212e to 212h and is electrically connected to second electrodes 250 for which the number $C_n$ is an odd number. This silver paste can constitute second joining members 280 for which the number $F_n$ is an odd number after drying.

In the connection step S27, silver paste is applied along the first direction A1 from the openings 211e to 211h in the substrate 211, such as illustrated in FIG. 15, up to the second ends 220L of thermoelectric conversion elements 220 for which the number $A_n$ is an even number. Some of this silver paste is filled into the openings 211e to 211h and is electrically connected to second electrodes 250 for which the number $C_n$ is an even number. This silver paste can constitute second joining members 280 for which the number $F_n$ is an even number after drying.

Other configurations and effects of the method of producing the thermoelectric conversion module 201 according to the second embodiment are the same as for the method of producing the thermoelectric conversion module 1 according to the first embodiment.

Third Embodiment

Figure 24:
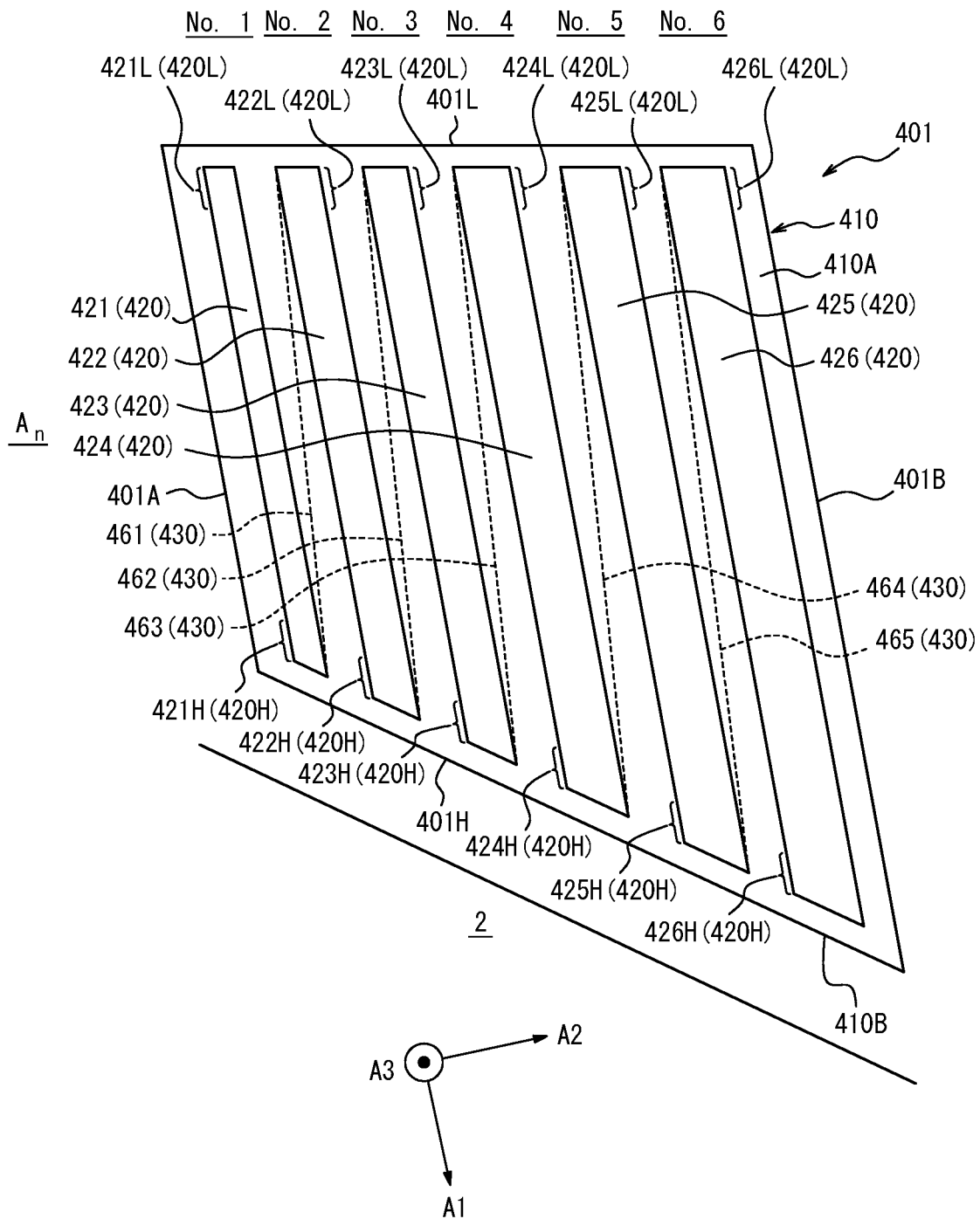
FIG. 24 is an external view of a thermoelectric conversion module according to a third embodiment of the present disclosure.

FIG. 24 is an external view of a thermoelectric conversion module 401 according to a third embodiment of the present disclosure. The thermoelectric conversion module 401 can be arranged at a heat source 2 in the same manner as in the first embodiment. The thermoelectric conversion module 401 has a first edge 401H and a second edge 401L on a sheet substrate 410, which is described further below. The first edge 401H and the second edge 401L are opposite to each other. The first edge 401H can be located close to the heat source 2 when the thermoelectric conversion module 401 is arranged at the heat source 2. The second edge 401L can be located far from the heat source 2 when the thermoelectric conversion module 401 is arranged at the heat source 2.

The temperature around the first edge 401H can be higher than the temperature around the second edge 401L in the same manner as for the first edge 1H such as illustrated in FIG. 1. In other words, the temperature around the second edge 401L can be lower than the temperature around the first edge 401H.

The first direction A1, the second direction A2, and the third direction A3 can be adopted in the third embodiment in the same manner as in the first embodiment. In the third embodiment, the first direction A1 is a direction in which the first edge 401H and the second edge 401L are opposite to each other. In the present embodiment, the first direction A1 is defined as a direction that is toward the first edge 401H from the second edge 401L and that is orthogonal to the second edge 401L. Moreover, in the present embodiment, the second direction A2 is defined as a direction toward the right side of the page from the left side of the page in FIG. 24. Furthermore, in the present embodiment, the third direction A3 is defined as a direction toward the foreground of the page from the background of the page in FIG. 24.

The shape of the thermoelectric conversion module 401 as viewed from the third direction A3 is a trapezoidal shape. The thermoelectric conversion module 401 has a side 401A and a side 401B on the subsequently described sheet substrate 410. The side 401A and the side 401B are parallel. The side 401A and the side 401B correspond to two bases of the trapezoid. The first edge 401H corresponds to one leg among two legs of the trapezoid. The second edge 401L corresponds to the other leg among the two legs of the trapezoid. The distance between the first edge 401H and the second edge 401L in the first direction A1 increases along the second direction A2.

The thermoelectric conversion module 401 includes the sheet substrate 410, thermoelectric conversion elements 421, 422, 423, 424, 425, and 426, and a wiring layer 430. The wiring layer 430 is located in the sheet substrate 410. The wiring layer 430 may be located at a side corresponding to a rear surface of an insulating layer included in the sheet substrate 410, which is the same as the insulating layer 12 such as illustrated in FIG. 2. The wiring layer 430 includes a wire 461, a wire 462, a wire 463, a wire 464, and a wire 465. The wiring layer 430 may further include first electrodes that are the same as the first electrodes 40 such as illustrated in FIG. 1 and second electrodes that are the same as the second electrodes 50 such as illustrated in FIG. 1. The thermoelectric conversion module 401 may include joining members that are the same as the first joining members 70 such as illustrated in FIG. 1 and joining members that are the same as the second joining members 80 such as illustrated in FIG. 1.

In the following description, the thermoelectric conversion elements 421 to 426 are also referred to collectively as "thermoelectric conversion elements 420" when no specific distinction is made therebetween. FIG. 24 illustrates a thermoelectric conversion module 401 that includes 6 thermoelectric conversion elements 420. However, the number of thermoelectric conversion elements 420 included in the thermoelectric conversion module 401 may be any number.

In the following description, the wires 461 to 465 are also referred to collectively as "wires 460" when no specific distinction is made therebetween. FIG. 24 illustrates a wiring layer 430 that includes 5 wires 460. However, the number of wires 460 included in the wiring layer 430 may be a number in accordance with the number of thermoelectric conversion elements 420 included in the thermoelectric conversion module 401.

In the following description, numbers allotted along the second direction A2 to the plurality of thermoelectric conversion elements 420 included in the thermoelectric conversion module 401 are also referred to as "number $A_n$" (n is an integer) in the same manner as in the first embodiment. The numbers for the thermoelectric conversion elements 421, 422, 423, 424, 425, and 426 are No. 1, No. 2, No. 3, No. 4, No. 5, and No. 6, respectively.

In the following description, numbers allotted along the second direction A2 to the plurality of wires 460 included in the wiring layer 430 are also referred to as "number $D_n$" (n is an integer) in the same manner as in the first embodiment. Numbers $D_n$ allotted along the second direction A2 to the wires 461, 462, 463, 464, and 465 are No. 1, No. 2, No. 3, No. 4, and No. 5, respectively.

The sheet substrate 410 is electrically insulating. The sheet substrate 410 may be flexible. The shape of the sheet substrate 410 as viewed from the third direction A3 is a trapezoidal shape. The sheet substrate 410 has the first edge 401H described above, the second edge 401L described above, the side 401A described above, and the side 401B described above.

The sheet substrate 410 has a front surface 410A and a rear surface 410B. The front surface 410A and the rear surface 410B are opposite to each other. The front surface 410A is a surface that faces in the third direction A3 among surfaces of the sheet substrate 410. The rear surface 410B is a surface that faces in an opposite direction to the third direction A3 among surfaces of the sheet substrate 410.

The sheet substrate 410 may include a substrate that is the same as the substrate 11 and an insulating layer that is the same as the insulating layer 12 in the same manner as the sheet substrate 10 such as illustrated in FIG. 2.

The thermoelectric conversion elements 421 to 426 are all p-type thermoelectric conversion elements or are all n-type thermoelectric conversion elements. The thermoelectric conversion material for forming the thermoelectric conversion elements 420 can be any of the thermoelectric conversion materials previously described in the first embodiment without any specific limitations. In a case in which the thermoelectric conversion material for forming the thermoelectric conversion elements 420 is an organic material such as CNTs, for example, the thermoelectric conversion elements 421 to 426 may all be p-type thermoelectric conversion elements in the same manner as previously described in the first embodiment. The thermoelectric conversion elements 421 to 426 may all contain CNTs in the same manner as previously described in the first embodiment.

The thermoelectric conversion elements 420 extend along the first direction A1. The shape of the thermoelectric conversion elements 420 as viewed from the third direction A3 is an elongated shape such as a rectangular shape. A lengthwise direction of the thermoelectric conversion elements 420 is along the first direction A1. The lengthwise direction of the thermoelectric conversion elements 420 may be parallel to the first direction A1. The cross-sectional shape of the thermoelectric conversion elements 420 may be a thin film shape. The respective thicknesses of the thermoelectric conversion elements 421 to 426 in the third direction A3 may be roughly the same or may be different. In the following description, the respective thicknesses of the thermoelectric conversion elements 421 to 426 in the third direction A3 are taken to be roughly the same.

The thermoelectric conversion elements 420 each have a first end 420H and a second end 420L in the first direction A1. The first end 420H is located toward the first edge 401H of the thermoelectric conversion module 401. The second end 420L is located toward the second edge 401L of the thermoelectric conversion module 401. Note that the first ends 420H of the thermoelectric conversion elements 421, 422, 423, 424, 425, and 426 are also referred to as "first end 421H", "first end 422H", "first end 423H", "first end 424H", "first end 425H", and "first end 426H", respectively. Moreover, the second ends 420L of the thermoelectric conversion elements 421, 422, 423, 424, 425, and 426 are also referred to as "second end 421L", "second end 422L", "second end 423L", "second end 424L", "second end 425L", and "second end 426L", respectively.

The thermoelectric conversion elements 421 to 426 are arranged such as to be lined up along the second direction A2 at the front surface 410A of the sheet substrate 410 in the same manner as in the first embodiment. The thermoelectric conversion element 421 to 426 may be arranged such as to be lined up along the second direction A2 at a side corresponding to a front surface of an insulating layer included in the sheet substrate 410 in the same manner as in the first embodiment. The thermoelectric conversion element 421 to 426 are lined up along the second direction A2 with gaps therebetween. The width of these gaps may be any width so long as it is possible to ensure electrical insulation between two thermoelectric conversion elements 420 that are adjacent to each other in the second direction A2. The thermoelectric conversion elements 421 to 426 are electrically connected in series by the wires 461 to 465 in an order corresponding to the numbers $A_n$ allotted to the thermoelectric conversion elements 420 in the same manner as in the first embodiment.

The thermoelectric conversion elements 421 to 426 have different lengths along the first direction A1. For example, the thermoelectric conversion elements 421 to 426 each extend along the first direction A1 from the first edge 401H to the second edge 401L. As a result of the thermoelectric conversion elements 421 to 426 each extending from the first edge 401H to the second edge 401L, the respective lengths of the thermoelectric conversion elements 421 to 426 in the first direction A1 increase in an order corresponding to the numbers $A_n$ (i.e., from the thermoelectric conversion element 421 to the thermoelectric conversion element 426). As a result of the thermoelectric conversion elements 421 to 426 each extending from the first edge 401H to the second edge 401L in this manner, the respective lengths of the thermoelectric conversion elements 421 to 426 along the first direction A1 differ.

As a result of the thermoelectric conversion elements 421 to 426 each extending along the first direction A1 from the first edge 401H to the second edge 401L, a temperature difference between both ends of each of the thermoelectric conversion elements 421 to 426 can increase. Increasing the temperature difference between both ends of each of the thermoelectric conversion elements 421 to 426 makes it possible to increase electrical power generated by each of the thermoelectric conversion elements 421 to 426. Note that the width between each of the first ends 421H to 426H and the first edge 401H may be the same. Also note that the width between each of the second ends 421L to 426L and the second edge 401L may be the same. The width between each of the first ends 421H to 426H and the first edge 401H and the width between each of the second ends 421L to 426L and the second edge 401L may be set as appropriate depending on the production process and the like.

In a case in which the respective lengths of the thermoelectric conversion elements 421 to 426 along the first direction A1 differ, respective electrical resistance values of the thermoelectric conversion elements 421 to 426 will also differ in a situation in which respective widths of the thermoelectric conversion elements 421 to 426 along the second direction A2 are roughly the same. When the respective electrical resistance values of the thermoelectric conversion elements 421 to 426 differ, electrically connecting the thermoelectric conversion elements 421 to 426 in series results in current that can be generated in the thermoelectric conversion module 401 being determined by a thermoelectric conversion element 420 having a small electrical resistance value.

The thermoelectric conversion elements 421 to 426 are configured such that the respective widths of the thermoelectric conversion elements 421 to 426 along the second direction A2 differ so that the respective electrical resistance values of the thermoelectric conversion elements 421 to 426 are roughly the same. As one example, the respective lengths of the thermoelectric conversion elements 421 to 426 along the first direction A1 increase in an order corresponding to the numbers $A_n$ (i.e., from the thermoelectric conversion element 421 to the thermoelectric conversion element 426) in the present embodiment. In this case, the thermoelectric conversion elements 421 to 426 may be configured such that the respective widths of the thermoelectric conversion elements 421 to 426 along the second direction A2 increase in order from the thermoelectric conversion element 421 to the thermoelectric conversion element 426. The respective widths of the thermoelectric conversion elements 421 to 426 along the second direction A2 may increase in proportion to the respective lengths of the thermoelectric conversion elements 421 to 426 along the first direction A1. For example, in a case in which the length of the thermoelectric conversion element 426 along the first direction A1 is 1.5 times the length of the thermoelectric conversion element 421 along the first direction A1, the width of the thermoelectric conversion element 426 along the second direction A2 is 1.5 times the width of the thermoelectric conversion element 421 along the second direction A2. A configuration such as set forth above makes it possible for the respective electrical resistance values of the thermoelectric conversion elements 421 to 426 to be roughly the same.

Note that in a case in which respective thicknesses of the thermoelectric conversion elements 421 to 426 in the third direction A3 differ, the thermoelectric conversion elements 421 to 426 may be configured such that respective cross-sectional areas of the thermoelectric conversion elements 421 to 426, orthogonal to the first direction A1, differ so that the respective electrical resistance values of the thermoelectric conversion elements 421 to 426 are roughly the same.

The wires 460 may be located in the sheet substrate 410 in the same manner as the wires 60 such as illustrated in FIG. 1. The wires 460 may be located at a side corresponding to a rear surface of an insulating layer included in the sheet substrate 410 in the same manner as the wires 60 such as illustrated in FIG. 1. The wires 460 may be located at a side corresponding to the rear surface of the insulating layer included in the sheet substrate 410 together with the first electrodes and the second electrodes included in the wiring layer 430. The wires 460 electrically connect, in series, thermoelectric conversion elements 420 that are adjacent to each other in the second direction A2 at both ends of the thermoelectric conversion elements 420 (i.e., at first ends 420H and second ends 420L) in the same manner as the wires 60 such as illustrated in FIG. 1. For two thermoelectric conversion elements 420 that are adjacent to each other in the second direction A2, a wire 460 may electrically connect a first electrode that is electrically connected to the first end 420H of one of these thermoelectric conversion elements 420 and a second electrode that is electrically connected to the second end 420L of the other of these thermoelectric conversion elements 420 in the same manner as the wires 60 such as illustrated in FIG. 1.

A thermal resistance value of the wires 460 is not less than a thermal resistance value of the thermoelectric conversion elements 420. The wires 460 may be configured such that a thermal resistance value of the wires 460 is not less than a thermal resistance value of the thermoelectric conversion elements 420 in the same manner as previously described in the first embodiment. Moreover, a thermal resistance value of the wires 460 may be not less than a thermal resistance value of the thermoelectric conversion elements 420, and an electrical resistance value of the wires 460 may be not more than an electrical resistance value of the thermoelectric conversion elements 420. The wires 460 may be configured such that a thermal resistance value of the wires 460 is not less than a thermal resistance value of the thermoelectric conversion elements 420 and an electrical resistance value of the wires 460 is not more than an electrical resistance value of the thermoelectric conversion elements 420 in the same manner as previously described in the first embodiment.

Note that wires 160A such as illustrated in FIG. 11 or wires 160B such as illustrated in FIG. 12 may be adopted instead of the wires 460.

In the thermoelectric conversion module 401 according to the third embodiment, a plurality of thermoelectric conversion elements may be formed at the rear surface 410B of the sheet substrate 410 in the same manner as in the second embodiment. The plurality of thermoelectric conversion elements formed at the rear surface 410B may be configured in the same manner as the plurality of thermoelectric conversion elements 420. As one example, the plurality of thermoelectric conversion elements formed at the rear surface 410B may each extend from the first edge 401H to the second edge 401L in the same manner as the thermoelectric conversion elements 420. In this case, the plurality of thermoelectric conversion elements at the rear surface 410B may be configured such that respective widths of the plurality of thermoelectric conversion elements along the second direction A2 differ so that respective electrical resistance values of the plurality of thermoelectric conversion elements are roughly the same in the same manner as the thermoelectric conversion elements 420. Moreover, in a case in which the plurality of thermoelectric conversion elements formed at the rear surface 410B have different thicknesses in the third direction A3, the plurality of thermoelectric conversion elements may be configured such that respective cross-sectional areas of the plurality of thermoelectric conversion elements, orthogonal to the first direction A1, differ so that respective electrical resistance values of the plurality of thermoelectric conversion elements are roughly the same.

In this manner, the sheet substrate 410 in the thermoelectric conversion module 401 according to the third embodiment has a trapezoidal shape. As a result of the sheet substrate 410 having a trapezoidal shape, freedom of arrangement location of the thermoelectric conversion module 401 can increase.

Other configurations and effects of the thermoelectric conversion module 401 according to the third embodiment are the same as for the thermoelectric conversion module 1 according to the first embodiment. The thermoelectric conversion module 401 can also be produced by the production method previously described in the first embodiment.

The foregoing description merely illustrates embodiments of the present disclosure and it goes without saying that various alterations may be made within the scope of the claims.

INDUSTRIAL APPLICABILITY

According to the present disclosure, it is possible to provide a thermoelectric conversion module in which reduction of generated electrical power is suppressed.

REFERENCE SIGNS LIST 1, 201, 401 thermoelectric conversion module
1H, 201H, 401H first edge
1L, 201L, 401L second edge
2 heat source
10, 210, 410 sheet substrate
10A, 210A, 410A front surface
10B, 210B, 410B rear surface
11, 211 substrate
11A, 211A front surface
11B, 211B rear surface
12, 212 insulating layer
12A, 212A front surface
12B, 212B rear surface
60 to 63, 160A, 160B, 260 to 267, 460 to 465 wire
20 to 24, 220 to 228, 420 to 426 thermoelectric conversion element
20H to 24H, 220H to 228H, 420H to 426H first end
20L to 24L, 220L to 228L, 420L to 426L second end
30, 230, 430 wiring layer
40 to 44, 240 to 248 first electrode
50 to 54, 250 to 258 second electrode
70 to 74, 270 to 278 first joining member
80 to 84, 280 to 288 second joining member
120, 320, 321 CNT sheet (carbon nanotube sheet)
130, 330 metal foil
160$a$ hole
211$a$ to 211$h$ opening
212$a$ to 212$h$ opening
401A side
401B side

The invention claimed is:

1. A thermoelectric conversion module comprising:
a sheet substrate that is electrically insulating and has a front surface and a rear surface;
a plurality of thermoelectric conversion elements having an elongated shape extending in a first direction and arranged such as to be lined up along a second direction intersecting the first direction at the front surface of the sheet substrate; and
a wiring layer including a plurality of wires that electrically connect adjacent thermoelectric conversion elements in series at both lengthwise ends, wherein
each of the plurality of thermoelectric conversion elements has a first end and a second end opposite to the first end in the first direction,
for two thermoelectric conversion elements among the plurality of thermoelectric conversion elements that are adjacent to each other in the second direction, a wire among the plurality of wires directly electrically connects the first end of one of the two thermoelectric conversion elements and the second end of the other of the two thermoelectric conversion elements,
the plurality of thermoelectric conversion elements are all p-type thermoelectric conversion elements or are all n-type thermoelectric conversion elements,
a thermal resistance value of one of the wires is not less than a thermal resistance value of one of the thermoelectric conversion elements, and
the plurality of thermoelectric conversion elements use the temperature difference between the first end and the second end to generate electricity.

2. The thermoelectric conversion module according to claim 1, wherein the plurality of thermoelectric conversion elements are all p-type thermoelectric conversion elements.

3. The thermoelectric conversion module according to claim 1, wherein an electrical resistance value of one of the wires is not more than an electrical resistance value of one of the thermoelectric conversion elements.

4. The thermoelectric conversion module according to claim 1, wherein the plurality of thermoelectric conversion elements all contain carbon nanotubes.

5. The thermoelectric conversion module according to claim 1, wherein the plurality of thermoelectric conversion elements are also formed at the rear surface in addition to at the front surface of the sheet substrate.

6. The thermoelectric conversion module according to claim 5, wherein part of each thermoelectric conversion element formed at the front surface overlaps with part of a thermoelectric conversion element formed at the rear surface in plan view of the sheet substrate.

7. The thermoelectric conversion module according to claim 1, wherein the plurality of thermoelectric conversion elements all have rectangular shapes that are of roughly the same dimensions.

8. The thermoelectric conversion module according to claim 1, wherein respective lengths of the plurality of thermoelectric conversion elements along the first direction, respective widths of the plurality of thermoelectric conversion elements along the second direction, and respective thicknesses of the plurality of thermoelectric conversion elements are adjusted such that respective electrical resistance values of the plurality of thermoelectric conversion elements are roughly the same.

9. The thermoelectric conversion module according to claim 8, wherein the respective thicknesses of the plurality of thermoelectric conversion elements are roughly the same, the respective lengths of the plurality of thermoelectric conversion elements differ, and the respective widths of the plurality of thermoelectric conversion elements differ.

10. The thermoelectric conversion module according to claim 9, wherein
the sheet substrate has a trapezoidal shape,
the sheet substrate has a first edge corresponding to one leg among two legs of a trapezoid and a second edge corresponding to another leg among the two legs,
a distance between the first edge and the second edge in the first direction increases along the second direction, and
the plurality of thermoelectric conversion elements extend along the first direction from the first edge to the second edge.

* * * * *